US012740302B2

(12) United States Patent
Park et al.

(10) Patent No.: US 12,740,302 B2
(45) Date of Patent: Sep. 15, 2026

(54) LIGHT EMITTING DISPLAY DEVICE

(71) Applicant: Samsung Display Co., LTD., Yongin-si (KR)

(72) Inventors: Hae Chan Park, Yongin-si (KR); Eun Je Jang, Yongin-si (KR); Soo-Hye Ryu, Yongin-si (KR); Hong-Jo Park, Yongin-si (KR); Baek Min Oh, Yongin-si (KR); Hae Ju Yun, Yongin-si (KR); Eung Gyu Lee, Yongin-si (KR); Hyemin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 133 days.

(21) Appl. No.: 18/910,370

(22) Filed: Oct. 9, 2024

(65) Prior Publication Data

US 2025/0204230 A1 Jun. 19, 2025

(30) Foreign Application Priority Data

Dec. 14, 2023 (KR) ........................ 10-2023-0182160

(51) Int. Cl.

*H10K 59/80* (2023.01)
*H10K 59/122* (2023.01)
*H10K 59/38* (2023.01)

(52) U.S. Cl.

CPC ....... *H10K 59/8792* (2023.02); *H10K 59/122* (2023.02); *H10K 59/38* (2023.02)

(58) Field of Classification Search

CPC ......................... H10K 59/122; H10K 59/8792
See application file for complete search history.

(56) References Cited

U.S. PATENT DOCUMENTS

2022/0140288 A1* 5/2022 Ji ........................... H10K 59/38
257/91

FOREIGN PATENT DOCUMENTS

| | | | | | |
|---|---|---|---|---|---|
| CN | 215834530 | U | * | 2/2022 | ............. G06F 3/047 |
| CN | 114447034 | A | * | 5/2022 | ......... H10K 59/8792 |
| EP | 4294154 | A1 | * | 12/2023 | ........... H10K 59/122 |
| JP | 2019159355 | A | * | 9/2019 | |
| KR | 1020220058716 | A | | 5/2022 | |
| KR | 1020220125902 | A | | 9/2022 | |
| KR | 1020230020066 | A | | 2/2023 | |
| WO | 2018113207 | A1 | | 6/2018 | |

* cited by examiner

*Primary Examiner* — Mariceli Santiago
(74) *Attorney, Agent, or Firm* — CANTOR COLBURN LLP

(57) ABSTRACT

A light emitting display device includes a substrate, a plurality of anodes disposed on the substrate, a pixel defining layer having first openings overlapping each of the anodes, light emitting layers respectively disposed within the first openings of the pixel defining layer, a cathode formed on the light emitting layers and the pixel defining layer, an encapsulation layer disposed on the cathode, and a light blocking layer disposed on the encapsulation layer and including a second openings respectively overlapping the plurality of first openings. The first openings are formed in an elliptical shape. Among the first openings and the second openings, a first opening and a second opening corresponding to the first opening have different values in the major axis direction and the minor axis direction, which are the planar distances in the major axis direction and minor axis direction of the first opening in the plane.

20 Claims, 39 Drawing Sheets

FIG. 11

| | | Total gap | Secure gap | Margin |
|---|---|---|---|---|
| Fig 9 Comparative example | Major axis | 5.72 | 4.55 | 1.17 |
| | Minor axis | | | |
| Fig 7 Embodiment | Major axis | 4.72 | 3.55 | 1.17 |
| | Minor axis | 5.72 | 4.55 | 1.17 |

FIG. 13

| | Gap | | | |
|---|---|---|---|---|
| Item | Fig 9 Comparative example | Embodiment | | |
| | | Minium value | Design value | Maxim value |
| Minor axis | 5.72 | | | |
| Major axis | 5.72 | 3.12 | 4.72 | 4.82 |
| Eccentricity | 0.56 | 0.36 | 0.45 | 0.55 |

FIG. 14

| Color | Red | | | | | Green | | | | | Bule | | | | |
|---|---|---|---|---|---|---|---|---|---|---|---|---|---|---|---|
| Gap (㎛) | 0 | -0.21 | -0.36 | -0.57 | -0.99 | 0 | -0.21 | -0.36 | -0.57 | -0.99 | 0 | -0.21 | -0.36 | -0.57 | -0.99 |
| Viewing angle | 45° | 43° | 41.6° | 39.8° | 36.8° | 45° | 43° | 41.6° | 39.8° | 36.8° | 45° | 43° | 41.6° | 39.8° | 36.8° |
| 0 | 100% | 100% | 100% | 100% | 100% | 100% | 100% | 100% | 100% | 100% | 100% | 100% | 100% | 100% | 100% |
| 5 | 100% | 100% | 100% | 100% | 100% | 100% | 100% | 100% | 100% | 100% | 100% | 100% | 100% | 100% | 100% |
| 10 | 100% | 100% | 100% | 100% | 100% | 100% | 100% | 100% | 100% | 100% | 100% | 100% | 100% | 100% | 100% |
| 15 | 100% | 100% | 100% | 100% | 100% | 100% | 100% | 100% | 100% | 100% | 100% | 100% | 100% | 100% | 100% |
| 20 | 100% | 100% | 100% | 100% | 100% | 100% | 100% | 100% | 100% | 100% | 100% | 100% | 100% | 100% | 100% |
| 25 | 100% | 100% | 100% | 100% | 100% | 100% | 100% | 100% | 100% | 100% | 100% | 100% | 100% | 100% | 100% |
| 30 | 100% | 100% | 100% | 100% | 100% | 100% | 100% | 100% | 100% | 100% | 100% | 100% | 100% | 100% | 100% |
| 35 | 100% | 100% | 100% | 100% | 100% | 100% | 100% | 100% | 100% | 100% | 100% | 100% | 100% | 100% | 100% |
| 40 | 100% | 100% | 100% | 100% | 99% | 100% | 100% | 100% | 100% | 99% | 100% | 100% | 100% | 100% | 99% |
| 45 | 100% | 100% | 99% | 99% | 97% | 100% | 100% | 99% | 99% | 97% | 100% | 100% | 99% | 99% | 98% |
| 50 | 99% | 98% | 97% | 96% | 94.30% | 99% | 98% | 97% | 96% | 93.75% | 99% | 98% | 98% | 97% | 95.35% |
| 55 | 97% | 96.06% | 95.18% | 93.94% | 91.31% | 97% | 95.68% | 94.71% | 93.35% | 90.47% | 98% | 96.79% | 96.07% | 95.06% | 92.90% |
| 60 | 95.16% | 93.82% | 92.77% | 91.32% | 88.29% | 94.69% | 93.22% | 92.07% | 90.48% | 87.16% | 96.05% | 94.95% | 94.09% | 92.91% | 90.42% |

DA
EA1
OPBM-1
OPBM
OP3
OP4
OP
OP-1
FL
EML
Cathode
Anode
ACM2
SD1
GAT1
GAT3
GAT2(BML)
GAT2(Cst)
ACT2(IGZO)
ACT(P-Si)
BML
Oxide TFT
LTPS TFT
OPS1
OPS2
DR1
DR2
DR3

LIGHT EMITTING DISPLAY DEVICE

This application claims priority to Korean Patent Application No. 10-2023-0182160, filed on Dec. 14, 2023, and all the benefits accruing therefrom under 35 U.S.C. § 119, the content of which in its entirety is herein incorporated by reference.

BACKGROUND

1. Field

This disclosure relates to a light emitting display device.

2. Description of the Related Art

A display device is a device that displays a screen and includes a liquid crystal display (LCD) and an organic light emitting diode (OLED) display.

Display devices may be used in various electronic devices such as, for example, mobile phones, navigation devices, digital cameras, electronic books, portable game consoles, and various terminals.

A display device such as, for example, an organic light emitting display device, may have a structure that can be bent or folded using a flexible substrate.

In some aspects, in small electronic devices such as, for example, mobile phones, optical elements such as, for example, cameras and optical sensors are formed in the bezel area around the display area. However, as the size of the display screen increases, the size of the area surrounding the display area gradually decreases. Technology is being developed that allows optical sensors to be positioned on the back of the display area.

SUMMARY

The embodiments described herein support a reduction in diffraction patterns that occur when external light is reflected in a high-resolution display device. In some aspects, embodiments described herein provide a light-emitting display device supportive of reduced color separation of external light or a constant diffraction pattern regardless of angle in a high-resolution display device.

In some aspects, embodiments include forming a black light blocking layer on the front of a high-resolution display panel, or overlapping a plurality of color filters without forming a light blocking layer, which may prevent external light from being reflected or transmitted and thereby reduce the diffraction pattern that may occur. The embodiments provide a light emitting display device which may reduce the color separation of external light.

A light emitting display device according to an embodiment includes a substrate; a plurality of anodes disposed on the substrate; a pixel defining layer comprising a plurality of first openings overlapping each of the plurality of anodes; a plurality of light emitting layers respectively disposed within the plurality of first openings of the pixel defining layer; a cathode formed on the plurality of light emitting layers and the pixel defining layer; an encapsulation layer disposed on the cathode; and a light blocking layer disposed on the encapsulation layer and comprising a plurality of second openings respectively overlapping the plurality of first openings, wherein: the plurality of first openings of the pixel defining layer are each an elliptical or oval shape, among the plurality of first openings and the plurality of second openings, a first opening and a second opening corresponding to the first opening differ according to a major axis direction gap and a minor axis direction gap, which are horizontal gaps respective to a major axis direction and a minor axis direction of the first opening on a plane, and the major axis direction gap is smaller than the minor axis direction gap by a value ranging from 0.1 μm to 2.6 μm.

The first opening and the second opening corresponding to the first opening may have a horizontal gap in a diagonal direction different from the major axis direction and the minor axis direction, and the horizontal gap in the diagonal direction may be different from the major axis direction gap and the minor axis direction gap.

The first opening and the second opening that overlaps the first opening in a plane may have a horizontal gap ranging from 0 μm to 20 μm.

The shape of the first opening may have an eccentricity ranging from 0.2 to 0.85.

The second opening may have an eccentricity ranging from 0 to 0.84.

The second opening may have a polygonal shape comprising a circle shape or a square shape.

The shape of the first opening may include four or more major axis angles, and each of the major axis angles of the shape of the first opening may be 45 degrees or less.

The shape of the first opening may be a planar shape formed by merging at least two elliptical shapes having different eccentricities.

The shape of the first opening may be a planar shape formed by cutting a first ellipse having a first eccentricity in a first direction, cutting a second ellipse having a second eccentricity in the first direction, and combining a cut portion of the first ellipse and a cut portion of the second ellipse.

At least one of the plurality of first openings of the pixel defining layer may be a circular shape or has an eccentricity ranging from 0 to 0.2.

A light emitting display device according to an embodiment includes a substrate; a plurality of anodes disposed on the substrate; a pixel defining layer comprising a plurality of first openings overlapping each of the plurality of anodes; a plurality of light emitting layers respectively disposed within the plurality of first openings of the pixel defining layer; a cathode formed on the plurality of light emitting layers and the pixel defining layer; an encapsulation layer disposed on the cathode; and a plurality of color filters corresponding to different colors and disposed on the encapsulation layer, wherein: the plurality of color filters comprise: at least two color filters overlapping a light blocking area, and one color filter overlapping a light transmission area, the plurality of first openings of the pixel defining layer are each an elliptical or oval shape, among the plurality of first openings and a plurality of second openings, a first opening and a second opening corresponding to the first opening differ according to a major axis direction gap and a minor axis direction gap, which are horizontal gaps respective to a major axis direction and a minor axis direction of the first opening on a plane, and the major axis direction gap is smaller than the minor axis direction gap by a value ranging from 0.1 μm to 2.6 μm.

The first opening and the second opening corresponding to the first opening may have a horizontal gap in a diagonal direction different from the major axis direction and the minor axis direction, and the horizontal gap in the diagonal direction may be different from the major axis direction gap and the minor axis direction gap.

The first opening and the second opening that overlaps the first opening on a plane may have a horizontal gap ranging from 0 μm to 20 μm.

The shape of the first opening may have an eccentricity ranging from 0.2 to 0.85.

The second opening may have an eccentricity ranging from 0 to 0.84.

The second opening may have a polygonal shape comprising a circle shape or a square shape.

The shape of the first opening may include four or more major axis angles, and each of the major axis angles of the shape of the first opening may be 45 degrees or less.

The shape of the first opening may be a planar shape formed by merging at least two elliptical shapes having different eccentricities.

The shape of the first opening may be a planar shape formed by cutting a first ellipse having a first eccentricity in a first direction, cutting a second ellipse having a second eccentricity in the first direction, and combining a cut portion of the first ellipse and a cut portion of the second ellipse.

At least one of the plurality of first openings of the pixel defining layer may be a circular shape or has an eccentricity ranging from 0 to 0.2.

According to embodiments, in a high-resolution display device, a black pixel definition layer that separates the light emitting layer from each other is used instead of a polarizer, thereby reducing the rate at which external light is reflected, thereby reducing the diffraction pattern.

According to embodiments, in a high-resolution display device, the horizontal gap between the elliptical opening of the pixel definition layer and the overlapping opening of the light blocking layer or color filter is not constant, and the major axis gap is made relatively narrow to secure the gap between adjacent openings, reflection and diffraction of external light can be reduced while preventing problems during processing.

BRIEF DESCRIPTION OF THE DRAWINGS

FIG. 11 is a table summarizing the gap between an example and a comparative example.

FIG. 13 is a table listing the gap and eccentricity range according to the embodiment.

FIG. 14 is a table simulating the luminance ratio to viewing angle according to the gap in the comparative example.

DETAILED DESCRIPTION

Figure 1:
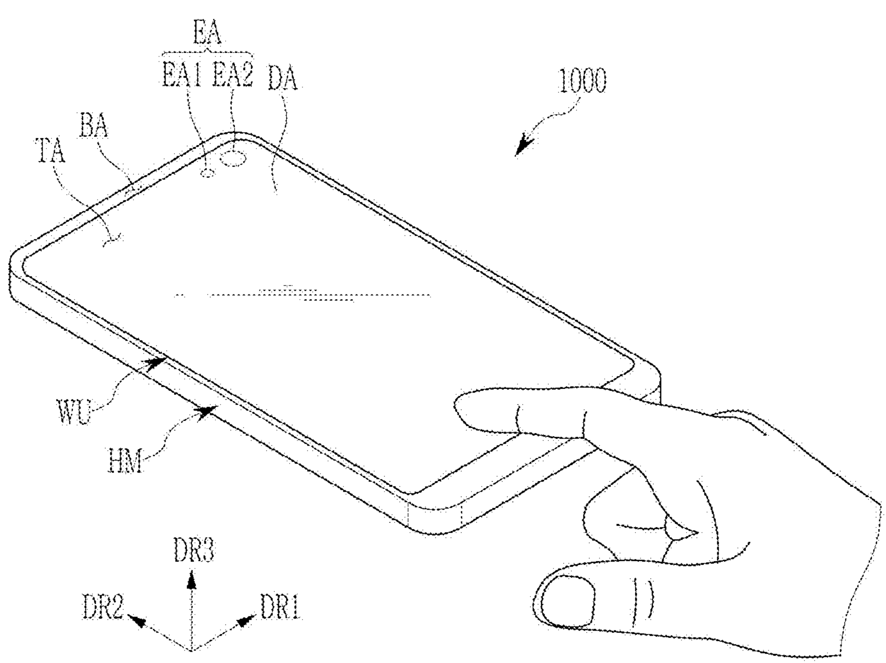
FIG. 1 is a schematic perspective view illustrating a use state of a display device according to an embodiment.

Hereinafter, with reference to the attached drawings, various embodiments will be described in detail such that those skilled in the art can easily implement the embodiments supported by the present disclosure.

The invention may be implemented in many different forms and is not limited to the embodiments described herein.

In order to clearly explain the example embodiments supported by the present disclosure, parts that are not relevant to the description are omitted, and identical or similar components are assigned the same reference numerals throughout the specification.

In some aspects, the size and thickness of each component illustrated in the drawings are arbitrarily illustrated for convenience of explanation, and the example embodiments are not necessarily limited to that which is illustrated.

In the drawings, the thicknesses are enlarged to clearly express various layers and areas.

And in the drawings, for convenience of explanation, the thicknesses of some layers and regions are exaggerated.

In some aspects, when a part, such as, for example, a layer, membrane, region, plate, or component is said to be "above" or "on" another part, this means not only when it is "directly above" another part, but also when there is another part in between.

Conversely, when a part is said to be "right on top" of another part, it means that there is no other part in between.

In some aspects, being "above" or "on" a reference portion means being located above or below the reference portion, and does not necessarily mean being located "above" or "on" it in the direction opposite to gravity.

In some aspects, throughout the specification, when a part is said to "include" a certain element, this means that it may further include other elements, rather than excluding other elements, unless specifically stated to the contrary.

In some aspects, throughout the specification, when reference is made to "on a plane," this means when the target portion is viewed from above, and when reference is made to "in a cross-section," this means when a cross-section of the target portion is cut vertically and viewed from the side.

In some aspects, throughout the specification, when "connected" is used, this does not mean only when two or more components are directly connected, but when two or more components are indirectly connected through other components, they are physically connected, this may include not only the case of being connected or electrically connected, but also the case of each part being substantially integrated, although referred to by different names depending on location or function, being connected to each other.

In some aspects, throughout the specification, when a portion such as, for example, a wire, layer, film, region, plate, or component is said to "extend in the first or second direction," this means only a straight shape extending in that direction. Rather, it is a structure that extends overall along the first or second direction, and also includes a structure that is bent at some part, has a zigzag structure, or extends while including a curved structure.

Embodiments supported by the present disclosure will now be described more fully hereinafter with reference to the accompanying drawings, in which one or more example embodiments are illustrated. Aspects supported by the present disclosure may, however, be embodied in different forms and should not be construed as limited to the embodiments set forth herein. Rather, these example embodiments are provided so that this disclosure will be thorough and complete, and will fully convey the scope of example aspects of the invention to those skilled in the art.

Terms such as, for example, first, second, and the like may be used to describe various components, but the components should not be limited by the terms. The terms as used herein may distinguish one component from other components and are not to be limited by the terms. For example, without departing the scope of the present disclosure, a first component may be referred to as a second component, and similarly, the second component may also be referred to as the first component. The terms of a singular form may include plural forms unless otherwise specified.

The terminology used herein is for the purpose of describing particular embodiments and is not intended to be limiting. As used herein, "a," "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as, for example, "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross section illustrations that are schematic illustrations of example embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Unless otherwise defined, all terms (including technical and scientific terms) used herein have the same meaning as commonly understood by one of ordinary skill in the art to which this disclosure belongs. It will be further understood that terms, such as, for example, those defined in commonly used dictionaries, should be interpreted as having a meaning that is consistent with their meaning in the context of the relevant art and the present disclosure, and will not be interpreted in an idealized or overly formal sense unless expressly so defined herein.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases.

It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The terms "about" or "approximately" as used herein are inclusive of the stated value and include a suitable range of deviation for the particular value as determined by one of ordinary skill in the art, considering the measurement in question and the error associated with measurement of the particular quantity. The term "about" can mean within one or more standard deviations, or within +30%, 20%, 10%, 5% of the stated value, for example.

The term "substantially," as used herein, means approximately or actually. The term "substantially equal" means approximately or actually equal. The term "substantially the same" means approximately or actually the same. The term "substantially perpendicular" means approximately or actually perpendicular. The term "substantially parallel" means approximately or actually parallel.

In some aspects, electronic devices (e.g., mobile phones, TVs, monitors, laptop computers, etc.) containing display devices, display panels, etc. described in the specification, or display devices, display panels, etc. may be manufactured by the manufacturing method described in the specification. Electronic devices included herein are also not excluded from the scope of the embodiments described in the specification.

Below, aspects of the schematic structure of the display device are described with reference to FIGS. 1 to 3.

Figure 2:
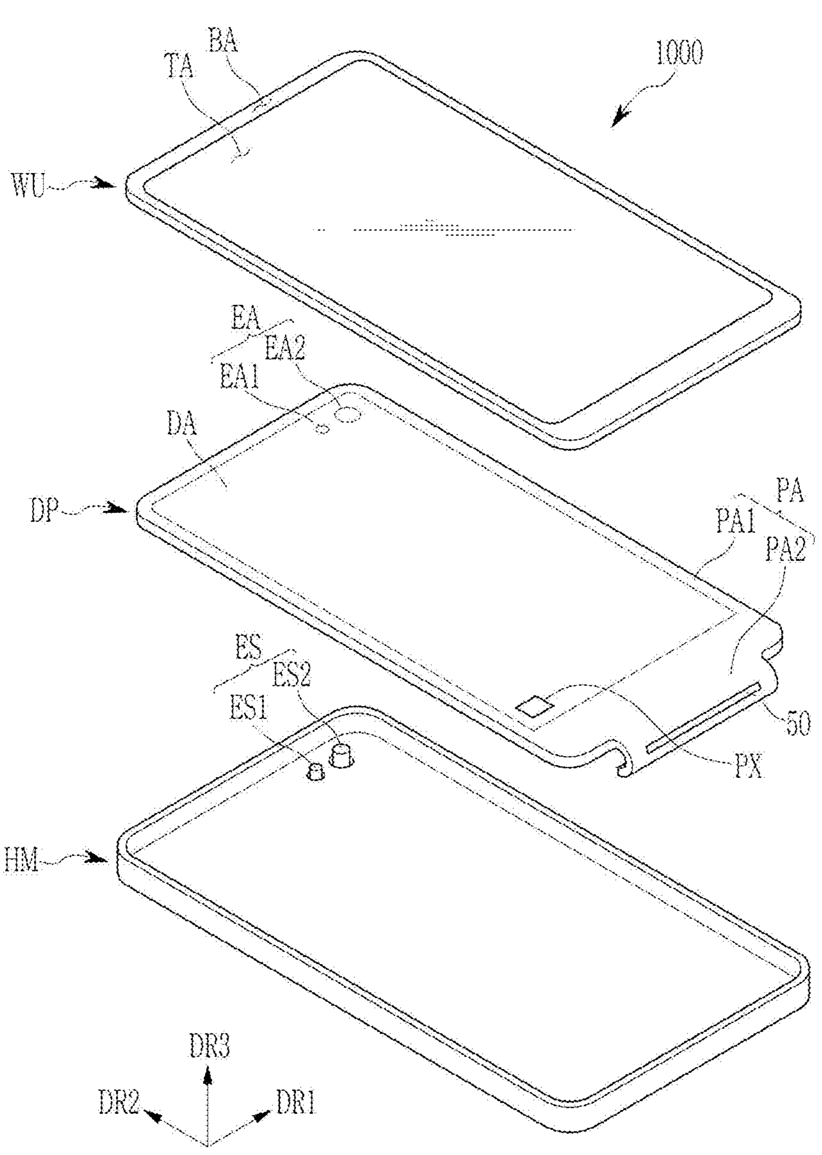
FIG. 2 is an exploded perspective view of a display device according to an embodiment.
Figure 3:
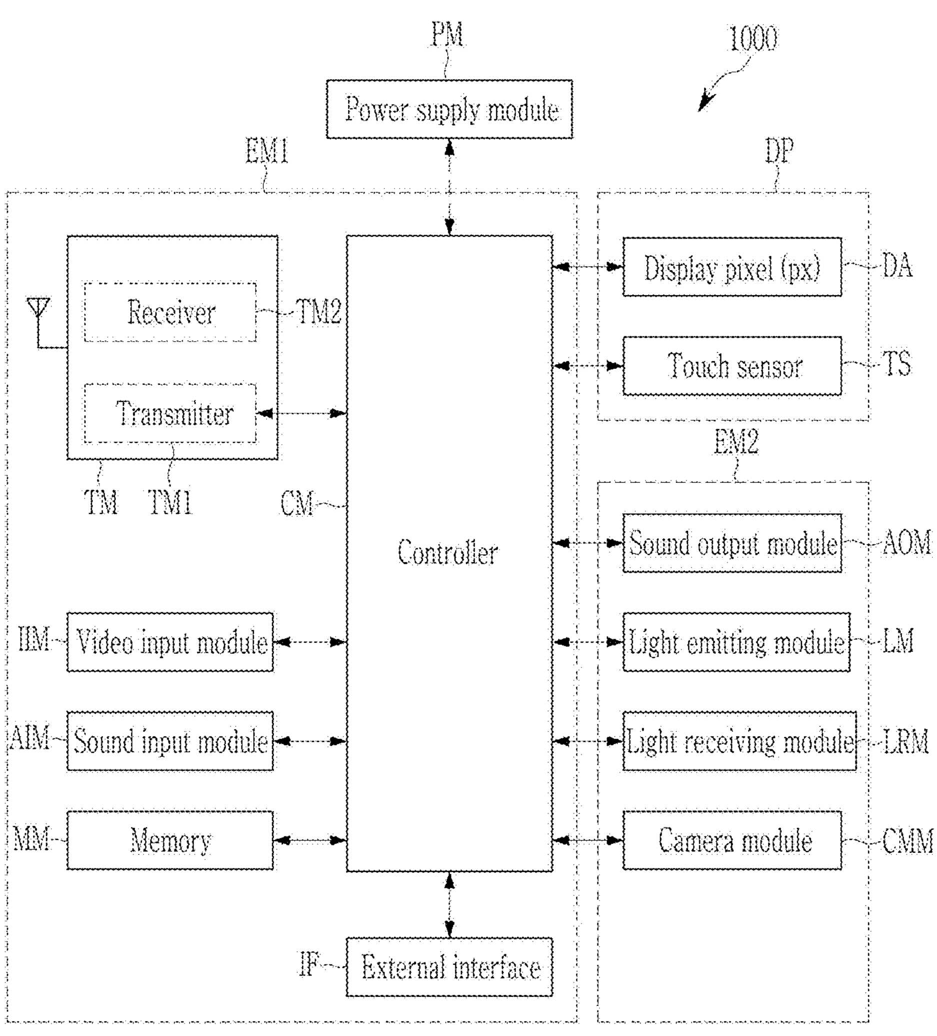
FIG. 3 is a block diagram of a display device according to an embodiment.

FIG. 1 is a schematic perspective view illustrating a use state of a display device according to an embodiment, FIG. 2 is an exploded perspective view of a display device according to an embodiment, and FIG. 3 is a block diagram of a display device according to an embodiment.

Referring to FIG. 1, a display device 1000 according to an embodiment is a device that displays moving images or still images, and may be used in a mobile phone, a smart phone, a tablet personal computer, or a mobile phone. The display device 1000 can be used as a display screen for various products such as, for example, portable electronic devices such as, for example, communication terminals, electronic notebooks, e-books, PMP (portable multimedia player), navigation, UMPC (Ultra Mobile PC), as well as televisions, laptops, monitors, billboards, internet of things (IoT), and the like.

In some aspects, the display device 1000 according to an embodiment may be mounted on a wearable device such as, for example, a smart watch, a watch phone, a glasses-type display, and a head mounted display (HMD).

Further, the display device 1000 according to an embodiment may be used as an instrument panel of an automobile, and as a center information display CID disposed on the center fascia or dashboard of an automobile, as a room mirror display in place of a side mirror of an automobile, as entertainment for the back seat of an automobile, and as a display disposed on the back of a front seat.

FIG. 1 illustrates the display device 1000 being used as a smart phone for convenience of explanation.

The display device 1000 may display an image in the third direction DR3 on a display surface parallel to each of the first direction DR1 and the second direction DR2.

The display surface on which the image is displayed may correspond to the front surface of the display device 1000 and the front surface of the cover window WU.

Images may include static images as well as dynamic images.

In this embodiment, the front (or top) and back (or bottom) surfaces of each member are defined based on the direction in which the image is displayed.

The front and back surfaces are opposed to each other in the third direction DR3, and the normal directions of each of the front and back surfaces may be parallel to the third direction DR3.

The separation distance between the front and back surfaces in the third direction DR3 may correspond to the thickness of the display panel in the third direction DR3.

The display device 1000 according to an embodiment may detect a user's input (refer to the hand in FIG. 1) applied from the outside.

The user's input may include various types of external inputs, such as, for example, parts of the user's body, light, heat, or pressure.

In an embodiment, the user's input is illustrated with the user's hand applied to the front.

However, embodiments of the present disclosure are not limited thereto.

The user's input may be provided in various forms, and the display device 1000 may also detect the user's input applied to the side or back of the display device 1000 depending on the structure of the display device 1000.

Referring to FIGS. 1 and 2, the display device 1000 may include a cover window WU, a housing HM, a display panel DP, and an optical element ES.

In an embodiment, the cover window WU and the housing HM may be combined to the exterior of the display device 1000.

The cover window WU may include an insulating panel. For example, the cover window WU may be formed of glass, plastic, or a combination thereof.

The front of the cover window WU may define the front of the display device 1000.

The transmission area TA may be an optically transmission area.

For example, the transmission area TA may be an area with visible light transmittance of about 90% or more.

The blocking area BA may define the shape of the transmission area TA.

The blocking area BA is adjacent to the transmission area TA and may surround the transmission area TA.

The blocking area BA may be an area with relatively low light transmittance compared to the transmission area TA.

The blocking area BA may include an opaque material that blocks light.

The blocking area BA may have a predetermined color.

The blocking area BA may be defined by a bezel layer provided separately from the transparent substrate defining the transmission area TA, or may be defined by an ink layer formed by inserting or coloring the transparent substrate.

The display panel DP may include a pixel PX that displays an image and a driver 50, and the pixel PX is located in the display area DA and the component area EA.

The display panel DP may include a front surface including a display area DA and a peripheral area PA.

In an embodiment, the display area DA and the component area EA are areas where images are displayed, including pixels, and at the same time, they can be areas where external inputs are detected with a touch sensor located in the third direction DR3 of the pixels.

The transmission area TA of the cover window WU may at least partially overlap the display area DA and the component area EA of the display panel DP.

For example, the transmission area TA may overlap the front surface of the display area DA and the component area EA, or may overlap at least a portion of the display area DA and the component area EA.

Accordingly, the user can view the image through the transmission area TA or provide external input based on the image.

However, embodiments of the present disclosure are not limited thereto.

For example, the area where an image is displayed and the area where external input is detected may be separated from each other.

The peripheral area PA of the display panel DP may at least partially overlap the blocking area BA of the cover window WU.

The peripheral area PA may be an area covered by the blocking area BA.

The peripheral area PA is adjacent to the display area DA and may surround the display area DA.

An image is not displayed in the peripheral area PA, and a driving circuit or driving wiring for driving the display area DA may be disposed.

The peripheral area PA may include a first peripheral area PA1 located outside the display area DA and a second peripheral area PA2 including the driver 50, connection wiring, and a bending area.

In the embodiment of FIG. 2, the first peripheral area PA1 is located on the third side of the display area DA, and the second peripheral area PA2 is located on the remaining side of the display area DA.

In an embodiment, the display panel DP may be assembled in a flat state with the display area DA, component area EA, and the peripheral area PA facing the cover window WU.

However, embodiments of the present disclosure are not limited thereto.

A portion of the peripheral area PA of the display panel DP may be curved.

At this time, part of the peripheral area PA is directed toward the rear of the display device 1000, such that the blocking area BA visible on the front of the display device 1000 can be reduced, and in FIG. 2, the second peripheral area PA2 can be bent and placed on the back of the display area DA and then assembled.

In some aspects, the component area EA of the display panel DP may include a first component area EA1 and a second component area EA2.

The first component area EA1 and the second component area EA2 may be at least partially surrounded by the display area DA.

The first component area EA1 and the second component area EA2 are illustrated spaced apart from each other, but are not limited to this and may be at least partially connected.

The first component area EA1 and the second component area EA2 may be areas in which an optical element (see ES in FIG. 2; hereinafter referred to as a component) that uses infrared rays, visible rays, or sound is disposed.

The display area (DA; hereinafter also referred to as the main display area) and the component area EA are formed with a plurality of light-emitting diodes and a plurality of pixel circuit units that generate and transmit light-emitting currents to each of the plurality of light-emitting diodes.

Here, one light emitting diode and one pixel circuit part are called a pixel PX.

One pixel circuit unit and one light emitting diode may be formed in a one-to-one ratio in the display area DA and the component area EA.

The first component area EA1 may include a transparent portion through which light and/or sound can transmit and a display portion including a plurality of pixels.

The transmission portion is located between adjacent pixels and is composed of a layer through which light and/or sound can transmit.

The transmitting portion may be located between adjacent pixels, and based on the embodiment, a layer that does not transmit light, such as, for example, a light blocking layer, may overlap the first component area EA1.

The number of pixels (hereinafter referred to as resolution) per unit area of the pixels (hereinafter referred to as normal pixels) included in the display area DA and the pixels included in the first component area EA1 (hereinafter referred to as first component pixels) may be the same.

The second component area EA2 includes an area composed of a transparent layer such that light can pass through (hereinafter also referred to as a light transmission area), and the light transmission area does not have a conductive layer or a semiconductor layer and includes a light blocking material, a layer, for example, a pixel defining layer and/or a light blocking layer, may have a structure that does not block light by including an opening that overlaps a position corresponding to the second component area EA2.

The number of pixels per unit area of the pixels included in the second component area EA2 (hereinafter also referred to as second component pixels) may be smaller than the number of pixels per unit area of the normal pixels included in the display area DA.

As a result, the resolution of the second component pixel may be lower than a resolution of the normal pixel.

According to the embodiment, instead of the light blocking layer, at least two color filters can be overlapped to form a light blocking area that can block light of a specific wavelength range (for example, visible light, etc.).

Referring to FIG. 3, the display panel DP may further include a touch sensor TS in addition to the display area DA including the pixels PX.

The display panel DP includes pixels PX, which are components that generate images, and can be visible to the user from the outside through the transmission area TA.

In some aspects, the touch sensor TS may be located on top of the pixel PX and may detect an external input applied from outside.

The touch sensor TS can detect an external input provided to the cover window WU.

Referring again to FIG. 2, the second peripheral area PA2 may include a bending portion.

The display area DA and the first peripheral area PA1 may have a flat state substantially parallel to the plane defined by the first direction DR1 and the second direction DR2, and the second peripheral area PA2 may be extended from a flat state, pass through a bending portion, and then be in a flat state again.

As a result, at least a portion of the second peripheral area PA2 may be bent and assembled to be located on the rear side of the display area DA.

When at least a portion of the second peripheral area PA2 is assembled, at least a portion of the second peripheral area PA2 overlaps the display area DA on a plane, so the blocking area BA of the display device 1000 may be reduced.

However, embodiments of the present disclosure are not limited thereto.

For example, the second peripheral area PA2 may not be bent.

The driver 50 may be mounted on the second peripheral area PA2, on the bending part, or located on one of both sides of the bending part.

The driver 50 may be provided in the form of a chip.

The driver 50 is electrically connected to the display area DA and the component area EA and can transmit electrical signals to pixels in the display area DA and the component area EA.

For example, the driver 50 may provide data signals to the pixels PX arranged in the display area DA.

Alternatively, the driver 50 may include a touch driving circuit and may be electrically connected to the touch sensor TS disposed in the display area DA and/or the component area EA.

In some embodiments, the driver 50 may include various circuits in addition to the above-described circuits or may be designed to provide various electrical signals to the display area DA.

In some embodiments, the display device 1000 may have a pad portion located at an end of the second peripheral area PA2, and is electrically connected to a flexible printed circuit board FPCB including a driving chip by the pad portion.

Here, the driving chip located on the flexible printed circuit board may include various driving circuits for driving the display device 1000 or a connector for power supply.

Based on the embodiment, a rigid printed circuit board PCB may be used instead of a flexible printed circuit board.

The optical element ES may be disposed below the display panel DP.

The optical element ES may include a first optical element ES1 overlapping the first component area EA1 and a second optical element ES2 overlapping the second component area EA2.

The first optical element ES1 may use infrared rays, and in this case, a layer that does not transmit light, such as, for example, a light blocking layer, may overlap the first component area EA1.

The first optical element ES1 may be an electronic element that uses light or sound.

For example, the first optical element ES1 is a sensor that receives and uses light such as, for example, an infrared sensor, a sensor that outputs and detects light or sound to measure distance or recognize a fingerprint, etc., or a small lamp that outputs light, and the first optical element ES1 may be a speaker that outputs sound, etc.

In the case of electronic elements that use light, it goes without saying that light of various wavelength bands, such as, for example, visible light, infrared light, and ultraviolet light, can be used.

The second optical element ES2 is at least one of a camera, an IR camera, a dot projector, an IR illuminator, and a Time-of-Flight photosensor.

Referring to FIG. 3, the display device 1000 may include a display panel DP, a power supply module PM, a first electronic module EM1, and a second electronic module EM2.

The display panel DP, the power supply module PM, the first electronic module EM1, and the second electronic module EM2 may be electrically connected to each other.

FIG. 3 illustrates pixels and a touch sensor TS located in the display area DA among the configuration of the display panel DP.

The power supply module PM can supply power for powering the overall operation of the display device 1000.

The power supply module PM may include a conventional battery module.

The first electronic module EM1 and the second electronic module EM2 may include various functional modules for operating the display device 1000.

The first electronic module EM1 may be mounted directly on the motherboard electrically connected to the display panel DP, or may be mounted on a separate board and electrically connected to the motherboard through a connector (not illustrated).

The first electronic module EM1 may include a control module CM, a wireless communication module TM, an image input module IIM, an audio input module AIM, a memory MM, and an external interface IF.

Some of the modules may not be mounted on the motherboard, but may be electrically connected to the motherboard through a flexible printed circuit board connected thereto.

The control module CM may control the overall operation of the display device 1000.

The control module CM may be a microprocessor.

For example, the control module CM activates or deactivates the display panel DP.

The control module CM can control other modules, such as, for example, an image input module IIM or an audio input module AIM, based on the touch signal received from the display panel DP.

The wireless communication module TM can transmit/receive wireless signals to and from other terminals using a Bluetooth or Wi-Fi line.

The wireless communication module TM can transmit/receive voice signals using a general communication line.

The wireless communication module TM includes a transmitter TM1 that modulates and transmits a signal to be transmitted, and a receiver TM2 that demodulates the received signal.

The image input module IIM can process video signals and convert them into video data that can be displayed on the display panel DP.

The audio input module AIM can receive external audio signals through a microphone in recording mode, voice recognition mode, etc., and convert them into electrical voice data.

The external interface IF may serve as an interface connected to an external charger, wired/wireless data port, card socket (e.g., memory card, SIM/UIM card), etc.

The second electronic module EM2 may include an audio output module AOM, a light emitting module LM, a light receiving module LRM, and a camera module CMM, at least some of which include optical elements ES, and the second electronic module EM2 may be located on the back of the display panel DP, as illustrated in FIGS. 1 and 2.

The optical element ES may include a light emitting module LM, a light receiving module LRM, and a camera module CMM.

In some aspects, the second electronic module EM2 is mounted directly on the motherboard, is mounted on a separate board and is electrically connected to the display panel DP through a connector (not illustrated), or is connected to the first electronic module EM1.

The audio output module AOM can convert audio data received from the wireless communication module TM or audio data stored in the memory MM and output sound to the outside.

The light emitting module LM can generate and output light.

The light emitting module LM can output infrared rays.

For example, the light emitting module LM may include an LED device.

For example, a light receiving module LRM can detect infrared light.

The light receiving module LRM may be activated when infrared rays above a certain level are detected.

The light receiving module LRM may include a CMOS sensor.

After the infrared light generated in the light emitting module LM is output, the infrared light is reflected by an external subject (e.g., a user's finger or face), and the reflected infrared light may be incident on the light receiving module LRM.

The camera module CMM can capture external images.

In an embodiment, the optical element ES may additionally include a light detection sensor or a heat detection sensor.

The optical element ES can detect an external subject received through the front or provide a sound signal such as, for example, voice to the outside through the front.

In some aspects, the optical element ES may include a plurality of components and is not limited to any one embodiment.

Again referring to FIG. 2, the housing HM may be combined with the cover window WU.

The cover window WU may be disposed on the front of the housing HM.

The housing HM can be combined with the cover window WU to provide a predetermined accommodation space.

The display panel DP and the optical element ES may be accommodated in a predetermined accommodation space provided between the housing HM and the cover window WU.

The housing HM may include a material with relatively high rigidity.

For example, the housing HM may include a plurality of frames and/or plates formed of glass, plastic, or metal, or a combination thereof.

The housing HM can stably protect the components of the display device 1000 accommodated in the internal space from external shock.

Hereinafter, the structure of the display device 1000 according to another embodiment will be described with reference to FIG. 4.

Figure 4:
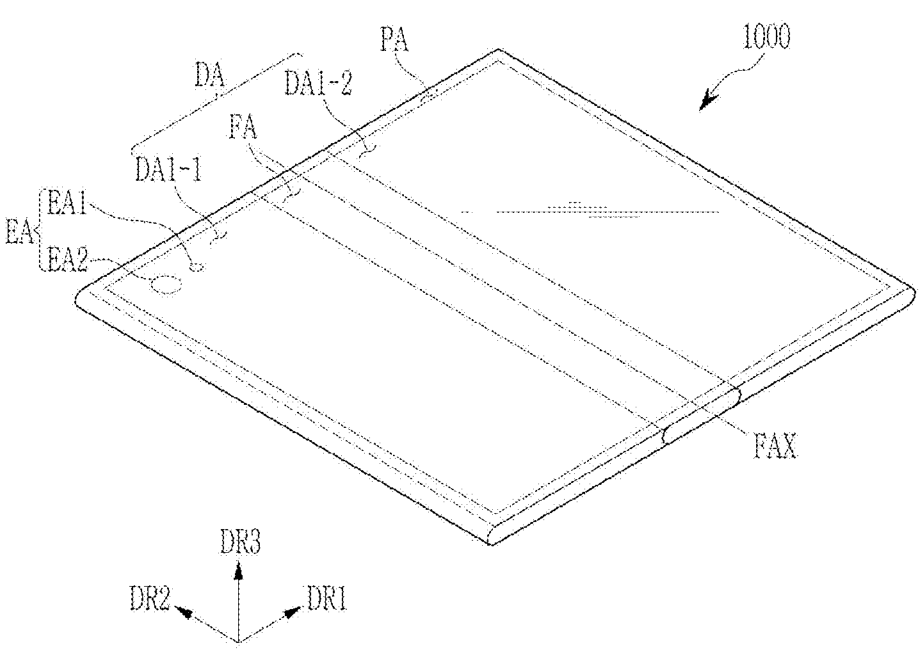
FIG. 4 is a perspective view schematically illustrating a light emitting display device according to another embodiment.

FIG. 4 is a perspective view schematically illustrating a light emitting display device according to another embodiment.

Descriptions of the same components as those described herein will be omitted, and the embodiment of FIG. 4 illustrates a foldable display device in which the display device 1000 is folded through the folding axis FAX.

Referring to FIG. 4, In an embodiment, the display device 1000 may be a foldable display device.

The display device 1000 may be folded outward or inward based on the folding axis FAX.

When folded outward based on the folding axis FAX, the display surfaces of the display device 1000 are positioned on the outside in the third direction DR3 such that images can be displayed in both directions.

If the display device 1000 is folded inward based on the folding axis FAX, the display surface may not be visible from the outside.

In an embodiment, the display device 1000 may include a display area DA, a component area EA, and a peripheral area PA.

The display area DA may be divided into a 1-1 display area DA1-1, a 1-2 display area DA1-2, and a folding area FA.

Display area DA1-1 and display area DA1-2 can be located on the left and right respectively, based on (or centered around) the folding axis FAX, and a folding area FA can be located between display area DA1-1 and display area DA1-2.

At this time, when folded outward based on the folding axis FAX, the 1-1 display area DA1-1 and the 1-2 display area DA1-2 are located on both sides in the third direction DR3, which allows images to be displayed in both directions.

In some aspects, when folded inward based on the folding axis FAX, the 1-1 display area DA1-1 and the 1-2 display area DA1-2 may not be visible from the outside.

Figure 5:
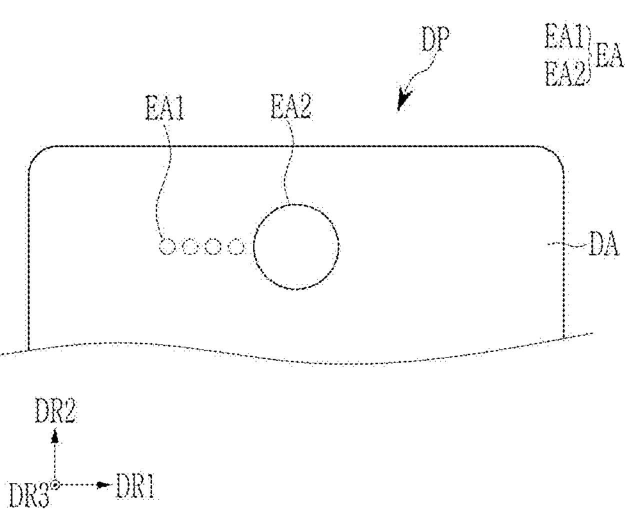
FIG. 5 is an enlarged plan view of a partial area of a light emitting display device according to an embodiment.

FIG. 5 is an enlarged plan view of a partial area of a light emitting display device according to an embodiment.

FIG. 5 illustrates a portion of a light emitting display panel DP of a light emitting display device according to an embodiment, and is illustrated using a display panel for a mobile phone.

The display area DA is located on the front of the light emitting display panel DP, and a component area EA is also located within the display area DA.

Specifically, the component area EA may include a first component area EA1 and a second component area EA2.

In some aspects, in the embodiment of FIG. 5, the first component area EA1 is located adjacent to the second component area EA2.

In the embodiment of FIG. 5, the first component area EA1 is located to the left of the second component area EA2.

The location and number of first component areas EA1 may vary based on the embodiment.

In FIG. 5, the second optical element ES2 corresponding to the second component area EA2 may be a camera, and the first optical element ES1 corresponding to the first component area EA1 may be an optical sensor.

The display area DA is formed with a plurality of light emitting diodes and a plurality of pixel circuit units that generate and transmit light emitting current to each of the plurality of light emitting diodes.

Here, one light emitting diode and one pixel circuit part are called a pixel PX.

In the display area DA, one pixel circuit unit and one light emitting diode are formed in a one-to-one arrangement.

The display area DA is hereinafter also referred to as the 'normal display area'.

Although the structure of the light emitting display panel DP below the cutting line is not illustrated in FIG. 5, the display area DA may be located below the cutting line.

The light emitting display panel DP according to the embodiment can be largely divided into a lower panel layer and an upper panel layer.

The lower panel layer is the part where the light emitting diode and the pixel circuit unit that make up the pixel are located, and may even include an encapsulation layer (see 400 in FIG. 6) covering it.

That is, the lower panel layer consists of an anode, a pixel defining layer (see 380 in FIG. 6), a light emitting layer (see EML in FIG. 6), and a spacer (see 385 in FIG. 6) from the substrate (see 110 in FIG. 6) to the encapsulation layer. The lower panel layer may also include a functional layer (see FL in FIG. 6), a cathode (see cathode in FIG. 6), and an insulating film between the substrate and anode, a semiconductor layer, and a conductive layer.

Figure 6:
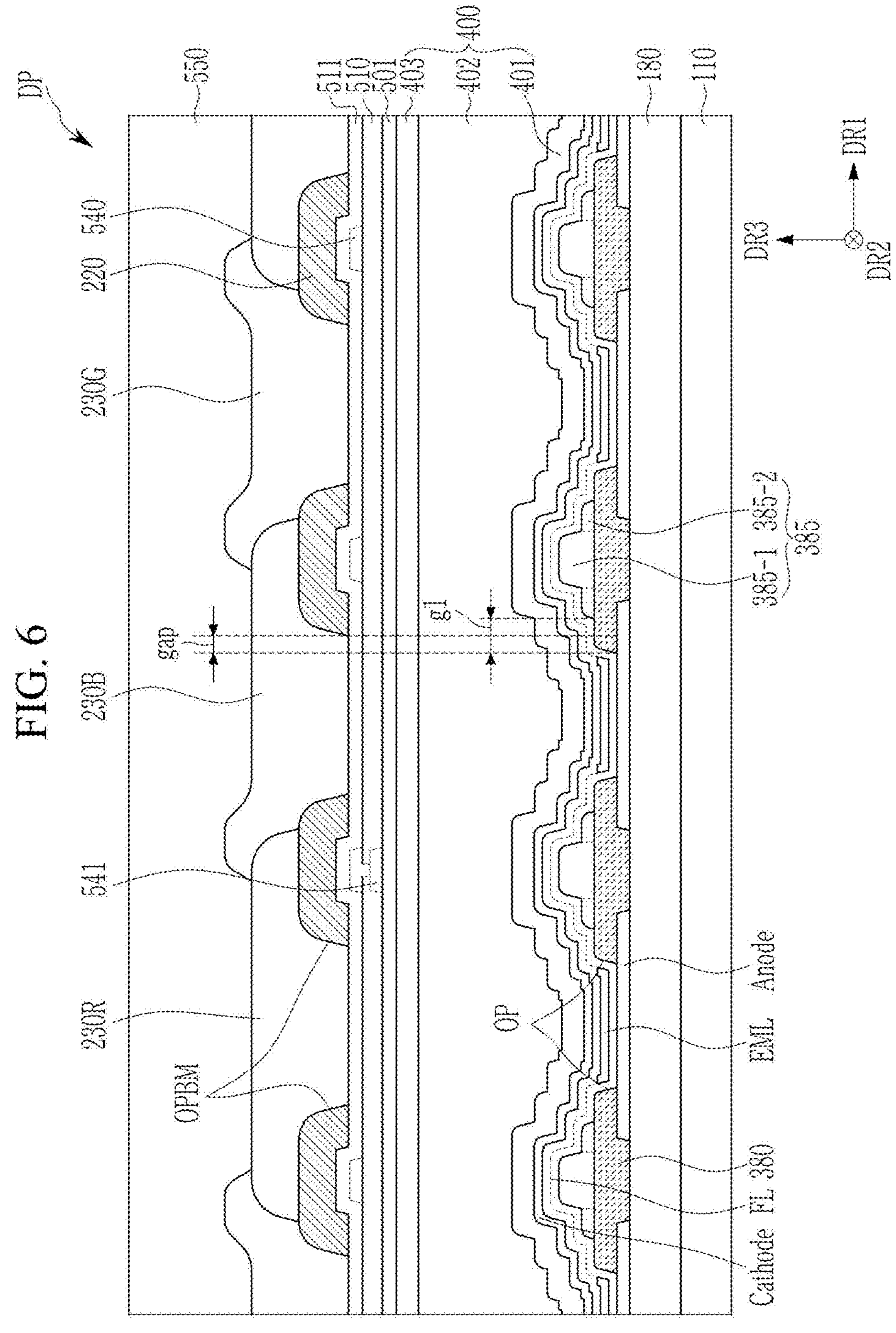
FIG. 6 is a schematic cross-sectional view of a display panel according to an embodiment.

In some embodiments, the upper panel layer is a part located above the encapsulation layer and includes a sensing insulating layer capable of detecting touch (see 501, 510, and 511 in FIG. 6) and a plurality of sensing electrodes (see 540 and 541 in FIG. 6), and may include a light blocking layer (see 220 in FIG. 6), a color filter (see 230 in FIG. 6), and a planarization layer (see 550 in FIG. 6).

The first component area EA1 may include a transparent layer which allows light to pass through, may be absent a conductive layer or semiconductor layer to allow light to pass through, and may have an optical sensor area in the lower panel layer. In some aspects, an opening (hereinafter referred to as an additional opening) is formed in a position corresponding to the first component area EA1 in the pixel definition layer, light blocking layer, and color filter layer of the upper panel layer, such that the first component area EA1 can have a structure that does not block light.

In some embodiments, even if the optical sensor area is located in the lower panel layer, if there is no corresponding opening in the upper panel layer, the area where the optical sensor area in the lower panel layer without corresponding opening in the upper panel layer may be the display area DA rather than the first component area EA1.

One first component area EA1 may include a plurality of adjacent optical sensor areas, and in this case, pixels adjacent to the optical sensor area may be included in the first component area EA1.

In some embodiments, for a case in which the first optical element ES1 corresponding to the first component area EA1 uses infrared rays rather than visible rays, the first component area EA1 overlaps the light blocking layer 220 that blocks visible rays.

The second component area EA2 may include a second component pixel and a light transmission area, and the space between adjacent second component pixels may be a light transmission area.

Although not illustrated in FIG. 5, a peripheral area may be further located outside the display area DA.

In some aspects, although FIG. 5 illustrates a display panel for a mobile phone, this embodiment can be applied to any display panel in which optical elements can be located on the back of the display panel, and the display device can also be a flexible display device.

In the case of a foldable display device among flexible display devices, the second component area EA2 and the first component area EA1 may be formed in positions different from those of FIG. 5.

Hereinafter, the structure of the light emitting display panel DP according to an embodiment will be described with reference to FIG. 6.

FIG. 6 is a schematic cross-sectional view of a display panel according to an embodiment.

The light emitting display panel DP according to an embodiment can display an image by forming light emitting diodes on a substrate 110, can detect a touch by including a plurality of sensing electrodes 540 and 541, and the light emitted from the light emitting diode has the color characteristics of the color filters 230R, 230G, 230B by having a light blocking layer 220 and the color filters 230R, 230G, 230B.

In some aspects, on the front of the light emitting display panel DP according to an embodiment, a polarizing plate is not formed. Instead, for example, a pixel defining layer 380 is formed with a black organic material, and a light blocking layer 220 and a color filter 230 are formed on top such that even if external light enters the interior, the light will not be reflected from the anode, etc., and transmitted to the user.

A detailed look at the light emitting display panel DP according to an embodiment is as follows.

The substrate 110 may include a material that has rigid properties and does not bend, such as, for example, glass, or may include a flexible material that can bend, such as, for example, plastic or polyimide.

A plurality of thin film transistors are formed on the substrate 110, but they are omitted in FIG. 6 and only the organic layer 180 covering the thin film transistors is illustrated.

One pixel is formed with a light emitting diode and a pixel circuit portion in which a plurality of transistors and capacitors are formed to transmit a light emitting current to the light emitting diode.

In FIG. 6, the pixel circuit unit is not illustrated, and the structure of the pixel circuit unit may vary based on the embodiment.

In FIG. 6, the organic layer 180 covering the pixel circuit portion is illustrated first.

A light emitting diode including an anode, an EML, and a cathode is located on the organic layer 180.

An anode may be composed of a single layer containing a transparent conductive oxide film and a metal material or a multiple layer containing the transparent conductive oxide film.

The transparent conductive oxide film may include ITO (Indium Tin Oxide), poly-ITO, IZO (Indium Zinc Oxide), IGZO (Indium Gallium Zinc Oxide), and ITZO (Indium Tin Zinc Oxide), and the metal material may include silver (Ag), molybdenum (Mo), copper (Cu), gold (Au), and aluminum (Al).

The light emitting layer EML may be formed of an organic light emitting material, and adjacent light emitting layers EML may display different colors.

In some aspects, based on the embodiment, each light emitting layer EML may display light of the same color due to the color filters 230R, 230G, and 230B located at the top.

Based on the embodiment, the light emitting layer EML may have a structure in which a plurality of light emitting layers are stacked (also called a tandem structure).

The pixel defining layer 380 is located on the organic layer 180 and the anode. The pixel defining layer 380 has an opening (OP; hereinafter referred to as the first opening), and the opening exposes and overlaps the anode. The light emitting layer EML overlaps a portion of and is located on the anode exposed by the opening OP.

In some aspects, the light emitting layer EML is located only within the opening OP of the pixel defining layer 380 and is separated from the adjacent light emitting layer EML by the pixel defining layer 380.

The pixel defining layer 380 may be formed of a negative-type black organic material.

The black organic material may include a light blocking material, and the light blocking material may include carbon black, carbon nanotubes, a resin or paste containing a black dye, metal particles such as, for example, nickel, aluminum, molybdenum, and alloys thereof, metal oxide particles (e.g., chromium nitride), and the like.

The pixel defining layer 380 contains a light blocking material and is black in color, and may have characteristics of absorbing/blocking light rather than reflecting light.

The negative-type black organic material may have the property of removing parts covered by a mask.

A spacer 385 is formed on the pixel defining layer 380.

The spacer 385 includes a first portion 385-1 that is relatively tall and located in a relatively narrow area, and a second portion 385-2 that is relatively low in height and is located in a relatively wide area.

In FIG. 6, the first portion 385-1 and the second portion 385-2 within the spacer 385 are illustrated separated by dotted lines.

Here, the first portion 385-1 may serve to secure rigidity against pressing pressure by enhancing scratch resistance.

The second portion 385-2 may serve to support contact (e.g., adhesion) between the pixel defining layer 380 and the upper functional layer FL.

The first portion 385-1 and the second portion 385-2 are formed of the same material and may be formed of a positive-type photosensitive organic material, for example, photosensitive polyimide (PSPI).

Because the photosensitive organic material has positive characteristics, parts not covered by the mask can be removed.

The spacer 385 may be transparent such that light can be transmitted and/or reflected (e.g., partially reflected).

The pixel defining layer 380 may be formed as a negative type, and the spacer 385 may be formed as a positive type, and based on the embodiment, the pixel defining layer 380 and the spacer 385 may include the same materials.

At least a portion of the upper surface of the pixel defining layer 380 is covered by the spacer 385, and the edge of the second portion 385-2 has a structure in which the edge of the pixel defining layer 380 is spaced apart from the edge of the pixel defining layer 380, and a portion of the defining layer 380 has a structure that is not covered by the spacer 385.

The second portion 385-2 covers even the upper surface of the pixel defining layer 380 where the first portion 385-1 is not located, thereby strengthening the adhesion characteristics between the pixel defining layer 380 and the functional layer FL.

In this embodiment, the spacer 385 is located only in an area that overlaps the light blocking layer 220, which will be described later, on a plane. When viewed from the front of the display panel DP, the spacer 385 is not visible because the spacer 385 is obscured by the light blocking layer 220.

A functional layer FL is located on the spacer 385 and the exposed pixel defining layer 380, and the functional layer FL is formed on the entire surface of the light emitting display panel DP or in some areas, for example, the functional layer FL may be formed in all areas except the light transmission area of the second component area EA2.

The functional layer FL may include an electron injection layer, an electron transport layer, a hole transport layer, and a hole injection layer. The functional layer FL may be located above and below the light emitting layer EML.

That is, the hole injection layer, hole transport layer, light emitting layer EML, electron transport layer, electron injection layer, and cathode are located sequentially on the anode to form the hole injection layer and hole transport in the functional layer FL, the layer may be located below the light emitting layer EML, and the electron transport layer and the electron injection layer may be located on top of the light emitting layer EML.

The spacer 385 can reduce the defect rate due to pressing pressure by increasing the scratch resistance of the light emitting display panel DP. According to the embodiment, the spacer 385 can increase the adhesion with the functional layer FL located at the top of the spacer 385, which may prevent moisture and air from being injected from the outside.

In some aspects, high adhesive strength has the advantage of eliminating the problem of poor adhesion between layers for cases in which the light emitting display panel DP has flexible characteristics and is folded and unfolded.

The cathode may be formed as a light-transmitting electrode or a reflective electrode.

Based on the embodiment, the cathode may be a transparent or translucent electrode, and may be lithium (Li), calcium (Ca), lithium/calcium fluoride (LiF/Ca), lithium/aluminum fluoride (LiF/Al), aluminum (Al), silver (Ag), magnesium (Mg), and their compounds can be formed as a metal thin film with a small work function.

In some aspects, a transparent conductive oxide (TCO) film, such as, for example, indium tin oxide (ITO), indium zinc oxide (IZO), zinc oxide (ZnO), or indium oxide (In2O3), may be further disposed on the metal thin film.

The cathode may be formed integrally over the entire surface of the light emitting display panel DP.

An encapsulation layer 400 is located on the cathode.

The encapsulation layer 400 includes at least one inorganic layer and at least one organic layer, and in FIG. 6, the encapsulation layer 400 includes a first inorganic encapsulation layer 401, an organic encapsulation layer 402, and a second inorganic encapsulation layer 403, and has a triple layer structure.

The encapsulation layer 400 may be used to protect the light emitting layer EML formed of an organic material from moisture or oxygen that may enter from the outside.

Based on the embodiment, the encapsulation layer 400 may include a structure in which an inorganic layer and an organic layer are further sequentially stacked.

Sensing insulating layers 501, 510, 511 and a plurality of sensing electrodes 540, 541 are positioned on the encapsulation layer 400 for touch detection.

In the embodiment of FIG. 6, touch is detected in a capacitive type using two sensing electrodes 540 and 541, but based on the embodiment, touch can also be detected in a self-capacitive type using a single sensing electrode.

The plurality of sensing electrodes 540 and 541 may be insulated with a second sensing insulating layer 510 interposed between the sensing electrodes 540 and 541, and a lower sensing electrode 541 is located on the first sensing insulating layer 501. The second sensing insulating layer 510 is interposed between the plurality of sensing electrodes 540 and 541, an upper sensing electrode 540 is located on the layer 510, and the upper sensing electrode 540 is covered by a third sensing insulating layer 511.

The plurality of sensing electrodes 540 and 541 may be electrically connected through an opening located in the second sensing insulating layer 510.

Here, the sensing electrodes 540 and 541 may be formed of metal or metal alloy such as, for example, aluminum (Al), copper (Cu), silver (Ag), gold (Au), molybdenum (Mo), titanium (Ti), and tantalum (Ta), and the sensing electrodes 540 and 541 may include a single layer or multiple layers.

A light blocking layer 220 and color filters 230R, 230G, and 230B are positioned on the third sensing insulating layer 511.

The light blocking layer 220 may be positioned to overlap the sensing electrodes 540 and 541 in a plane. The light blocking layer 220 may be positioned not to overlap the anode in the plane.

The described positioning of the light blocking layer 220 may ensure that the anode and the light emitting layer EML capable of displaying an image are not obscured by the light blocking layer 220 and the sensing electrodes 540 and 541.

Referring to FIG. 6, the light blocking layer 220 is located only in the area overlapped by the pixel defining layer 380 on the plane, and one side of the light blocking layer 220 is placed inward from the corresponding side of the pixel defining layer 380.

The light blocking layer 220 also has a second opening (OPBM; hereinafter referred to as the second opening), and the area of the second opening OPBM of the light blocking layer 220 is larger than the opening OP of the pixel defining layer 380. The opening OP of the pixel defining layer 380 may be located within the second opening OPBM of the light blocking layer 220 in a planar view.

Referring to FIG. 6, the gap ('gap') between one side of the pixel defining layer 380 and one side of the light blocking layer 220 is illustrated, and the pixel defining layer 380 has a structure that protrudes more with the gap.

In some embodiments, the gap ('gap') between the pixel defining layer 380 and the light blocking layer 220 may be equal to the gap between the opening OP of the pixel defining layer 380 and the second opening OPBM of the light blocking layer 220.

In some aspects, one side of the spacer 385 is located a certain distance g1 inward from one side of the pixel defining layer 380, and the spacer 385 is also positioned inward from one side of the light blocking layer 220.

As a result, the spacer 385 may not be visible because the spacer 385 is obscured by the light blocking layer 220 when viewed from the front of the display panel DP.

When external light is incident, the light may pass through the second opening OPBM of the light blocking layer 220 and then be reflected on the sidewall of the opening OP of the pixel defining layer 380.

The sidewall of the opening OP of the pixel defining layer 380 is curved and color separation occurs depending on the position of reflection, such that the reflected light can appear in various colors, such as, for example, a rainbow.

Since this color-separated reflected light can easily be seen by the user and deteriorate the display quality, in the embodiment, the second opening OPBM of the light blocking layer 220 and the opening OP of the pixel defining layer 380 are formed in an oval shape, and the oval direction or eccentricity of the oval shape is configured in various ways to reduce color separation or allow white reflected light to be recognized. The term 'eccentricity' may also be referred to as a 'plane eccentricity' herein.

This will be discussed in more detail below in FIG. 7.

Color filters 230R, 230G, 230B are positioned on the sensing insulating layers 501, 510, and 511 and the light blocking layer 220.

The color filters 230R, 230G, 230B include a red color filter 230R that allows red light to pass through, a green color filter 230G that allows green light to pass through, and a blue color filter 230B that allows blue light to pass through.

Each color filter 230R, 230G, 230B can be positioned to overlap the anode of the light emitting diode on a plane, and a color filter of one color may be installed in and fill the second opening OPBM of the light blocking layer 220.

Some of the color filters 230R, 230G, and 230B may also be located on the upper surface of the light blocking layer 220.

Since the light emitted from the light emitting layer EML may change to a corresponding color as the light passes through a color filter, all light emitted from the light emitting layer EML may have the same color.

However, the light emitting layer EML emits light of different colors, and the displayed color can be strengthened by passing through a color filter of the same color.

The light blocking layer 220 may be positioned between each color filter 230R, 230G, and 230B.

Based on the embodiment, the color filters 230R, 230G, and 230B may be replaced with a color conversion layer or may further include a color conversion layer.

The color conversion layer may include quantum dots.

A planarization layer 550 covering the color filters 230R, 230G, and 230B is positioned on the color filters 230R, 230G, and 230B.

The planarization layer 550 is used to planarize the upper surface of the light emitting display panel, and may be a transparent organic insulating film containing one or more materials selected from the group consisting of polyimide, polyamide, acrylic resin, benzocyclobutene, and phenol resin.

Based on the embodiment, a low refractive layer and an additional planarization layer may be further positioned on the planarization layer 550 to improve front visibility and light output efficiency of the display panel.

Light can be refracted and emitted toward the front by the low refractive layer and the additional flattening layer with high refractive characteristics.

In this case, based on the embodiment, the planarization layer 550 may be omitted and a low refractive layer and an additional planarization layer may be located directly on the color filter 230.

In this embodiment, a polarizing plate is not included on top of the planarization layer 550.

In other words, the polarizer can prevent display quality from deteriorating when external light is incident and reflected by the anode or the sidewall of the opening OP of the pixel defining layer 380, which is visible to the user.

However, the polarizer has the disadvantage of consuming more power to display a certain luminance by not only reducing the reflection of external light but also reducing the light emitted from the light emitting layer EML.

In order to reduce power consumption, the light emitting display device of this embodiment may not include a polarizer.

In some aspects, in this embodiment, the side of the anode is covered with the pixel defining layer 380 to reduce the degree of reflection from the anode, and a light blocking layer 220 is also formed to reduce the degree of incident light, thereby reducing the amount of light incident on the anode, and the light blocking layer 220 already contains a structure that prevents deterioration of display quality.

Therefore, according to the embodiment of FIG. 6, the display panel DP may be implemented without separately forming a polarizer on the front of the light emitting display panel DP.

Hereinafter, the second opening OPBM of the light blocking layer 220 and the opening OP of the pixel defining layer 380 will be described through the structure of the light emitting display panel DP formed in the display area DA through FIGS. 7 and 8. Aspects of the structure (also called the first opening) are described in more detail.

Figure 7:
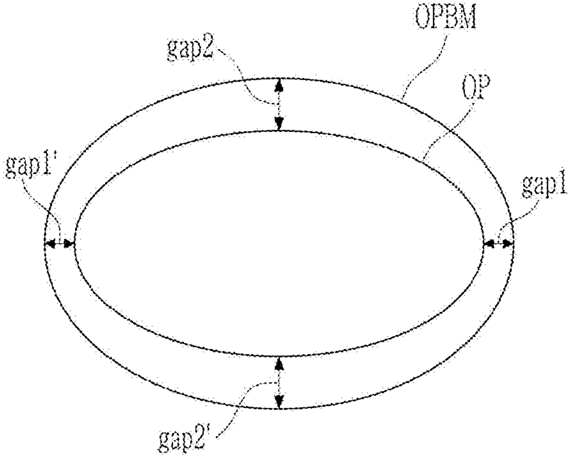
FIG. 7 and FIG. 8 are plan views of a portion of a display panel according to an embodiment.
Figure 8:
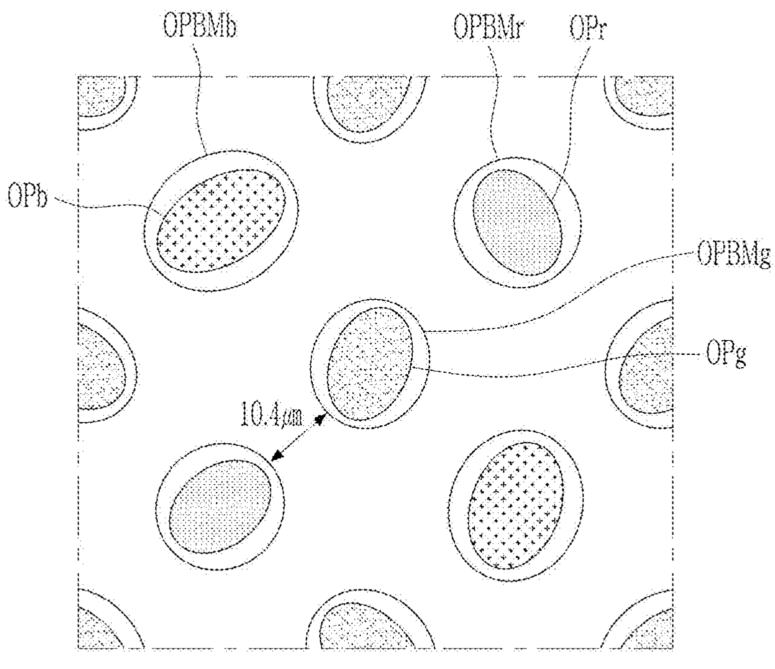
Figure 8:
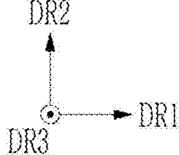

FIG. 7 and FIG. 8 are plan views of a portion of a display panel according to an embodiment.

In FIG. 7, the second opening OPBM of one light blocking layer 220 and the opening OP of the pixel defining layer 380 are illustrated overlapping each other. In FIG. 8, the second opening OPBM of the plurality of light blocking layers 220 is illustrated, and an second opening OPBM and an opening OP of the pixel defining layer 380 are illustrated.

First, the structures of the second opening OPBM of one light blocking layer 220 and the opening OP of the pixel defining layer 380 that overlap each other will be examined through FIG. 7.

Specifically, in FIG. 7, only the opening OP of one pixel defining layer and the second opening OPBM of the light blocking layer 220 corresponding thereto are illustrated.

In FIG. 7, the pixel defining layer is located on the outer portion of the opening OP, and the light blocking layer 220 is also located on the outer portion of the second opening OPBM.

In the embodiment of FIG. 7, the opening OP of the pixel defining layer 380 is formed to have an oval shape in a plan view, and the second opening OPBM of the light blocking layer 220 is formed to have an oval shape in a plan view, but the pixel defining layer has an oval shape, and the horizontal gaps gap1, gap1', gap2, gap2' between the opening OP of the pixel defining layer 380 and the second opening OPBM of the light blocking layer 220 are not constant.

In FIG. 7, the gaps in the major axis direction and the minor axis direction between the opening OP of the pixel defining layer 380 or the second opening OPBM of the light blocking layer 220 are indicated by arrows, respectively.

In FIG. 7, the gap (gap1, gap1'; hereinafter also referred to as the gap in the major axis direction) is the horizontal gap in the major axis direction between the opening OP of the pixel defining layer 380 and the second opening OPBM of the light blocking layer 220 in the plan view, and a gap (gap2, gap2'; hereinafter also referred to as a minor axis direction gap) is illustrated, which is a horizontal gap in the minor axis direction between the opening OP of the pixel defining layer 380 and the second opening OPBM of the light blocking layer 220.

In the corresponding opening OP of the pixel defining layer 380 and the second opening OPBM of the light blocking layer 220, the major axis direction gap gap1, gap1' has a different value from the minor axis direction gap gap2, gap2'. The minor axis direction gap gap2, gap2' has a larger value than the major axis direction gap gap1, gap1'.

The difference between the major axis direction gap gap1, gap1' and the minor axis direction gap gap2, gap2' may have a value of 0.1 μm or more and 1 μm or less. Referring to FIG. 13, due to errors that may occur during the actual process, since the maximum difference that can occur may be 2.6 μm, the difference between the major axis direction gap gap1, gap1' and the minor axis direction gap gap2, gap2' may be 0.1 μm or more and 2.6 μm or less.

Figure 12:
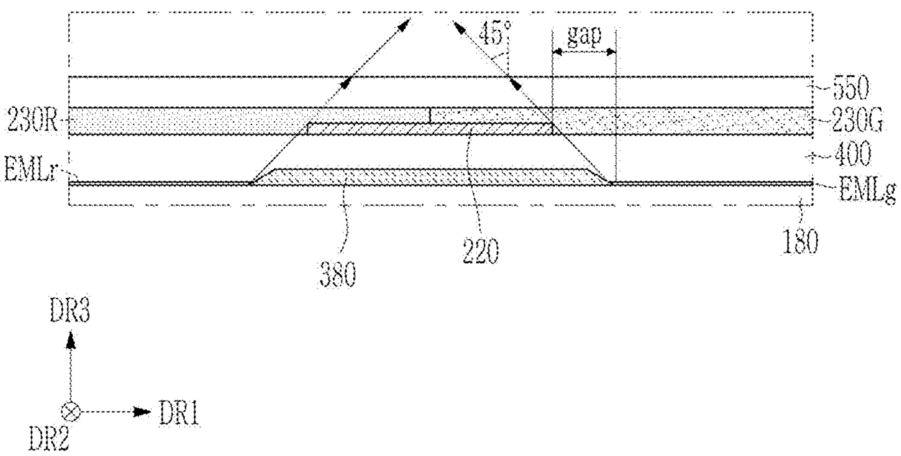
FIG. 12 is a cross-sectional view clearly illustrating the gap in FIG. 11.

These values indicate that the horizontal gap may change depending on the thickness of the layer (for example, the encapsulation layer 400 in FIG. 12) located between the light blocking layer 220 and the pixel defining layer 380 in the cross-section (see FIG. 12).

Based on the embodiment, in order to enable display with a certain level of luminance at a viewing angle of 45 degrees, the thickness of the encapsulation layer or the gap between the light blocking layer 220 and the pixel defining layer 380 may be formed to be about 6 μm.

In some aspects, based on the embodiment, each major axis direction gap gap1, gap1' and each minor axis direction gap gap2, gap2' may have different values, and 'is indicated to distinguish between the gaps. However, based on the embodiment, the major axis direction gaps gap1, gap1' may have the same value, and the minor axis direction gaps gap2, gap2' may also have the same value.

In some embodiments, although not explicitly illustrated in FIG. 7, the opening OP of the pixel defining layer 380 and the corresponding second opening OPBM of the light blocking layer 220 also have a horizontal gap in a direction located between the major axis direction and the minor axis direction (hereinafter also referred to as a direction other than the major axis direction and the minor axis direction or a diagonal direction) which may have different values from the major axis direction gap gap1, gap1' and the minor axis direction gap gap2, gap2'. The horizontal gap in an oblique direction between the opening OP of the pixel defining layer 380 and the corresponding second opening OPBM of the light blocking layer 220 may be referred to as a diagonal gap.

Here, the elliptical shape of the opening OP of the pixel defining layer 380 and the second opening OPBM of the light blocking layer 220 has two foci, and connects points where the sum of the distances to the two foci is constant, and the elliptical shape can have one shape and have a major axis and a minor axis. In the examples described herein, the openings OP described herein may be elliptical shaped (e.g., having two axes of reflection symmetry) or oval shaped (e.g., having a single axis of reflection symmetry). Aspects described herein of an oval shaped opening OP and aspects described herein of an elliptical shaped opening OP may be interchangeably applied to one another.

In some embodiments, the eccentricity of an ellipse is the distance between two foci divided by the length of the major axis.

When the eccentricity is 0, the shape is a circle, and when the eccentricity is 1, the shape forms a parabola, so an ellipse has an eccentricity value that is greater than 0 and less than 1.

The eccentricity values of the elliptical shape of the opening OP of the pixel defining layer 380 and the second opening OPBM of the light blocking layer 220 may vary based on the embodiment, and the opening OP of the pixel defining layer 380 may vary based on the embodiment, and the second opening OPBM of the light blocking layer 220 may have different eccentricities.

In some aspects, based on the embodiment, the major axis direction of the opening OP of the pixel defining layer 380 and the second opening OPBM of the light blocking layer 220 may vary, and the minor axis direction is perpendicular to the major axis direction.

The opening OP of the pixel defining layer 380 and the second opening OPBM of the light blocking layer 220, which have the same structure as illustrated in FIG. 7, may be arranged as illustrated in FIG. 8 in the display area.

In FIG. 8, the red, green, and blue primary colors are displayed based on the light emitting layer, and the openings OP of the pixel defining layer 380 corresponding to each light emitting layer and the second opening OPBM of the light blocking layer 220 are distinguished as openings OPr, OPg, OPb and second openings OPBMr, OPBMg, OPBMb, respectively.

Here, r, g, and b may correspond to red, green, and blue, respectively.

The openings OPr, OPg, OPb of one pixel defining layer 380 correspond to the second openings OPBMr, OPBMg, OPBMb of one light blocking layer 220.

That is, within each of the second openings OPBMr, OPBMg, OPBMb of the light blocking layer 220, there is an opening OPr, OPg, OPb of the pixel defining layer 380 corresponding to each of the second openings OPBMr, OPBMg, OPBMb of the light blocking layer 220 are located.

The corresponding second openings OPBMr, OPBMg, OPBMb of the light blocking layer 220 and the corresponding openings OPr, OPg, OPb of the pixel defining layer 380 may overlap each other on a plane.

The openings OPr, OPg, OPb of the pixel defining layer 380 may be arranged at various angles, and the red opening OPr, the green opening OPg, and the blue opening OPb have different eccentricities.

In some embodiments, each of the openings OPr, OPg, OPb of the same color may be formed with the same or different eccentricity.

Here, the elliptical eccentricity of the openings OPr, OPg, OPb of the pixel defining layer 380 may range from 0.2 to 0.85.

At this time, each of the second openings OPBMr, OPBMg, OPBMb of the light blocking layer 220 may have an eccentricity ranging from 0 to 0.84, and the openings OPr, OPg, OPb of the corresponding pixel defining layer 380 on a plane can be formed such that the distance in the major axis direction from each is smaller than the distance in the minor axis direction by a value ranging from 0.1 μm to 2.6 μm.

Based on the embodiment, each of the second openings OPBMr, OPBMg, OPBMb of the light blocking layer 220 has a major axis direction and a minor axis direction from each of the openings OPr, OPg, OPb of the corresponding pixel defining layer 380 on the plane. The gap in the diagonal direction may also have an irregular structure, and the openings OPr, OPg, OPb of the pixel defining layer 380 and the corresponding second openings OPBMr, OPBMg, OPBMb of the light blocking layer 220 may have an irregular structure, and the in-plane gap may have a horizontal gap ranging from 0 μm to 20 μm.

In FIG. 8, the openings OPr, OPg, OPb of the pixel defining layer 380 and the second openings OPBMr, OPBMg, OPBMb of the light blocking layer 220 are arranged in various directions, and the second openings OPBMr, OPBMg, OPBMb can be explained based on the direction of the major axis of the ellipse.

According to the embodiment, the angle formed by the major axis of the second opening OPBMr, OPBMg, OPBMb of the light blocking layer 220 can have four or more angles, and also, the angle formed by the major axis can be arranged at intervals of 45 degrees or less.

As an example, looking at specific angle relationships focusing on an embodiment with five angles, the relationship is as follows.

The embodiment with five angles is formed with an interval of 36 degrees on the major axis, so if one major axis has 0 degrees based on the first direction DR1, other four major axis have angles of 36 degrees, 72 degrees, 108 degrees, and 144 degrees, for a total of five angles.

In other words, the distance between the angles of the major axis can be checked by dividing the angle of 180 degrees by 5, which is the number of directions, and this is because the two angles with an angle of 180 degrees out of 360 degrees have substantially the same direction of the major axis of the ellipse, which may mean calculating by dividing by the number based on 180 degrees.

The major axis of the openings OPr, OPg, OPb of the pixel defining layer 380 and/or the second openings OPBMr, OPBMg, OPBMb of the light blocking layer 220 are spaced at equal intervals at a specific angle of 45 degrees or less.

However, based on the embodiment, the angle formed by each major axis may be one of 45 degrees or less and may be arranged at irregular intervals.

The embodiment in which the major axis of the openings are arranged at non-equal intervals may be intentionally arranged to reduce the diffraction pattern, or may be arranged at non-equal intervals due to processing errors.

In some aspects, based on the embodiment, the major axis directions of the second openings OPBMr, OPBMg, OPBMb of the light blocking layer 220 and the openings OPr, OPg, OPb of the pixel defining layer 380 form a certain angle due to process errors, etc., and alternatively, the major axis directions may have an angle of 0 degrees or more and 20 degrees or less.

In some embodiments, in order to have a unit pixel including the openings of red, green, and blue to have a square structure, it may be appropriate to form the angle of the major axis with the number of the square of an integer, such as, for example, $2^2$, $3^2$, $4^2$, $5^2$, etc.

Here, the unit pixel may include one each of red, green, and blue openings, and a plurality of openings of one color, for example, green openings, may be formed.

Referring to FIG. 8, it is illustrated that the smallest distance between the second openings OPBMr, OPBMg, OPBMb of adjacent light blocking layers 220 is 10.4 μm.

This may vary depending on the ppi (pixel per inch) value, and in the embodiment of FIG. 8, a high-resolution display device of 500 ppi is illustrated.

In this way, the gap between the second openings OPBMr, OPBMg, OPBMb of adjacent light blocking layers 220 may be narrowed in a high-resolution display device, but the gap in the major axis direction is made narrower than the gap in the minor axis direction, such that even in a high-resolution display device, the gap between the second openings OPBMr, OPBMg, OPBMb of adjacent light blocking layers 220 is relatively large, ensuring 10.4 μm at 500 ppi.

In general, when forming the second openings OPBMr, OPBMg, OPBMb in the light blocking layer 220, considering process conditions and errors, the minimum gap between adjacent second openings OPBMr, OPBMg, OPBMb is 10 μm, securing the minimum gap may support effective operation of a display panel in accordance with one or more embodiments of the present disclosure. In the embodiment described with reference to FIG. 8, the actual light blocking layer 220 can be formed without error by etching even in a 500 ppi high-resolution display device, and as a result, even in a high-resolution light-emitting display device, less color separation of external light occurs or the display device can have the advantage of producing a constant diffraction pattern or color separation regardless of the angle.

Hereinafter, a comparative example will be described with reference to FIGS. 9 and 10.

Figure 9:
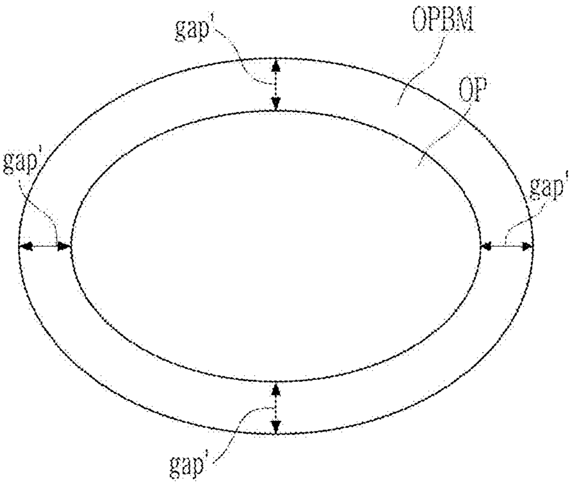
FIG. 9 and FIG. 10 are plan views of a portion of a display panel according to a comparative example.
Figure 10:
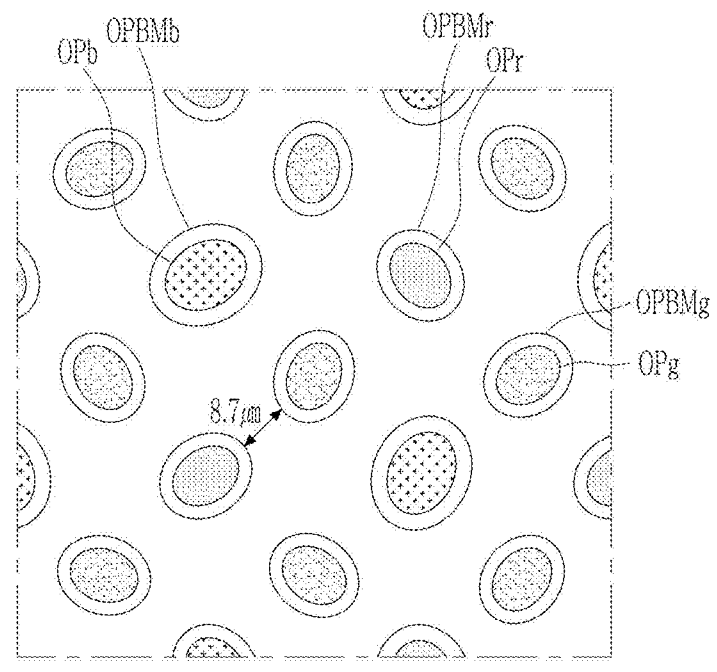
Figure 10:
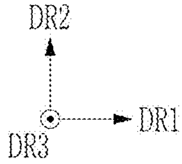

FIG. 9 and FIG. 10 are plan views of a portion of a display panel according to a comparative example.

FIG. 9 corresponds to FIG. 7, and FIG. 10 corresponds to FIG. 8, and in the comparative example, the opening OP of the pixel defining layer 380 and the second opening OPBM of the light blocking layer 220 are illustrated on a plane. The branches have certain characteristics such as, for example, gaps in various directions.

FIG. 9, a comparative example in which the horizontal gap 'gap' is constant between the opening OP of the pixel defining layer 380, and the second opening OPBM of the light blocking layer 220 is a plurality of pixel defining layers 380 in the display area and the second openings OPBMr, OPBMg, OPBMb of the light blocking layer 220 are illustrated in FIG. 10.

Referring to FIG. 10, when the comparative example structure of FIG. 9 is formed in a 500 ppi high-resolution display device, the smallest gap between the second openings OPBMr, OPBMg, OPBMb of adjacent light blocking layers 220 is 8.7 μm.

This value described with reference to the comparative example structure is a gap that is difficult to actually form when considering the process conditions and errors in the light blocking layer 220, and the comparative example structure may not be formed on the manufactured display panel, or problems may arise where the comparative example structure is formed at a gap and/or of a shape different from the example of FIG. 10.

The advantages supported by the example embodiments of the present disclosure can be explained by comparing FIGS. 8 and 10 as follows.

If a polarizer is not formed on the front of the light emitting display device, there may be a disadvantage in that external light is reflected and visible. Pixels are defined to reduce color separation of external light or to generate a constant diffraction pattern or color separation regardless of angle, the opening OP of the pixel defining layer 380 and/or the second opening OPBM of the light blocking layer 220 may be formed into an ellipse, and the eccentricity or major axis direction may be changed in various ways.

At this time, the second opening OPBM is formed larger than the opening OP of the pixel defining layer 380, so when manufacturing a high-resolution light emitting display device, the gap between adjacent second openings OPBM is smaller than the minimum that can be formed, and problems that make it impossible to actually form may occur.

In general, the minimum line width in the process of the light blocking layer 220 is about 10 μm, and it is difficult to manufacture a line width of less than 10 μm.

However, referring to the comparative example of FIG. 10, in a 500 ppi light emitting display device, the minimum gap between the second openings OPBMr, OPBMg, OPBMb of adjacent light blocking layers 220 needs to be 8.7 μm, which may result in process problems associated with manufacturing the light emitting display device.

However, referring to FIG. 8, even in a 500 ppi light emitting display device, the minimum gap between the second openings OPBMr, OPBMg, OPBMb of adjacent light blocking layers 220 is formed at 10.4 μm, so there is no problem in forming a high resolution light emitting display device, and therefore, even in a high-resolution light emitting display device of 500 ppi or higher, color separation of external light can be reduced or a constant diffraction pattern or color separation can be formed regardless of the angle.

Accordingly, as illustrated in FIGS. 7 and 8, the intended shape and gap in a high-resolution display device are formed by using the second openings OPBMr, OPBMg, OPBMb of the light blocking layer 220, which form the gap in the major axis direction to be narrower than the gap in the minor axis direction, and the second openings can be arranged at various angles, gaps, and/or eccentricities such that color separation of external light occurs less or a constant diffraction pattern occurs regardless of the angle.

Hereinafter, various modified embodiments will be described with reference to FIGS. 11 to 14.

First, aspects of the structure of the embodiment of FIG. 7 described herein are described in more detail through FIG. 11.

FIG. 11 is a table summarizing the gaps between an example and a comparative example.

FIG. 11 illustrates the major axis direction gap and minor axis direction gap for the embodiment of FIG. 7 and the comparative example of FIG. 9 in more detail.

In FIG. 11, the major axis direction gap gap1, gap1' of the example of FIG. 7 is described as the major axis, and the minor axis direction gap gap2, gap2' is described as the minor axis, and in the comparative example of FIG. 9, the major axis direction and minor axis direction gap gap' are all the same.

In some aspects, the gap described in FIG. 11 is divided into a total gap, a secured gap, and a margin, and the total gap is the sum of the secured gap and the margin, and can correspond to the design value.

In other words, if the process is carried out with the total gap set to 5.72 μm by design, an error that may occur due to the process margin may be 1.17 μm, indicating that the minimum secured gap may be 4.55 μm.

Here, the margin value may change depending on process conditions.

According to FIG. 11, in the comparative example of FIG. 9, the total gap in both the major and minor axis was set to 5.72 μm, and when considering the margin, the secured gap may be 4.55 μm.

In some embodiments, in the embodiment of FIG. 7, the gap in the minor axis direction is the same as the comparative example in FIG. 9, but the gap in the major axis direction is 1 μm smaller than the gap in the minor axis direction.

That is, the total gap in the major axis direction of the embodiment of FIG. 7 is 4.72 μm, and considering the margin, the minimum secured gap may be 3.55 μm.

This gap will be examined in detail through the cross-sectional view of FIG. 12.

FIG. 12 is a cross-sectional view clearly illustrating the gap in FIG. 11.

Referring to FIG. 12, the following structure of the organic layer 180 is omitted, and the anode and cathode located above and below the light emitting layers EMLr, EMLg are also omitted.

Only the encapsulation layer 400 is illustrated between the pixel defining layer 380 and the light blocking layer 220.

Based on the embodiment, a sensing insulating layer and a sensing electrode may be further positioned on the encapsulation layer 400.

The gap between one side of the pixel defining layer 380 and one side of the light blocking layer 220 is related to the angle (maximum viewing angle) at which the light emitted from the light emitting layers EMLr, EMLg is not blocked by the pixel defining layer 380 and the light blocking layer 220, and is transmitted.

In other words, as the gap increases, the maximum viewing angle can increase.

This maximum viewing angle is also affected by the distance between the pixel defining layer 380 and the light blocking layer 220 in the third direction DR3, and the distance between the pixel defining layer 380 and the light blocking layer 220 in the third direction DR3 as the gap increases, so the viewing angle may decrease even if the gap is the same.

Here, the encapsulation layer 400 may have a thickness of approximately 6 μm.

In FIG. 12, a viewing angle of 45 degrees is illustrated, but this is only an example, and since the viewing angle generally used in light emitting display devices is 45 degrees, the viewing angle in FIG. 12 is also illustrated at 45 degrees.

In some aspects, although the arrow corresponding to the viewing angle in FIG. 12 is illustrated as not being bent at the boundary of each layer, in reality, light may be transmitted in a path that is slightly bent at the boundary of each layer.

Based on the above structural features, numerical ranges of gap and eccentricity that the embodiment can have are described with reference to FIG. 13.

FIG. 13 is a table listing the gap and eccentricity range according to the embodiment.

The gap in FIG. 13 is described not only as a design value, but also as a minimum and maximum value that can actually be formed through the process.

Each gap value in FIG. 13 corresponds to the total gap in FIG. 11.

The minimum in FIG. 13 is the minimum value of the gap, and in FIG. 12, the minimum is the gap when the luminance ratio decreases by 1% at a viewing angle of 45 degrees, it means that when the major axis direction gap is 2.6 μm smaller than the minor axis direction gap, the luminance ratio decreases by 1% at a viewing angle of 45 degrees.

In some embodiments, the maximum value in FIG. 13 is the maximum value of the gap, which is the gap when the light blocking layer 220 has a minimum line width of 10 μm in a 500 ppi light emitting display device.

Here, the gap value of the design value is set such that the gap in the minor axis direction is 1 μm larger than the gap in the major axis direction.

Referring to FIG. 13, if the design value is set such that the major axis direction gap is 1 μm smaller than the minor axis direction gap, due to process errors, etc., the actual major axis direction gap that is formed can be a minimum of 3.12 μm and a maximum of 4.82 μm.

Therefore, the major axis direction gap can be at least 0.9 μm smaller than the minor axis direction gap, or a maximum of 2.6 μm smaller.

Since the numerical range in FIG. 13 is the numerical range when the design value is set to be as small as 1 μm, the numerical range may be changed as the design value is changed from 0.1 μm to less than 1 μm.

However, when the design value is 1 μm, the gap in the major axis direction may be smaller than the gap in the minor axis direction, and the largest gap difference between the gap in the major axis direction and the gap in the minor axis direction can occur up to 2.6 μm.

In some embodiments, in FIG. 13, the eccentricity is also described.

The eccentricity is an eccentricity value of the second opening OPBM of the light blocking layer 220 determined based on the minor axis direction gap and the major axis direction gap.

In some cases, based on the embodiment, the eccentricity value may differ from the eccentricity value described with reference to FIG. 13 as the length in the minor axis direction and the length in the major axis direction change.

That is, the eccentricity of the second opening OPBM of the light blocking layer 220 in the comparative example of FIG. 9 is 0.56, and compared with the minimum and maximum eccentricities, the eccentricity of the second opening OPBM of the light blocking layer 220 is a minimum. The eccentricity can be as small as 0.01, and up to as small as 0.2.

Figure 24:
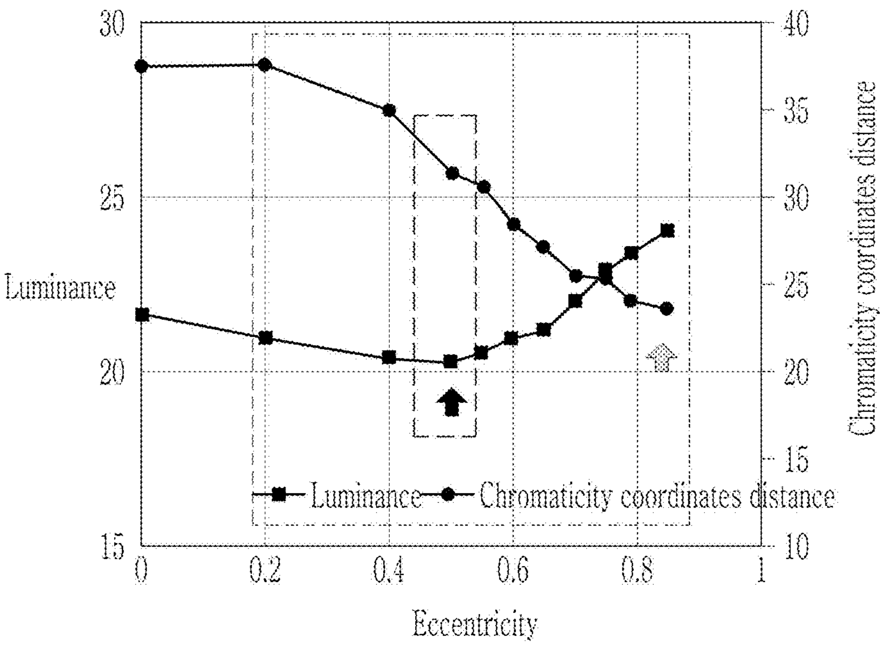

In some embodiments, as in in FIG. 24, the eccentricity of the elliptical shape that can be applied in this embodiment may have an eccentricity ranging from 0.2 to 0.85, so the elliptical shape can have an eccentricity value ranging from 0 to 0.84, which is an eccentricity value smaller by an amount ranging from 0.01 to 0.2, as the eccentricity value of the second opening OPBM of the light blocking layer 220.

Below, FIG. 14 illustrates an example of how much difference a 1% luminance difference is at a viewing angle of 45 degrees corresponding to the minimum value in FIG. 13.

FIG. 14 is a table simulating the luminance ratio to viewing angle according to the gap in the comparative example.

In FIG. 14, in a comparative example (see FIG. 18) in which the openings of the pixel defining layer and the light blocking layer are both circular, the luminance change at various viewing angles is tabulated by changing the gap between the opening of the pixel defining layer and the second opening of the light blocking layer.

In some embodiments, in FIG. 14, the viewing angle according to the gap is also illustrated separately, which may mean the angle at which the luminance can be viewed as is when the gap is not reduced.

Referring to FIG. 14, it can be seen that a 1% decrease in luminance (99%) at a viewing angle of 45 degrees corresponds to a decrease of about 0.36 μm to 0.57 μm (about 0.4 μm) in red, green, and blue.

That is, the luminance characteristic of this example, with the design value reduced by 1 μm matches the luminance characteristic of the comparative example, with the value reduced by about 0.4 μm, so it has the advantage of being able to have relatively high luminance even at higher resolution.

In some aspects, based on the embodiment, the direction of the major axis of the oval shape can be varied to reduce the difference in luminance depending on the direction.

In the following, an example embodiment is described where the second opening OPBM of the light blocking layer 220 and the opening (OP; also referred to as the first opening) of the pixel defining layer 380 are each formed in an elliptical shape (expressed another way, are each an elliptical shape), through the structure of the light emitting display panel DP formed in the display area DA through FIGS. 15 to 17.

Figure 15:
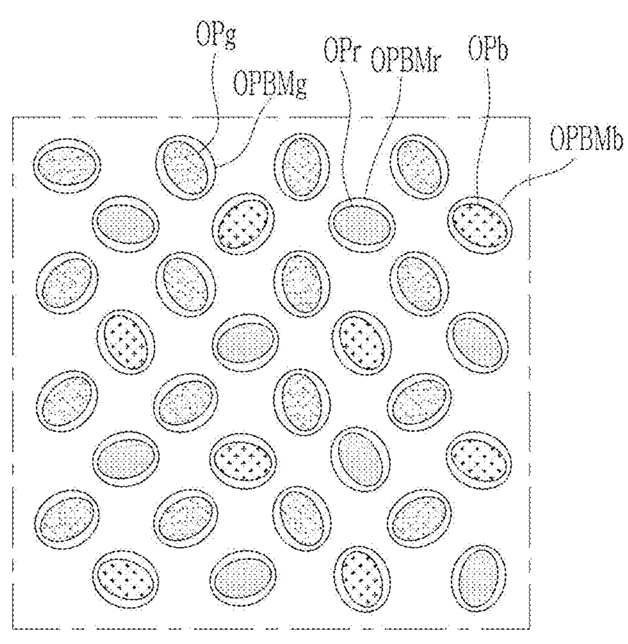
FIG. 15 to FIG. 17 are plan views of a portion of a display panel according to an embodiment.
Figure 15:
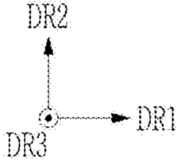
Figure 16:
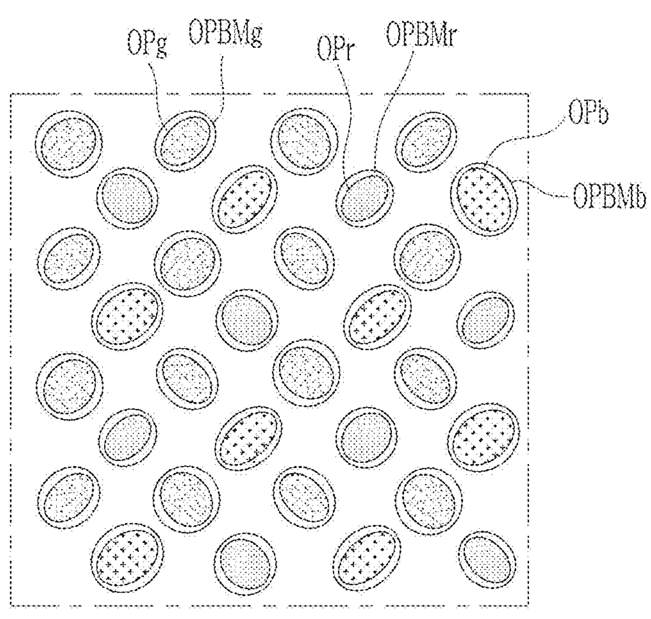
Figure 16:
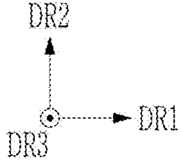
Figure 17:
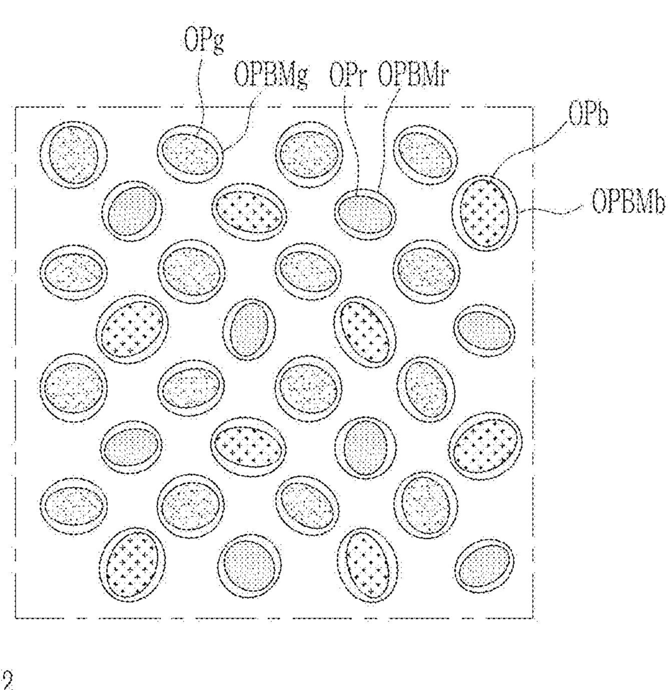
Figure 17:
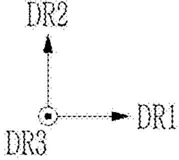

FIG. 15 to FIG. 17 are plan views of a portion of a display panel according to an embodiment.

FIG. 15 to FIG. 17 each show different embodiments, and FIG. 15 illustrates an embodiment in which the second opening OPBM of the light blocking layer 220 and the opening OP of the pixel defining layer 380 are arranged at various angles, and this is an example, FIG. 16 illustrates an embodiment in which the second opening OPBM of the light blocking layer 220 and the opening OP of the pixel defining layer 380 are formed at various eccentricities, and FIG. 17 illustrates the second opening OPBM of the light blocking layer 220, and this is an embodiment in which the second opening OPBM and the opening OP of the pixel defining layer 380 have various angles and are formed with various eccentricities.

In some aspects, in the embodiments of FIGS. 15 to 17, a unit pixel includes two light emitting areas of one color and a total of four light emitting areas.

Specifically, one unit pixel includes four adjacent light emitting areas, and the four light emitting areas include two light emitting areas of the first color among the three-color light emitting areas, while in the remaining light emitting areas of the second and third colors, each light emitting area may be included one at a time.

In the embodiment of FIGS. 15 to 17, among the four light emitting regions, two green light emitting regions are included, and one red light emitting region and one blue light emitting region are included.

Hereinafter, this embodiment is also referred to as a green divided unit pixel.

First, the planar structure of the openings OPr, OPg, OPb of the pixel defining layer 380 and the second openings OPBMr, OPBMg, OPBMb of the light blocking layer 220 will be examined in detail through FIG. 15.

In FIG. 15, the openings OPr, OPg, OPb of the pixel defining layer 380 and the second openings OPBMr, OPBMg, OPBMb of the light blocking layer 220 each have an oval planar shape with the same eccentricity.

That is, the red opening OPr, the green opening OPg, and the blue opening OPb of the pixel defining layer 380 may all be ellipses with the same eccentricity.

In some aspects, the red second opening OPBMr, the green second opening OPBMg, and the blue second opening OPBMb of the light blocking layer 220 may all be ellipses having the same eccentricity.

Here, the elliptical eccentricity of the openings OPr, OPg, OPb of the pixel defining layer 380 may range from 0.2 to 0.85, and the second openings OPBMr, OPBMg, OPBMb of the light blocking layer 220 may have a range of 0.2 to 0.85. The eccentricity of the oval shape may range from 0 to 0.84.

The openings OPr, OPg, OPb of one pixel defining layer 380 correspond to the second openings OPBMr, OPBMg, OPBMb of one light blocking layer 220.

That is, within each of the second openings OPBMr, OPBMg, OPBMb of the light blocking layer 220, there is an opening OPr, OPg, OPb of the pixel defining layer 380 corresponding to each of the second openings OPBMr, OPBMg, OPBMb of the light blocking layer 220.

The second opening OPBMr, OPBMg, OPBMb of each corresponding light blocking layer 220 and the opening OPr, OPg, OPb of the pixel defining layer 380 can overlap each other on a plane, and the major axis direction gap and the minor axis direction gap are different from each other, while the second opening OPBMr, OPBMg, OPBMb of the corresponding two light blocking layer 220 and the opening OPr, OPg, OPb of the pixel defining layer 380 can be formed at the same angle in the major axis direction of the ellipse shape.

Here, the openings OPr, OPg, OPb of the pixel defining layer 380 and the corresponding second openings OPBMr, OPBMg, OPBMb of the light blocking layer 220 may have different gaps in the major axis direction and minor axis direction on the plane, and in addition, the gap in the major axis direction on the plane may be formed to be smaller than the gap in the minor axis direction by a value ranging from 0.1 μm to 2.6 μm.

Based on the embodiment, each of the second openings OPBMr, OPBMg, OPBMb of the light blocking layer 220 has a major axis direction and a minor axis direction from each of the openings OPr, OPg, OPb of the corresponding pixel defining layer 380 on the plane, the horizontal gap in the diagonal direction may also have an irregular structure, and the openings OPr, OPg, OPb of the pixel defining layer 380 and the corresponding second openings OPBMr, OPBMg, OPBMb of the light blocking layer 220 may have an irregular structure, while the in-plane gap may have a horizontal gap ranging from 0 μm to 20 μm.

In some aspects, based on the embodiment, the horizontal gap may be changed depending on the thickness of the layer (e.g., encapsulation layer) located between the two in the cross-section, and the encapsulation layer may have a thickness of about 6 μm.

In some aspects, based on the embodiment, the major axis directions of the corresponding second openings OPBMr, OPBMg, OPBMb of the light blocking layer 220 and the openings OPr, OPg, OPb of the pixel defining layer 380 are constant due to process errors, etc., the major axis directions may form an angle, or an angle of 0 degrees or more and 20 degrees or less.

In the embodiment of FIG. 15, the pixel defining layer 380 can have angles formed by the major axes of multiple openings OPr, OPg, OPb with four or more angles, and also, the angles formed by the major axes can be arranged at intervals of less than or equal to 45 degrees.

As an example, looking at specific angle relationships focusing on an embodiment with five angles, the relationship is as follows.

In the embodiment with five angles, the angles of the major axis are formed at intervals of 36 degrees. For example, with respect to a major axis of 0 degrees based on the first direction DR1, the angles of 36 degrees, 72 degrees, 108 degrees, and 144 degrees are formed. A total of 5 angles are formed.

In other words, the distance between the angles of the major axis can be checked by dividing the angle of 180 degrees by 5, which is the number of directions, and this is because the two angles with an angle of 180 degrees out of 360 degrees have substantially the same direction of the major axis of the ellipse. This may mean calculating by dividing by the number based on 180 degrees.

In some embodiments, the plurality of second openings OPBMr, OPBMg, OPBMb of the light blocking layer 220 can have an angle of 4 degrees or more, and the angle formed by the major axis can be arranged at intervals of 45 degrees or less.

As described herein, the angle formed by the major axis of the plurality of openings OPr, OPg, OPb of the pixel defining layer 380 or the plurality of second openings OPBMr, OPBMg, OPBMb of the light blocking layer 220 is 45 degrees or less, they can be placed at equal intervals at an angle.

However, based on the embodiment, the angle formed by the major axis of each opening may be one of 45 degrees or less and may be arranged at irregular intervals.

The embodiment in which the major axis of the openings are arranged at non-equal intervals may be intentionally arranged to reduce the diffraction pattern, or may be arranged at non-equal intervals due to processing errors.

In order to make a pixel unit that includes openings of red, green, and blue have a square structure, it may be appropriate to form the angle of the major axis with the number of the square of an integer, such as, for example, $2^2$, $3^2$, $4^2$, $5^2$, etc.

Here, the unit pixel may include one each of red, green, and blue openings, and a plurality of openings of one color, for example, green openings, may be formed.

Figure 19:
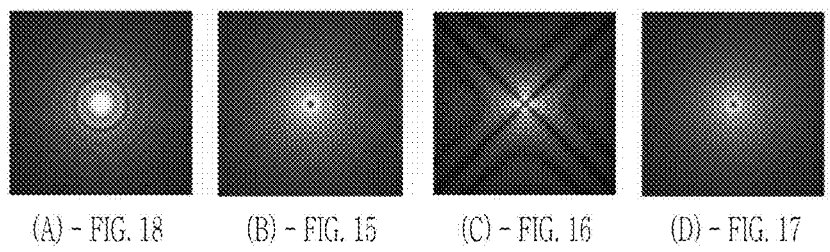
FIG. 19 is a photograph of the reflection characteristics of the comparative example and the examples of FIGS. 15 to 18.
Figure 20:
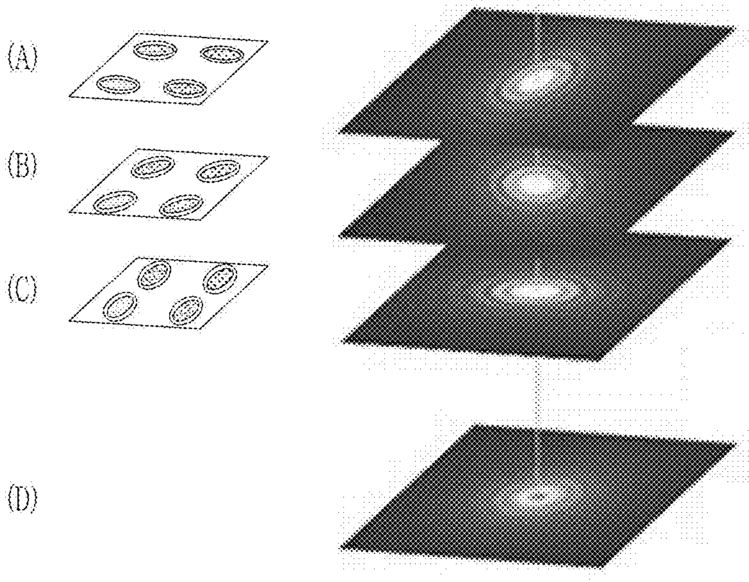
FIG. 20 is a diagram illustrating reflection characteristics of a light emitting display device depending on angle.

The plurality of openings OPr, OPg, OPb of the pixel defining layer 380 or the plurality of second openings OPBMr, OPBMg, OPBMb of the light blocking layer 220 have four or more or are spaced at an angle of 45 degrees or less, and when arranged, less color separation of external light occurs or a constant diffraction pattern or color separation occurs regardless of the angle, which will be examined in more detail in FIGS. 19 and 20.

In some embodiments, the following will look at the embodiment of FIG. 16.

FIG. 16 illustrates an embodiment in which the second openings OPBMr, OPBMg, OPBMb of the light blocking layer 220 and the openings OPr, OPg, OPb of the pixel defining layer 380 are formed in oval shapes with two or more different eccentricities.

Based on the embodiment, each opening of the same color may be formed into an oval shape with eccentricity of 2 or more.

Here, referring to FIG. 24, the eccentricity of the elliptical shape of the openings OPr, OPg, OPb of the pixel defining layer 380 may range from 0.2 to 0.85, and in the second opening of the light blocking layer 220, the eccentricity of the elliptical shape of the second openings OPBMr, OPBMg, OPBMb may range from 0 to 0.84.

In FIG. 16, the major axis direction of the ellipse has only two directions forming 45 degrees with respect to the first direction DR1 or the second direction DR2. In some aspects, based on the embodiment, unlike FIG. 15, the major axis direction may have four or fewer directions.

Through FIG. 16, the planar structures of the openings OPr, OPg, OPb of the pixel defining layer 380 and the second openings OPBMr, OPBMg, OPBMb of the light blocking layer 220 will be examined in detail.

In FIG. 16, the openings OPr, OPg, OPb of the pixel defining layer 380 and the second openings OPBMr, OPBMg, OPBMb of the light blocking layer 220 have an elliptical planar shape. In FIG. 16, the openings OPr, OPg, OPb of the pixel defining layer 380 and the second openings OPBMr, OPBMg, OPBMb are oriented in the first direction DR1 or the elliptical major axis directions are arranged only in two directions forming 45 degrees with respect to the second direction DR2.

In some embodiments, each of the red opening OPr, the green opening OPg, and the blue opening OPb of the pixel defining layer 380 may be formed as an ellipse with at least two different eccentricities.

In some aspects, the red second opening OPBMr, the green second opening OPBMg, and the blue second opening OPBMb of the light blocking layer 220 may each be formed as an ellipse having at least two different eccentricities.

In some aspects, in the embodiment of FIG. 16, the openings OPr, OPg, OPb of the pixel defining layer 380 of the same color may have an elliptical planar shape with at least two different eccentricities, and the same color light blocking the second openings OPBMr, OPBMg, OPBMb of the light blocking layer 220 may also have an oval planar shape with at least two different eccentricities.

The openings OPr, OPg, OPb of one pixel defining layer 380 correspond to the second openings OPBMr, OPBMg, OPBMb of one light blocking layer 220.

That is, within each of the second openings OPBMr, OPBMg, OPBMb of the light blocking layer 220, there is an opening of the pixel defining layer 380 corresponding to each of the second openings OPBMr, OPBMg, OPBMb of the light blocking layer 220 OPr, OPg, OPb.

The corresponding second openings OPBMr, OPBMg, OPBMb of the light blocking layer 220 and the corresponding openings OPr, OPg, OPb of the pixel defining layer 380 may overlap each other in a plane and have a constant horizontal distance from each other, and the major axis directions of the oval shape may be formed at the same angle.

Here, the openings OPr, OPg, OPb of the pixel defining layer 380 and the corresponding second openings OPBMr, OPBMg, OPBMb of the light blocking layer 220 may have different gaps in the major axis direction and minor axis direction on the plane. In some aspects, the gap in the major axis direction on the plane may be formed to be smaller than the gap in the minor axis direction by a value ranging from 0.1 μm to 2.6 μm.

Based on the embodiment, each of the second openings OPBMr, OPBMg, OPBMb of the light blocking layer 220 has a major axis direction and a minor axis direction from each of the openings OPr, OPg, OPb of the corresponding pixel defining layer 380 on the plane, the horizontal gap in the diagonal direction may also have an irregular structure, and the openings OPr, OPg, OPb of the pixel defining layer 380 and the corresponding second openings OPBMr, OPBMg, OPBMb of the light blocking layer 220 may have an irregular structure, and the in-plane gap may have a horizontal gap ranging from 0 μm to 20 μm.

Based on the embodiment, the horizontal gap may be changed depending on the thickness of the layer (e.g., encapsulation layer) located between the two in the cross-section.

In some aspects, based on the embodiment, the major axis directions of the corresponding second openings OPBMr, OPBMg, OPBMb of the light blocking layer 220 and the openings OPr, OPg, OPb of the pixel defining layer 380 are constant due to process errors, etc., the major axis directions can form an angle, or an angle of 0 degrees or more and 20 degrees or less.

In the embodiment of FIG. 16, two or more oval shapes, which are the same colored opening but have different eccentricities, may be placed in various positions at various proportions.

Based on the embodiment, the same number of oval shapes having different eccentricities may be included in the display area, and based on the embodiment, they may be included in different numbers.

In an example in which the red opening OPr of the pixel defining layer 380 is formed into two elliptical shapes having different eccentricities, the red second openings OPBMr of the corresponding light blocking layer 220 are also different from each other with different elliptical shapes having different eccentricities.

However, based on the embodiment, the red second opening OPBMr of the light blocking layer 220 may be formed with the same eccentricity.

Referring to FIG. 16, the angle formed by each major axis of the plurality of openings OPr, OPg, OPb of the pixel defining layer 380 or the plurality of second openings OPBMr, OPBMg, OPBMb of the light blocking layer 220 forms an angle of 45 degrees with respect to the first direction DR1 and the second direction DR2.

In an embodiment in which the eccentricity of the ellipse is formed in various ways, unlike FIG. 15, the number of angles formed by the major axis of the ellipse may be four or less.

That is, in the embodiment of FIG. 16, various elliptical shapes having different eccentricities are formed in order to reduce color separation of external light or to generate a constant diffraction pattern or color separation regardless of angle.

Therefore, the embodiment of FIG. 16 enables constant color separation and/or constant diffraction in a different manner from the embodiment of FIG. 15 in which the major axis direction of the ellipse is varied.

In some embodiments, in the embodiment of FIG. 16, the number of ellipses in the major axis direction is small, so a reflection diffraction pattern as illustrated in FIG. 19(C) can be generated, so a plurality of openings OPr, OPg, OPb of the pixel defining layer 380 or the directionality of the diffraction pattern may be reduced by forming one of the plurality of second openings OPBMr, OPBMg, OPBMb of the light blocking layer 220 in a circular shape or by increasing the number of major axis directions in an elliptical shape.

In some embodiments, the following will look at the embodiment of FIG. 17. The embodiment of FIG. 17 is an embodiment that combines the embodiment of FIG. 15 and the embodiment of FIG. 16.

In FIG. 17, the second openings OPBMr, OPBMg, OPBMb of the light blocking layer 220 and the openings OPr, OPg, OPb of the pixel defining layer 380 are formed in oval shapes having different eccentricities even for the same color, and the angle formed by the major axis of the second openings OPBMr, OPBMg, OPBMb of the light blocking layer 220 and the openings OPr, OPg, OPb of the pixel defining layer 380 have an angle of 4 degrees or more or the major axis has the angles formed to be arranged at intervals of less than 45 degrees.

Here, referring to FIG. 24, the eccentricity of the elliptical shape of the openings OPr, OPg, OPb of the pixel defining layer 380 may range from 0.2 to 0.85, and in the second opening of the light blocking layer 220, the eccentricity of the elliptical shape of the second openings OPBMr, OPBMg, OPBMb may range from 0 to 0.84.

The embodiment of FIG. 17 includes all the features of the embodiment of FIG. 15 and the embodiment of FIG. 16, including a plurality of openings OPr, OPg, OPb of the pixel defining layer 380 and a plurality of openings of the light blocking layer 220. By having 4 or more second openings OPBMr, OPBMg, OPBMb or arranging them at an angle of 45 degrees or less, the eccentricity of the ellipse is additionally formed in various ways to reduce color separation of external light or to maintain a constant color regardless of the angle causes diffraction patterns or color separation to occur.

Based on the embodiment, since the major axis directions of the plurality of openings OPr, OPg, OPb of the pixel defining layer 380 or the plurality of second openings OPBMr, OPBMg, OPBMb of the light blocking layer 220 are formed at equal intervals, or at non-equal intervals.

A rough comparison of the embodiments of FIGS. 15 to 17 may be as illustrated in Table 1 below.

Firstly, looking at the comparative example of FIG. 19(A), the diffraction pattern is formed in a ring shape (expressed another way, is a ring shape), forming a diffraction pattern that is independent of the angle, however, multiple rings are formed, and each ring represents a different color, so it can be confirmed that the reflected light is color-separated.

In contrast, referring to FIGS. 19(B) and 19(D), the diffraction pattern has no directionality, so a diffraction pattern is independent of the angle, and the ring shape is not recognized and appears white overall, so no specific color separation occurs.

In some embodiments, in FIG. 19(C), the diffraction pattern has a linear pattern at an angle of 45 degrees, forming a diffraction pattern according to the angle, and this is caused by arranging the major axis angle of the ellipse only at 45 degrees, so some of the openings are circular, and the diffraction characteristics depending on the angle can be reduced by forming or increasing the direction of the major axis of the ellipse.

TABLE 1

| | FIG. 15 embodiment | FIG. 16 embodiment | FIG. 17 embodiment |
|---|---|---|---|
| pixel defining layer eccentricity of the opening ellipse | red, green, blue same eccentricity | eccentricity of 2 or more different eccentricities by color openings of the same color with different eccentricity (circles with zero eccentricity are also possible) | eccentricity of 2 or more different eccentricities by color openings of the same color with different eccentricity (circles with zero eccentricity are also possible) |
| pixel defining layer opening area(aperture ratio) | same | area varies with eccentricity | area varies with eccentricity |
| arrange ratio | evenly arrange | same or different total number of ellipses with different eccentricity | same or different total number of ellipses with different eccentricity |
| pixel defining layer opening ellipse major axis angle | 4 or more angles | 2 of 45° degrees (4 or fewer angles are possible) | can be positioned at 4 or more angles |
| second opening of the light blocking layer ellipse shape | pixel defining layer formed by offsetting the major axis direction distance in the opening such that it is narrower than the minor axis direction distance | pixel defining layer formed by offsetting the major axis direction distance in the opening such that it is narrower than the minor axis direction distance | pixel defining layer formed by offsetting the major axis direction distance in the opening such that it is narrower than the minor axis direction distance |

Figure 18:
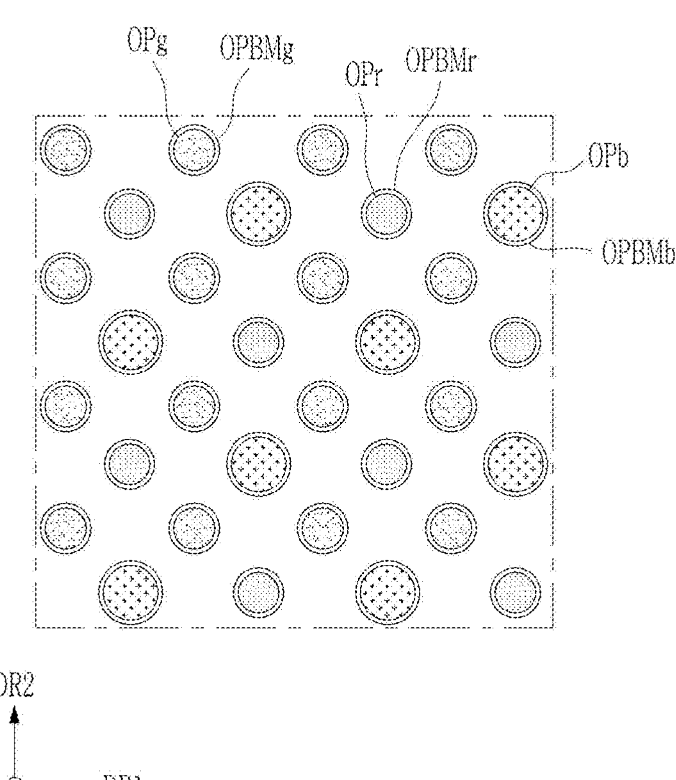
FIG. 18 is a plan view of a portion of a display panel according to a comparative example.

In order to examine the characteristics of the above-mentioned embodiment, the comparative example of FIG. 18 is examined, and the diffraction characteristics and color dispersion characteristics of reflected light between the comparative example and the example are compared and examined through FIG. 19.

FIG. 18 is a plan view of a portion of the display panel according to the comparative example, and FIG. 19 is a photograph of reflection characteristics of the comparative example and the examples of FIGS. 15 to 18.

In the comparative example of FIG. 18, unlike the embodiments of FIGS. 15 to 17, the second openings OPBMr, OPBMg, OPBMb of the light blocking layer 220 and the openings OPr, OPg, OPb of the pixel defining layer 380 are all circular shaped.

In some embodiments, FIG. 19 illustrates the diffraction pattern and color dispersion of reflected light for the examples of FIGS. 15 to 17 and the comparative example of FIG. 18, with FIG. 19(A) being the comparative example of FIG. 18 and FIG. 19(B) is the embodiment of FIG. 15, FIG. 19(C) is the embodiment of FIG. 16, and FIG. 19(D) is the embodiment of FIG. 17.

Below, characteristics according to the major axis angle are described with reference to FIG. 20 to FIG. 22.

First, the relationship between the major axis angle of the ellipse and the direction of the diffraction pattern of reflected light is described with reference to FIG. 20.

FIG. 20 is a diagram illustrating reflection characteristics of a light emitting display device depending on angle.

The left side of FIGS. 20(A), (B), and (C) illustrates a structure in which the opening of the pixel defining layer 380 and the opening of the light blocking layer 220 are arranged in the same direction, and on the right side, the resulting reflection is illustrated.

Referring to FIG. 20, for a case in which the opening of the pixel defining layer 380 and the opening of the light blocking layer 220 have an elliptical shape, the diffraction pattern of the reflected light is also formed in an elliptical shape, but the major axis directions may be different.

That is, the major axis direction of the opening of the pixel defining layer 380 and the opening of the light blocking layer 220 and the major axis direction of the elliptical pattern of the diffraction pattern of the reflected light may be perpendicular to each other.

When the diffraction patterns (A), (B), and (C) on the right side of FIG. 20 are combined, the combined diffraction pattern becomes a circular diffraction pattern as illustrated in FIG. 20(D) below, illustrating that it is possible to have a diffraction pattern that is independent of the angle.

Hereinafter, through FIGS. 21 and 22, an example is described with reference to a number of elliptical structures arranged at various angles in association with forming a diffraction pattern that is independent of the angle.

Figure 21:
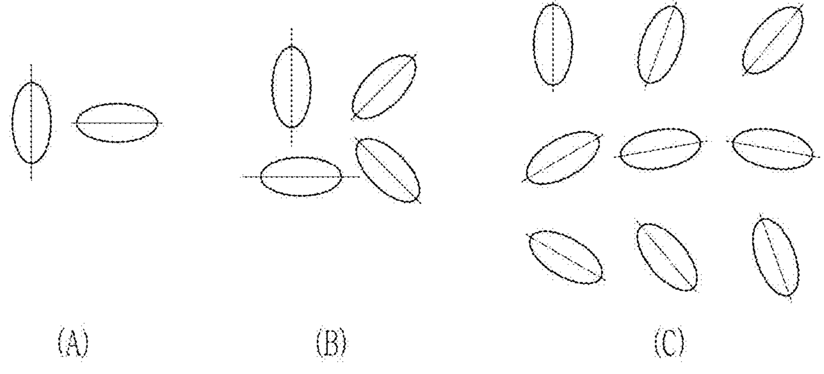
FIG. 21 is a diagram illustrating various angle arrangements according to an embodiment.
Figure 21:
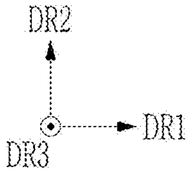
Figure 22:
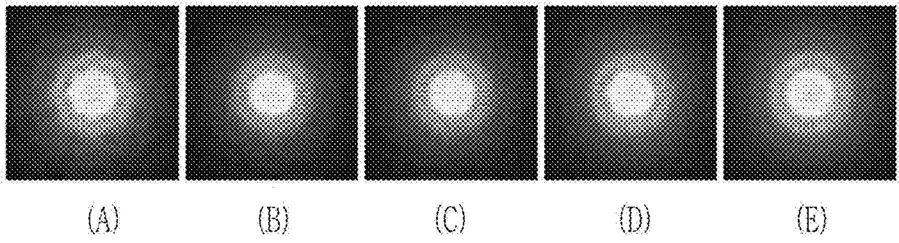
FIG. 22 is a photograph of reflection characteristics according to angle.

FIG. 21 is a diagram illustrating various angle arrangements according to an embodiment, and FIG. 22 is a photograph of reflection characteristics according to angle.

First, FIG. 21 illustrates the major axis directions of one set of ellipses that can be formed in one display area.

In FIG. 21(A), the opening OP of the pixel defining layer 380 or the second opening OPBM of the light blocking layer 220 has two major axis directions, and the two major axis are spaced at an angle of 90 degrees, so an example in which directions are arranged is illustrated.

In FIG. 21(B), the opening OP of the pixel defining layer 380 or the second opening OPBM of the light blocking layer 220 has four major axis directions, with four major axes spaced at an angle of 45 degrees, so an example in which directions are arranged is illustrated.

In FIG. 21(C), the opening OP of the pixel defining layer 380 or the second opening OPBM of the light blocking layer 220 has nine major axes directions, with nine major axes at intervals of 20 degrees, so an example in which directions are arranged is illustrated.

In addition to illustrated in FIG. 21, the major axis direction can be formed in various major axis directions arranged at various angles, and if the number of major axis directions is small, differences in the diffraction pattern depending on the angle occur as illustrated in FIG. 19(C), and the number of the major axis angles may be a certain number or more.

To confirm this, FIG. 22 illustrates diffraction patterns according to the number of various major axis directions.

FIG. 22(A) is a diffraction pattern of an example with 4 major axis angles as in FIG. 21(B), FIG. 22(B) is a diffraction pattern of an example with 5 major axis angles, FIG. 22(C) is a diffraction pattern of an example with 5 major axis angles, FIG. 22(D) is a diffraction pattern of an example with 7 major axis angles, and FIG. 22(E) is a diffraction pattern of an example with 8 major axis angles.

In order to have a diffraction pattern that is independent of direction in FIG. 22, example embodiments of the present disclosure may have a diffraction pattern close to a circular shape, and in FIG. 22(A), the diffraction pattern has a protruding shape, so it can be seen that there are differences in diffraction characteristics and color separation depending on the direction.

However, compared to the comparative example of FIG. 19(A), the diffraction pattern is not clear, so the diffraction pattern is not clearly visible compared to the comparative example.

In some embodiments, FIG. 22(B) to 22(E) have a circular diffraction pattern and have direction-independent diffraction characteristics and color separation.

Therefore, based on FIG. 22, if the opening OP of the pixel defining layer 380 or the second opening OPBM of the light blocking layer 220 is formed to have four or more major axis angles (also referred to herein as angles with reference to a major axis), constant diffraction occurs regardless of the angle, so pattern or color separation may occur and display quality may be improved.

Referring to the above, the light blocking layer 220 may have four or more major axis angles, and in an embodiment having four or more major axis angles, the major axis angles may be arranged at intervals of 45 degrees or less. Expressed another way, the major axis angles may be 45 degrees or less.

In the above, examples of the angles and number of angles between the angles of the major axis of the oval were described.

Below, with reference to FIGS. 23 and 24, changes in reflection characteristics according to changes in the eccentricity of the ellipse are described.

Figure 23:
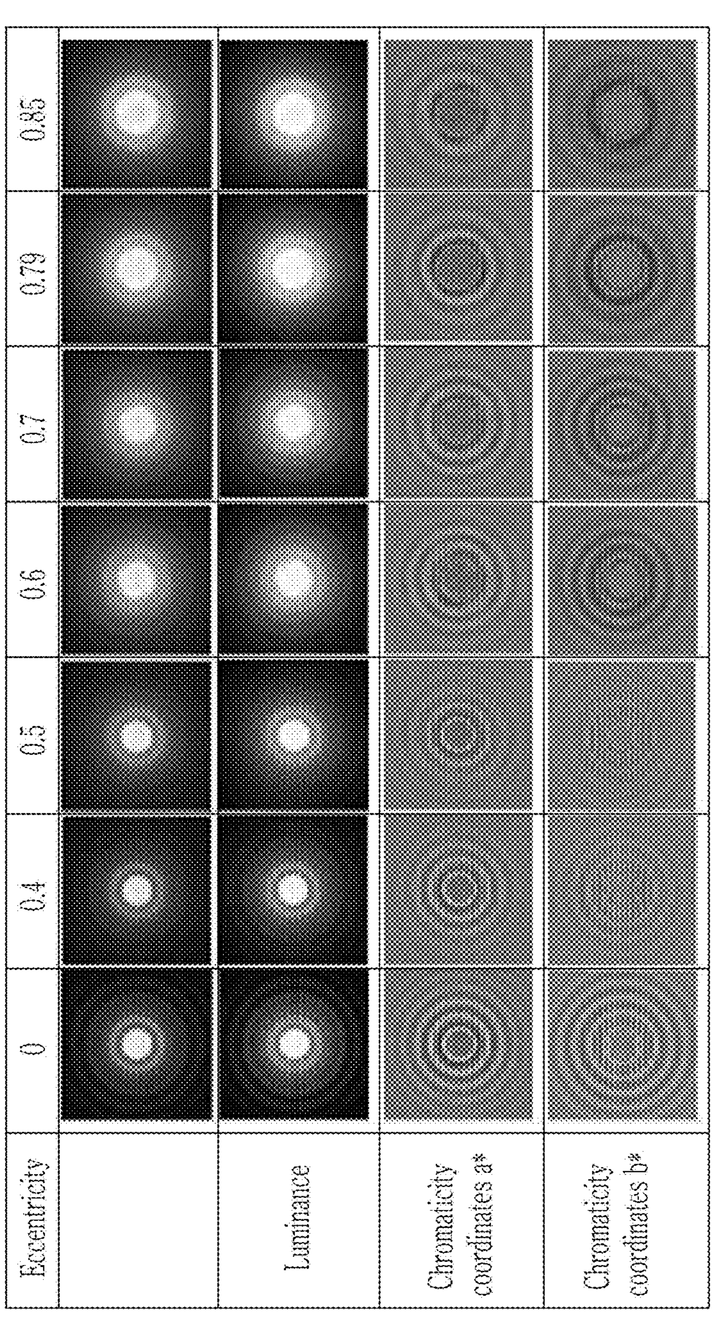
FIGS. 23 and 24 are diagrams illustrating reflection characteristics according to eccentricity.

FIGS. 23 and 24 are diagrams illustrating reflection characteristics according to eccentricity.

FIG. 23 illustrates a diagram in which the distribution of the luminance distribution and the color coordinates of the two axes are extracted for the color diffraction pattern of the reflected light according to the eccentricity value of the opening OP of the pixel defining layer 380, and based on this in FIG. 24, the standard deviation value of luminance and the distance value in color coordinates are illustrated in a graph based on the eccentricity of the opening OP of the pixel defining layer 380.

In FIGS. 23 and 24, the smaller the distance value on the luminance distribution and color coordinates, the weaker the diffraction is recognized.

In FIG. 24, the position where the distance value on the luminance scale or color coordinates is the smallest is indicated by an arrow.

Referring to FIGS. 23 and 24, when the eccentricity is 0.5, luminance distribution value is the smallest and is for the best embodiment even considering color coordinate distribution.

In some aspects, referring to FIG. 24, it is determined that in the area partitioned by the dotted line, i.e., in the range of 0.2 to 0.85, the luminance dispersion and color coordinate dispersion do not significantly degrade the display quality, therefore, an ellipse with such a range of eccentricity can be applied in this embodiment.

According to the above content, the eccentricity of the elliptical shape of the opening OPr, OPg, OPb of the pixel defining layer 380 can have a range of 0.2 to 0.85, and referring to FIG. 13, the eccentricity of the elliptical shape of the second opening OPBMr, OPBMg, OPBMb of the light blocking layer 220 can have a range of 0 to 0.84.

In the above, an embodiment in which the opening OP of the pixel defining layer 380 or the second opening OPBM of the light blocking layer 220 has one eccentricity was examined.

Figure 25:
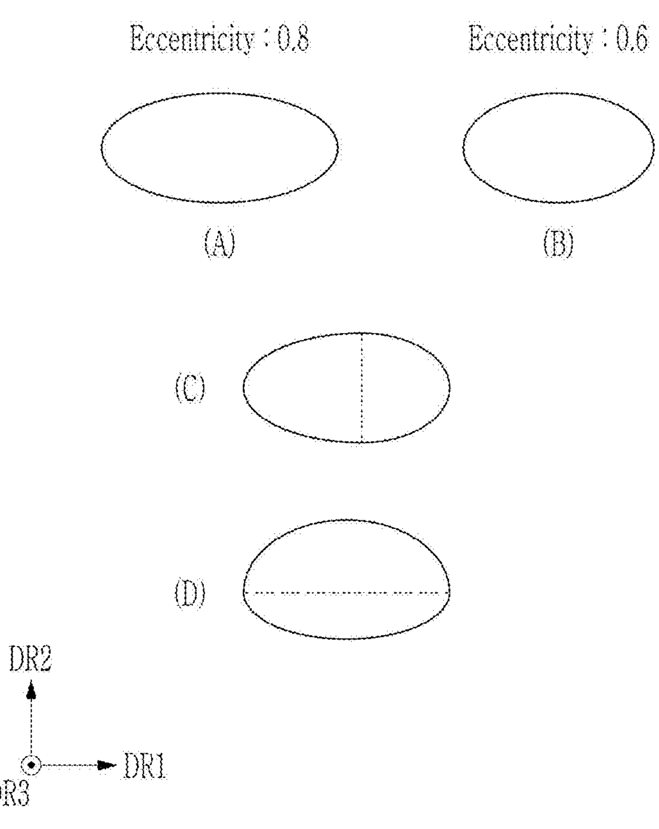
FIGS. 25 and 26 are diagrams illustrating a structure combining ellipses having different eccentricities.
Figure 26:
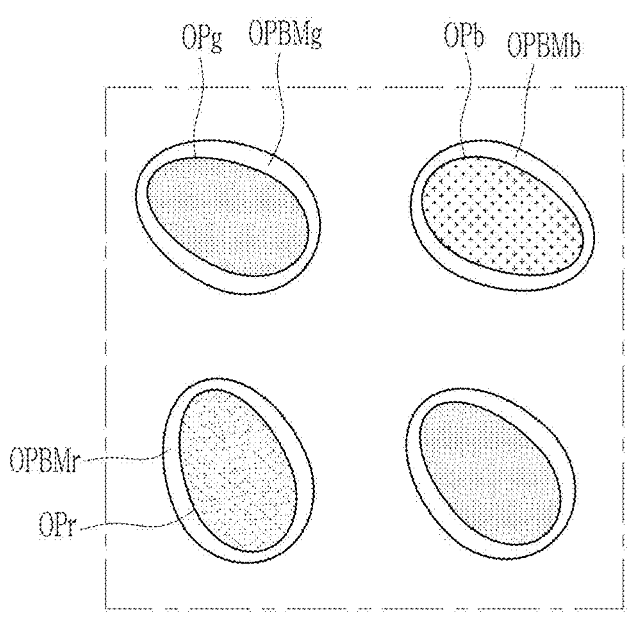
Figure 26:
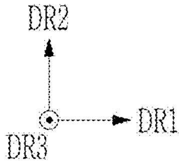

Based on the embodiment, at least two elliptical shapes having different eccentricities may be merged to form an opening OP of one pixel defining layer 380 or a second opening OPBM of the light blocking layer 220, and this will be examined in detail through FIGS. 25 and 26.

FIGS. 25 and 26 are diagrams illustrating a structure combining ellipses having different eccentricities.

In FIG. 25, an example of merging two or more ellipse shapes having different eccentricities is examined in detail.

In FIG. 25(A) and FIG. 25(B), ellipses having different eccentricities are illustrated, and in FIGS. 25(C) and 25(D), ellipses formed by merging two ellipses having different eccentricities in different ways are illustrated.

In FIG. 25(A), an ellipse with eccentricity of 0.8 is illustrated, and in FIG. 25(B), an ellipse shape with eccentricity of 0.6 is illustrated.

An ellipse that merges these two ellipses may have a shape as illustrated at FIG. 25(C) or FIG. 25(D).

In FIG. 25(C) and FIG. 25(D), a dotted line is illustrated within the merged elliptical shape, and the ovals on both sides of the dotted line are parts of ellipses having different eccentricities.

In other words, FIG. 25(C) is an example of combining the ellipses of FIG. 25 (A) and FIG. 25(B) after cutting them along the second direction DR2, and FIG. 25(D) is an example of combining the ellipses of FIG. 25(A) and FIG. 25(B) after cutting them along the first direction DR1.

The method of combining two ellipses having different eccentricities is not limited to this and can be combined in various ways.

An arranged example of the second openings OPBMr, OPBMg, OPBMb of the light blocking layer 220 and the openings OPr, OPg, OPBMb of the light blocking layer 220 having the merged elliptical shape of FIG. 25(C) is illustrated in FIG. 18.

In the embodiment of FIG. 26, only one unit pixel is illustrated, and one unit pixel includes one red opening OPr, OPBMr, one blue opening OPb, OPBMb, and two green openings OPg, OPBMg.

In the embodiment of FIG. 26, the major axis direction of each opening OPr, OPg, OPb of the pixel defining layer 380 can be different from each other, and the major axis direction of each second opening OPBMr, OPBMg, OPBMb of the light blocking layer 220 can also be different from each other.

As illustrated in FIG. 15, the embodiment using an ellipse that is a combination of two ellipses having different eccentricities as illustrated in FIG. 26 also uses the openings OPr, OPg, OPb of the pixel defining layer 380 and the second opening of the light blocking layer 220, the angles formed by each major axis of the second openings OPBMr, OPBMg, OPBMb may have four or more angles, and the angles formed by the major axis may be arranged at intervals of 45 degrees or less.

In some aspects, the eccentricities of the two ellipses used for merging may vary, so the size of the merged ellipses may also vary.

In some aspects, based on the embodiment, two ovals having different eccentricities for each color can be combined, and even if they are the same color, two ovals having different eccentricities can be combined to form various ellipses.

Here, referring to FIG. 24, the elliptical eccentricity of the openings OPr, OPg, OPb of the pixel defining layer 380 may range from 0.2 to 0.85, and in the second opening OPBMr, OPBMg, OPBMb of the light blocking layer 220, the eccentricity of the elliptical shape may range from more than 0 to 0.84 or less.

The major axis direction of the openings OPr, OPg, OPb of the pixel defining layer 380 and the corresponding second openings OPBMr, OPBMg, OPBMb of the light blocking layer 220 can be the same or form an angle of 20 degrees or less due to process errors and the like.

In some embodiments, the openings OPr, OPg, OPb of the pixel defining layer 380 and the corresponding second openings OPBMr, OPBMg, OPBMb of the light blocking layer 220 may have different gaps in the major axis direction and the minor axis direction on the plane, and in addition, the gap in the major axis direction on the plane may be formed to be smaller than the gap in the minor axis direction by a value ranging from 0.1 μm to 2.6 μm.

Based on the embodiment, each of the second openings OPBMr, OPBMg, OPBMb of the light blocking layer 220 has a major axis direction and a minor axis direction from each of the openings OPr, OPg, OPb of the corresponding pixel defining layer 380 on the plane, the horizontal gap in the diagonal direction may also have an irregular structure, and the openings OPr, OPg, OPb of the pixel defining layer 380 and the corresponding second openings OPBMr, OPBMg, OPBMb of the light blocking layer 220 may have an irregular structure, while the in-plane gap may have a horizontal gap of ranging from 0 μm to 20 μm.

In the embodiments of FIGS. 25 and 26, the embodiments of merging two different elliptical shapes are illustrated and explained.

However, based on the embodiment, it is possible to merge two or more oval shapes having different eccentricities.

As above, an embodiment that combines two or more elliptical shapes can have a blurred diffraction characteristic due to various angles or various eccentricities, making the ring shape less distinct and making it difficult for users to easily recognize color separation, and thus, the embodiment can have improved display quality compared to the comparative example.

In some aspects, the elliptical shape of the openings OPr, OPg, OPb of the pixel defining layer 380 and the corresponding elliptical shape of the second openings OPBMr, OPBMg, OPBMb of the light blocking layer 220 are in the major axis direction on the plane, the gap is formed to be smaller than the gap in the minor axis direction, and the gap in the direction may not be constant.

In some embodiments, according to the embodiment, the number of elliptical shapes combined in the elliptical shape of the opening OPr, OPg, OPb of the pixel defining layer 380 and its eccentricity may be different from the number of elliptical shapes combined in the elliptical shape of the second opening OPBMr, OPBMg, OPBMb of the light blocking layer 220 corresponding thereto and its eccentricity.

Figure 27:
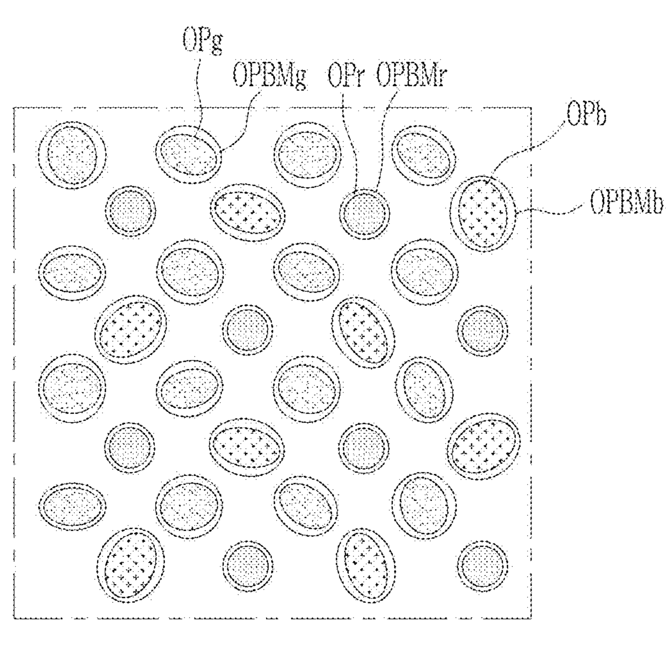
FIG. 27 is a plan view of a portion of a display panel according to another embodiment.
Figure 27:
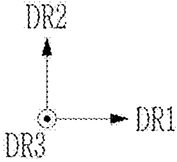

In some aspects, based on the embodiment, the openings of some colors may have a circular shape rather than an oval shape, and this embodiment will be examined with reference to FIG. 27.

FIG. 27 is a plan view of a portion of a display panel according to another embodiment.

FIG. 27 is based on the embodiment of FIG. 17, in which the red opening OPr of the pixel defining layer 380 and the red second opening OPBMr of the light blocking layer 220 are circular rather than oval (eccentricity is the point having 0) which is different from FIG. 17.

In other words, the green opening OPg and the blue opening OPb of the pixel defining layer 380, and the green second opening OPBMg and the blue second opening OPBMb of the light blocking layer 220, all have an elliptical shape. The difference between the major axis direction gap and the minor axis direction gap between the opening OPg, OPb of the pixel defining layer 380 and the second opening OPBMg, OPBMb of the light blocking layer 220 ranges from 0.1 μm to 2.6 μm.

In some aspects, the eccentricity of the openings OPg, OPb of the pixel defining layer 380 may range from 0.2 to 0.85, and the eccentricity of the second openings OPBMg, OPBMb of the light blocking layer 220 may range from 0 to 0.84.

In some aspects, based on the embodiment, one color in addition to red among the three-color openings may have a circular shape.

In other words, according to the embodiment, one or two of the red opening OPr, the green opening OPg, and the blue opening OPb of the pixel defining layer 380 can have a circular shape, and the rest can have an elliptical shape.

When the openings OPr, OPg, OPb of the pixel defining layer 380 have a circular shape, the second openings OPBMr, OPBMg, OPBMb of the corresponding light blocking layer 220 also have a circular shape, and the corresponding openings OPr, OPg, OPb of the pixel defining layer 380 and the second openings OPBMr, OPBMg, OPBMb of the light blocking layer 220 may be disposed at constant horizontal gaps.

In FIG. 27, similar to the embodiment of FIG. 17, the second openings OPBMr, OPBMg, OPBMb of the light blocking layer 220 and the openings OPr, OPg, OPb of the pixel defining layer 380 have an oval shape, the branched openings are formed in oval shapes having different eccentricities even for the same color, and include the second openings OPBMr, OPBMg, OPBMb of the light blocking layer 220 and the openings OPr, OPg, OPb of the pixel defining layer 380, and openings having a medium oval shape may be arranged at intervals where the angle formed by each major axis has four or more angles or the angle formed by the major axis is less than 45 degrees.

Based on the embodiment, among the plurality of openings OPr, OPg, OPb of the pixel defining layer 380 or the plurality of second openings OPBMr, OPBMg, OPBMb of the light blocking layer 220, the major axis are spaced at equal intervals, or at non-equal intervals.

In the embodiment of FIG. 27, at least one pair of the plurality of openings OPr, OPg, OPb of the pixel defining layer 380 and the plurality of second openings OPBMr, OPBMg, OPBMb of the light blocking layer 220 have an elliptical shape as in the embodiment of FIG. 7, and the distance in the major axis direction is formed to be smaller than the distance in the minor axis direction.

As a result, as described herein, even a high-resolution light emitting display device can have the advantage of less color separation of external light or a constant diffraction pattern or color separation regardless of angle.

In some embodiments, the embodiment of FIG. 27 is an example in which the elliptical shape for one or two colors of the embodiments of FIG. 17 is changed to a circular shape, however, in the embodiments of FIG. 15 or FIG. 16, the elliptical shape for one or two colors can also be changed to a circular shape.

In some aspects, in the embodiment of FIG. 26, the oval shape can be changed to a circle shape for one or two colors.

In some embodiments, hereinafter, another modified embodiment will be described with reference to FIG. 28.

Figure 28:
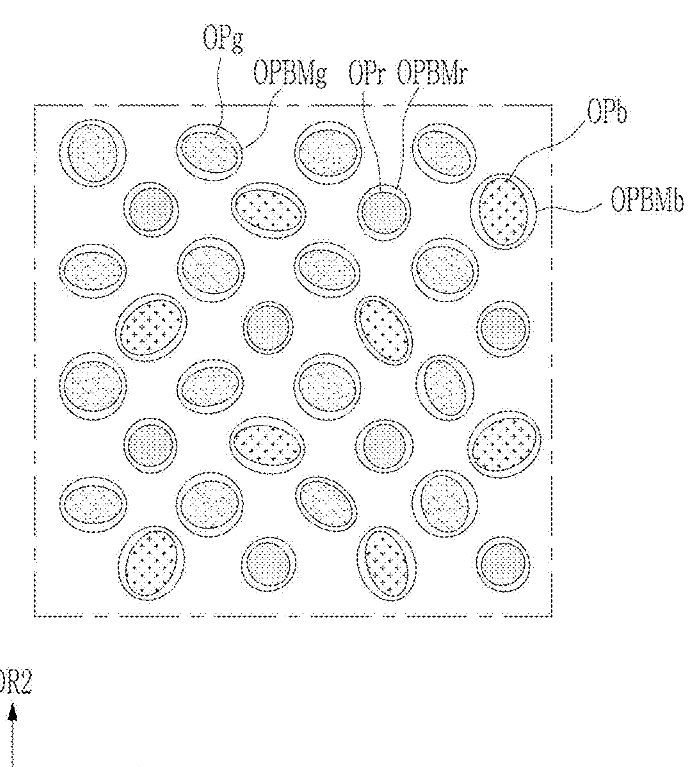
FIG. 28 is a plan view of a portion of a display panel according to another embodiment.

FIG. 28 is a plan view of a portion of a display panel according to another embodiment.

In FIG. 28, unlike the embodiment of FIG. 27 where the opening is formed in a circular shape (expressed another way, is a circular shape), the opening is formed in an elliptical shape, and an embodiment is illustrated where the eccentricity of the ellipse is not the eccentricity (0.2 to 0.85) limited in the above, but the eccentricity (ranging from 0 to 0.2) is formed.

That is, FIG. 28 is a modified example of FIG. 27, in which the two red openings OPr, OPBMr in FIG. 27 are transformed into ellipses with an eccentricity ranging from 0 to 0.2 instead of the circular shapes.

Specifically, the embodiment of FIG. 28 is based on the embodiment of FIG. 17, and the difference from FIG. 17 is that the red opening OPr of the pixel defining layer 380 and the red second opening OPBMr of the light blocking layer 220 has eccentricity of exceed 0 and less than 0.2.

In other words, the green opening OPg and the blue opening OPb of the pixel defining layer 380 and the green second opening OPBMg and blue second opening OPBMb of the light blocking layer 220 all have an elliptical shape with eccentricity of 0.2 to 0.85. The difference in the major axis direction gap and the minor axis direction gap between the opening OPg, OPb of the pixel defining layer 380 and the second opening OPBMg, OPBMb of the light blocking layer 220 is formed to be 0.1 μm or more and 2.6 μm or less.

In some aspects, the eccentricity of the opening OPg, OPb of the pixel defining layer 380 can have a value ranging from 0.2 to 0.85, and the eccentricity of the second opening OPBMg, OPBMb of the light blocking layer 220 can have a value ranging from 0 to 0.84.

In some embodiments, the difference between the gap in the major axis direction and the gap in the minor axis direction between the red opening OPr of the pixel defining layer 380 and the red second opening OPBMr of the light blocking layer 220 ranges from 0.1 μm to 2.6 μm, or have a constant horizontal gap in all directions.

In some aspects, based on the embodiment, one additional color in addition to red among the three color openings may have an oval shape having an eccentricity ranging from 0 to 0.2.

That is, based on the embodiment, one or two of the red opening OPr, the green opening OPg, and the blue opening OPb of the pixel defining layer 380 has an elliptical shape having an eccentricity ranging from 0 to 0.2, and the remaining opening(s) may have an elliptical shape with eccentricity ranging from 0.2 to 0.85.

In some aspects, the red second opening OPBMr, green second opening OPBMg, and blue second opening OPBMb of the light blocking layer 220 can have shapes corresponding to the plane shapes of the red opening OPr, the green opening OPg, and the blue opening OPb of the corresponding pixel defining layer 380, respectively.

The second openings OPBMr, OPBMg, OPBMb of the light blocking layer 220 corresponding to the openings OPr, OPg, OPb of the pixel defining layer 380 with eccentricity ranging from 0.2 to 0.85 have the difference between the gap in the major axis direction and the gap in the minor axis direction ranging from 0.1 μm to 2.6 μm, or have the eccentricity ranging from 0 to 0.84.

In some embodiments, among the openings OPr, OPg, OPb of the pixel defining layer 380, the second openings OPBMr, OPBMg, OPBMb of the light blocking layer 220 corresponding to the openings having an eccentricity ranging from 0 to 0.2 are spaced in the major axis direction. The difference between the gap in the minor axis direction may have a value ranging from 0.1 μm to 2.6 μm, or the gap in the major axis direction and the gap in the minor axis direction may be formed to be constant.

At this time, the openings OPr, OPg, OPb of the pixel defining layer 380 and the corresponding second openings OPBMr, OPBMg, OPBMb of the light blocking layer 220 have the same oval-shaped major axis direction. Due to process errors, etc., the angle may range from 0 degrees to 20 degrees.

In FIG. 28, as in the embodiment of FIG. 17, the second openings OPBMr, OPBMg, OPBMb of the light blocking layer 220 and the openings OPr, OPg, OPb of the pixel defining layer 380 are of the same color. They are also formed in oval shapes having different eccentricities, and the second openings OPBMr, OPBMg, OPBMb of the light blocking layer 220 and the openings OPr, OPg, OPb of the pixel defining layer 380 are formed by their respective major axis, and the angle may have four or more angles or the angle formed by the major axis may be arranged at intervals of less than 45 degrees.

Based on the embodiment, among the plurality of openings OPr, OPg, OPb of the pixel defining layer 380 or the plurality of second openings OPBMr, OPBMg, OPBMb of the light blocking layer 220, the major axis are spaced at equal intervals, and may be formed at regular intervals or at non-equal intervals.

In the embodiment of FIG. 28, at least one of the plurality of openings OPr, OPg, OPb of the pixel defining layer 380 and the plurality of second openings OPBMr, OPBMg, OPBMb of the light blocking layer 220 has an oval shape as illustrated in FIG. 7, and the major axis direction gap is smaller than the minor axis direction gap.

As a result, as described herein, even a high-resolution light emitting display device can have the advantage of less color separation of external light or a constant diffraction pattern or color separation regardless of angle.

In some embodiments, the embodiment of FIG. 28 is an embodiment in which the elliptical shape for one or two colors of the embodiment of FIG. 17 is changed to an elliptical shape having an eccentricity ranging from 0 to 0.2, but also in the embodiment of FIG. 15 or 16, alternatively, for two colors, the oval shape can be changed to an oval shape with eccentricity between 0 and less than 0.2.

Furthermore, in the embodiment of FIG. 26, the elliptical shape for one or two colors can be changed to an elliptical shape having an eccentricity ranging from 0 to 0.2.

Below, the structure of one unit pixel with another arrangement is described with reference to FIG. 29.

Figure 29:
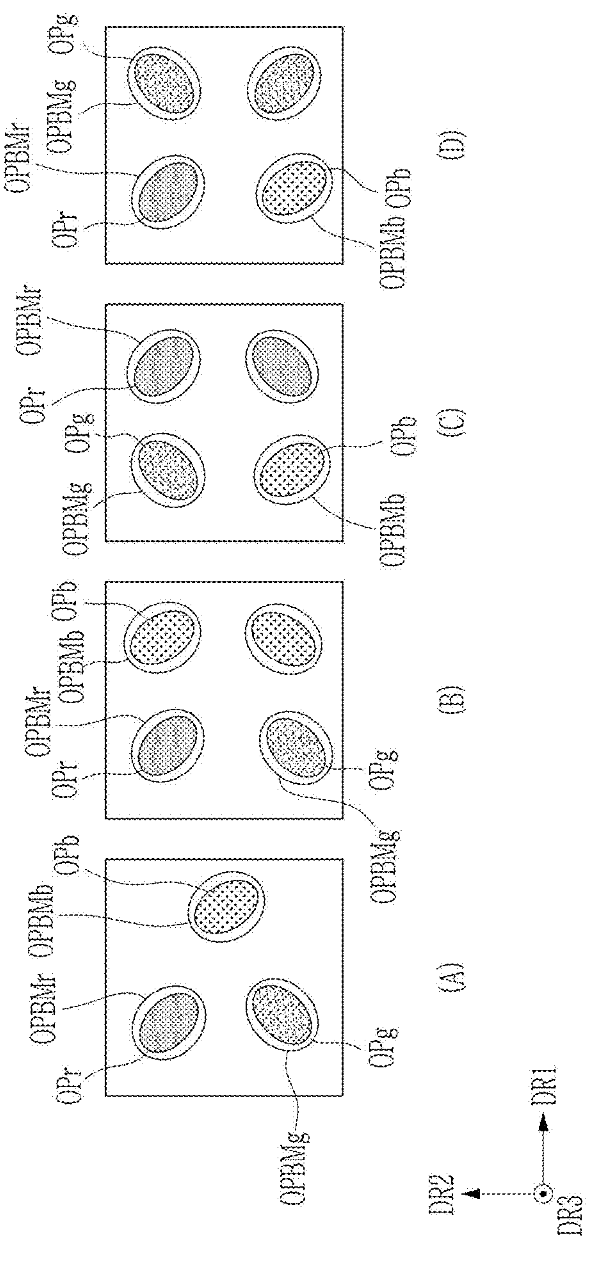
FIG. 29 is a plan view illustrating the configuration of a unit pixel of one of the display panels according to an embodiment.

FIG. 29 is a plan view illustrating the configuration of a unit pixel of one of the display panels according to an embodiment.

FIG. 29(A) illustrates an example in which a unit pixel is formed by including red, green, and blue light emitting areas.

Specifically, the red opening OPr, the green opening OPg, and the blue opening OPb of the pixel defining layer 380, and the red second opening OPBMr, the green second opening OPBMg, and a blue second opening OPBMb of the light blocking layer 220, are each included in a unit pixel.

However, according to the embodiment, a unit pixel may include a total of four light emitting areas, including two of a single color, as in FIGS. 29(B), 29(C), and 29(D).

FIG. 29(B) illustrates a unit pixel containing two blue light emitting areas, FIG. 29(C) illustrates a unit pixel containing two red light emitting areas, and FIG. 29(D) illustrates a unit pixel containing two red light emitting areas, and a unit pixel containing two green light emitting areas is illustrated.

Specifically, the unit pixel in FIG. 29(B) includes two blue openings OPb of the pixel defining layer 380 and two blue second openings OPBMb of the light blocking layer 220.

At this time, the two blue openings OPb of the pixel defining layer 380 and the two blue second openings OPBMb of the light blocking layer 220 may have different eccentricities and the directions of their major axis may also be different.

In some aspects, the unit pixel in FIG. 29(C) includes two red openings OPr of the pixel defining layer 380 and two red second openings OPBMr of the light blocking layer 220.

At this time, the two red openings OPr of the pixel defining layer 380 and the two red second openings OPBMr of the light blocking layer 220 may have different eccentricities and the directions of their major axis may also be different.

In some embodiments, the unit pixel in FIG. 29(D) includes two green openings OPg of the pixel defining layer 380 and two green second openings OPBMg of the light blocking layer 220.

At this time, the two green openings OPg of the pixel defining layer 380 and the two green second openings OPBMg of the light blocking layer 220 may have different eccentricities and the directions of their major axis may also be different.

Each pixel unit of degree 29 can apply various embodiments of the pixel defining layer 380 previously described, with multiple openings OPr, OPg, OPb and multiple second openings OPBMr, OPBMg, OPBMb of the light blocking layer 220 or its variations.

Based on the embodiment of FIG. 7 above, the opening OP of the pixel defining layer 380 and the second opening OPBM of the light blocking layer 220 each have an elliptical shape, and the horizontal gap in each direction is not constant.

Figure 30:
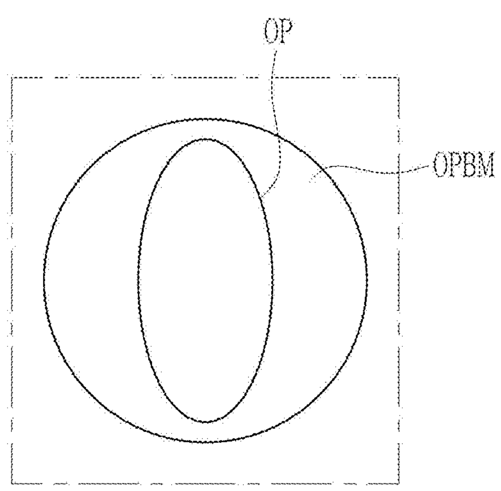
FIG. 30 and FIG. 31 are plan views of a portion of a display panel according to another embodiment.
Figure 31:
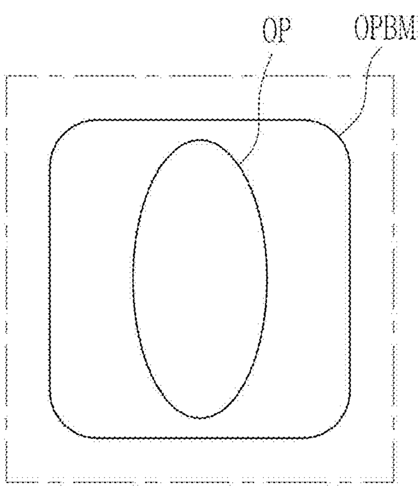

However, based on the embodiment, the second opening OPBM of the light blocking layer 220 may have a shape other than an oval, and some of the example embodiments will be examined through FIGS. 30 and 31.

FIG. 30 and FIG. 31 are plan views of a portion of a display panel according to another embodiment.

In FIGS. 30 and 31, only the opening OP of one pixel defining layer 380 and the second opening OPBM of the light blocking layer 220 corresponding thereto are illustrated.

The second opening OPBM of the light blocking layer 220 overlaps the entire opening OP of the pixel defining layer 380.

However, based on the embodiment, a portion of the opening OP of the pixel defining layer 380 may be obscured by the light blocking layer 220.

FIG. 30 illustrates an embodiment in which the second opening OPBM of the light blocking layer 220 is formed in a circular shape, and the opening OP of the pixel defining layer 380 and the second opening OPBM of the light blocking layer 220 are illustrated, and the horizontal gap between the opening OP and the second openings OPBM has different values in the major axis direction and the minor axis direction of the opening OP of the pixel defining layer 380, while the horizontal gap in the major axis direction is smaller than the horizontal gap in the minor axis direction.

In some aspects, the horizontal gap in the diagonal direction corresponding to directions other than the major axis direction and the minor axis direction of the opening OP of the pixel defining layer 380 may have values different from the gaps in the major axis direction and the gap in the minor axis direction.

In the embodiment of FIG. 30, the horizontal gap in the diagonal direction may be larger than the gap in the major axis direction and smaller than the gap in the minor axis direction.

In some embodiments, in FIG. 31, an example is illustrated where the second opening OPBM of the light blocking layer 220 is formed in a planar shape other than a circular or elliptical shape, and in FIG. 31, the second opening OPBM of the light blocking layer 220 is formed in a square shape (expressed another way, is a square shape).

In FIG. 31, the horizontal gap between the opening OP of the pixel defining layer 380 and the second opening OPBM of the light blocking layer 220 is the major axis direction and the minor axis direction of the opening OP of the pixel defining layer 380, they have different values in the directions, and the horizontal gap in the major axis direction is smaller than the horizontal gap in the minor axis direction.

In some aspects, the horizontal gap in the diagonal direction corresponding to directions other than the major axis direction and the minor axis direction of the opening OP of the pixel defining layer 380 may have values different from the gaps in the major axis direction and the gap in the minor axis direction.

In the embodiment of FIG. 31, the horizontal gap in the diagonal direction may be formed to be larger than the gap in the major axis direction and the gap in the minor axis direction.

In the embodiments of FIGS. 30 and 31, the difference between the gap in the major axis direction and the gap in the minor axis direction between the opening OP of the pixel defining layer 380 and the second opening OPBM of the light blocking layer 220 may range from 0.1 μm to 2.6 μm. The eccentricity of the opening OP of the pixel defining layer 380 may range from 0.2 to 0.85.

According to the embodiment, the major axis direction of the opening OP of the pixel defining layer 380 can be arranged in various ways, and the angle formed by the major axis can have four or more angles, and also, the angle formed by the major axis can be arranged at intervals of 45 degrees or less.

Based on the embodiment, ovals having different eccentricities may be formed into a merged shape.

The eccentricities of the two ellipses used for merging may vary, and the size of the merged ellipses may also vary.

In some aspects, based on the embodiment, two ovals having different eccentricities for each color can be combined, and even if the ovals are associated with the same color, the two ovals having different eccentricities can be combined to form various ovals.

Various variations of Table 1 may also be applied to the embodiments of FIGS. 30 and 31.

As in the embodiments of FIGS. 30 and 31, if the horizontal distance between the opening OP of the pixel defining layer 380 and the second opening OPBM of the light blocking layer 220 varies, the angle at which light is provided from the light emitting layer in FIG. 12 can also vary, and if the major axis direction of the opening OP of the pixel defining layer 380 is arranged in various ways, the embodiments can have the advantage of causing less color separation of external light or a constant diffraction pattern or color separation regardless of the angle, as various viewing angles are mixed.

Hereinafter, the planar structure of the color filters 230R, 230G, and 230B according to an embodiment will be examined in detail with reference to FIG. 32.

Figure 32:
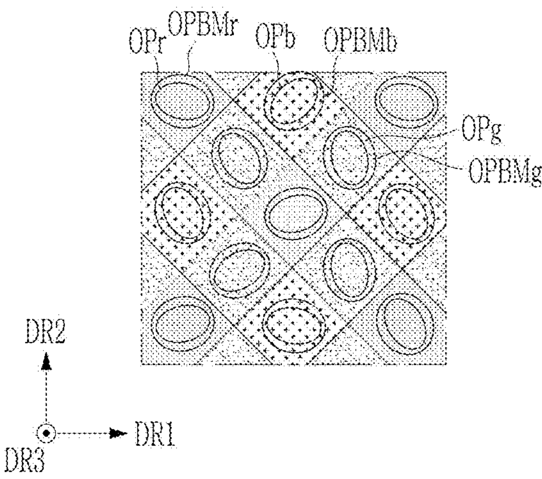
FIG. 32 is a plan view including a color filter of a display area according to an embodiment.

FIG. 32 is a plan view including a color filter of a display area according to an embodiment.

FIG. 32 is a diagram more clearly illustrating the planar structure of the color filters 230R, 230G, and 230B In an embodiment.

Referring to FIG. 6, which is a cross-sectional view, adjacent color filters 230R, 230G, and 230B have a structure in which they overlap each other on the light blocking layer 220.

The planar structure of this overlapping area may vary, and one of the planar structures in the embodiment may have a diamond shape, as illustrated in FIG. 32.

Specifically, each of the color filters 230R, 230G, and 230B covers the opening OP of the corresponding pixel defining layer 380 and the second opening OPBM of the light blocking layer 220 and has a diamond shape.

Referring to FIG. 32, the color filters 230R, 230G, and 230B are each illustrated with different hatching, and the boundary between adjacent color filters 230R, 230G, and 230B is illustrated as a single line.

However, some areas of the actually adjacent color filters 230R, 230G, and 230B may overlap each other as illustrated in FIG. 6, and the overlapping portion is located at the boundary line of the color filters 230R, 230G, and 230B in FIG. 32.

In some aspects, based on the embodiment, a light blocking area of the color filter may be formed in which at least two color filters 230R, 230G, and 230B overlap, instead of the light blocking layer 220.

Hereinafter, through FIGS. 33 to 37, an embodiment that does not include a light blocking layer and includes a light blocking area of a color filter in which at least two color filters 230R, 230G, and 230B are overlapped will be described.

First, look at the modified structure of FIG. 6 through FIGS. 33 and 34.

Figure 33:
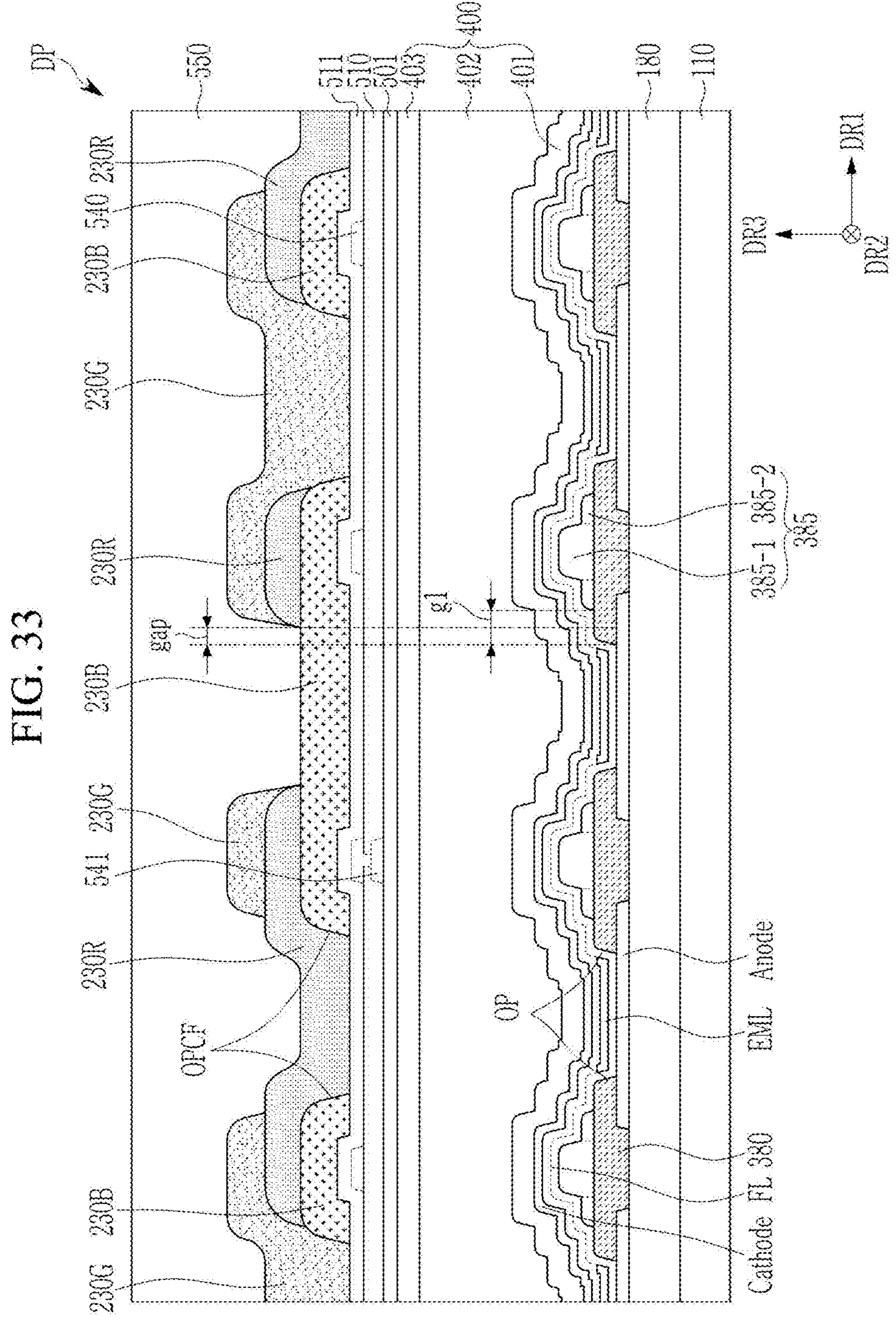
FIG. 33 and FIG. 34 are schematic cross-sectional views of a display panel according to another embodiment.
Figure 34:
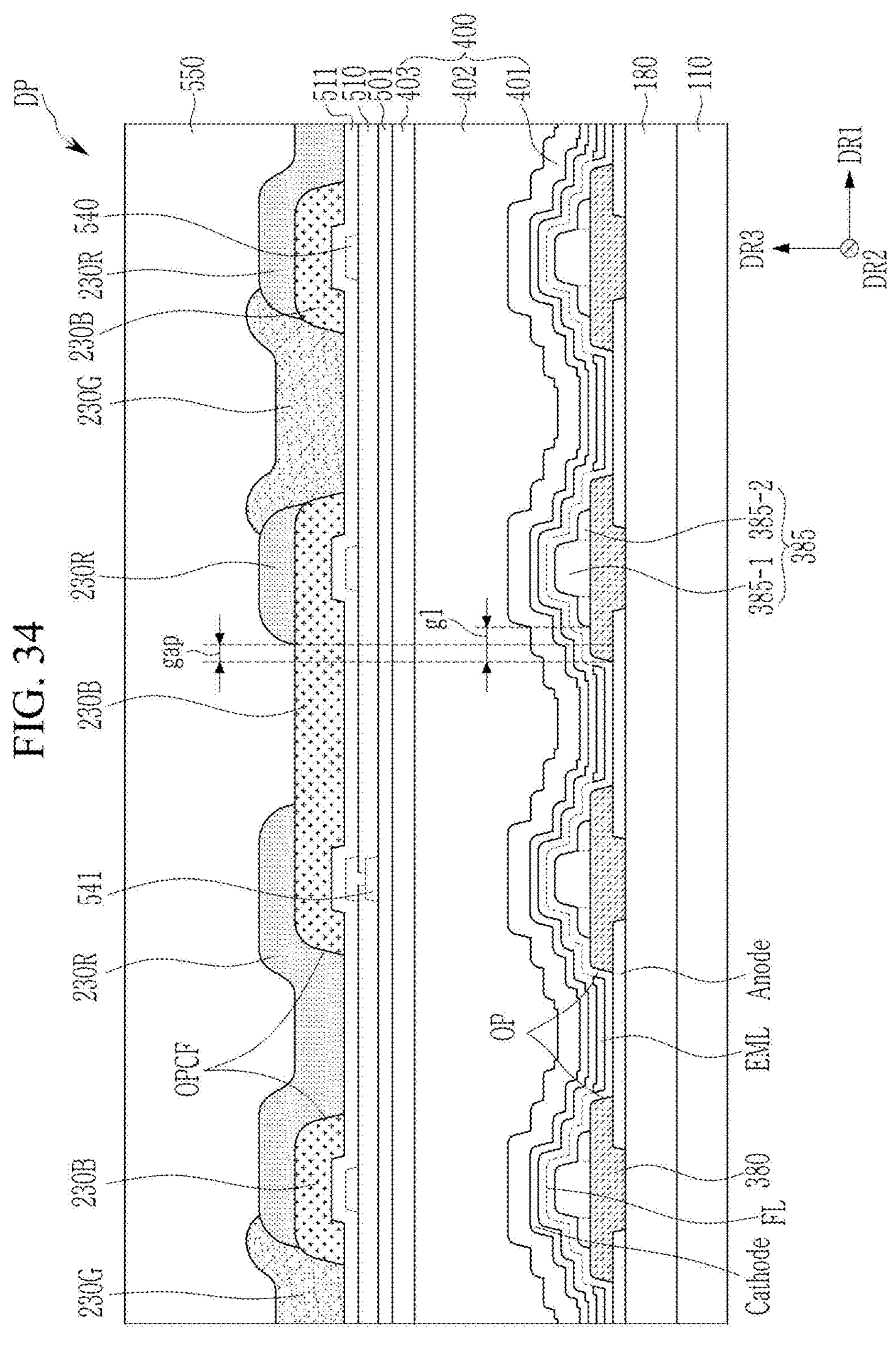

FIG. 33 and FIG. 34 are schematic cross-sectional views of a display panel according to another embodiment.

Hereinafter, the structure of the light emitting display panel DP according to an embodiment will first be looked at with reference to FIG. 33, and description of the same parts as in FIG. 6 will be omitted.

The light emitting display panel DP according to the embodiment of FIG. 33 can display an image by forming light emitting diodes on a substrate 110, and can detect a touch by including a plurality of sensing electrodes 540 and 541. The light emitted from the light emitting diode, including the color filters 230R, 230G, 230B, also has the color characteristics of the color filters 230R, 230G, 230B.

In some embodiments, a black light blocking layer that blocks visible light may not be formed, and instead of a light blocking layer, at least two color filters may be overlapped to block visible light.

An area that blocks visible light by overlapping at least two or more color filters is called a light blocking area, and in the embodiment of FIG. 33, a blue color filter 230B, a red color filter 230R, and a green color filter 230G are sequentially stacked.

The order in which color filters are stacked may vary based on the embodiment.

In some aspects, a polarizer is not formed on the front surface of the light emitting display panel DP according to the embodiment of FIG. 33, and instead, the pixel defining layer 380 is formed of a black organic material, and at least the upper part of the pixel defining layer 380 is formed, while two or more color filters overlap to form a light blocking area, such that even if external light enters the interior, the light is reflected from an anode, etc. and is not transmitted to the user.

Specifically, color filters 230R, 230G, and 230B are located on the third sensing insulating layer 511.

The color filters 230R, 230G, 230B are a red color filter 230R that transmits red light, a green color filter 230G that transmits green light, and a blue color filter 230B that transmits blue light.

Each of the color filters 230R, 230G, and 230B may be positioned to overlap the anode of the light emitting diode on a plane.

Since the light emitted from the light emitting layer EML may change to a corresponding color as the light passes through a color filter, and all light emitted from the light emitting layer EML may have the same color.

However, the light emitting layer EML emits light of different colors, and the displayed color can be strengthened by passing through a color filter of the same color.

Based on the embodiment, the color filters 230R, 230G, and 230B may be replaced with a color conversion layer or may further include a color conversion layer.

The color conversion layer may include quantum dots.

In the embodiment of FIG. 33, a black light blocking layer that blocks visible light is not formed, and a light blocking area formed by overlapping at least two color filters is formed instead of the light blocking layer.

In the embodiment of FIG. 33, the light blocking area includes a blue color filter 230B, a red color filter 230R, and a green color filter 230G sequentially stacked.

The order in which color filters are stacked may vary based on the embodiment.

The light blocking area where at least two or more color filters overlap may be positioned to overlap the sensing electrodes 540 and 541 in a plane, and may be positioned not to overlap the anode in a plane.

This is to ensure that the anode and the light emitting layer EML capable of displaying an image are not obscured by the light blocking area and the sensing electrodes 540 and 541.

Referring to FIG. 33, the light blocking area of the color filter with three overlapped color filters is located only in the area overlapping the pixel defining layer 380 on the plane, and one side of the light blocking area of the color filter is positioned inward from one corresponding side of the pixel defining layer 380.

The area where one color filter is located in an area excluding the light blocking area transmits light of the color of the one color filter, so the area may form a light transmission area of the color filter.

Hereinafter, the light transmission area of the color filter where only one color filter is located is also referred to as the second opening OPCF of the light blocking area because light is transmitted therethrough.

In some aspects, the second opening OPCF of the light blocking area is not an area where no color filters are disposed in a light blocking area where at least two or more color filters overlap, but an area corresponding to the light transmission area of the color filter where only one color filter is located.

In some embodiments, the second opening OPCF of the light blocking area of the color filter may correspond to the second opening OPBM of the light blocking layer 220 described herein.

The area of the second opening OPCF in the light blocking area is formed larger than the opening OP of the pixel defining layer 380, and the opening OP of the pixel defining layer 380 on the plane can be located within the second opening OPCF of the light blocking area.

Referring to FIG. 33, the gap between one side of the pixel defining layer 380 and one side of the light blocking layer 220 is illustrated, and in a plan view, the pixel defining layer 380 has a gap greater than the light blocking layer 220, and the pixel defining layer 380 has a structure that protrudes more than the gap.

In some embodiments, the gap may be the same as the gap between the opening OP of the pixel defining layer 380 and the second opening OPBM of the light blocking layer 220.

In some aspects, one side of the spacer 385 is disposed to be inward at a certain distance g1 from the corresponding side of the pixel defining layer 380, and the spacer 385 is also inward to one side of the light blocking area.

As a result, when viewed from the front of the display panel DP, the spacer 385 may be obscured by the light blocking area and may not be visible.

When external light is incident, external light may pass through the second opening OPCF of the light blocking area of the color filter and then be reflected on the sidewall of the opening OP of the pixel defining layer 380.

The sidewall of the opening OP of the pixel defining layer 380 is curved and color separation occurs depending on the position of reflection, such that the reflected light can appear in various colors, such as, for example, a rainbow.

Since this color-separated reflected light can easily be seen by the user and deteriorate the display quality, in the above-described embodiment, the second opening OPBM of the light blocking layer 220 is changed to the second opening OPCF of the light blocking area of the color filter and can be applied instead.

That is, at least one of the second opening OPCF of the light blocking area of the color filter and the opening OP of the pixel defining layer 380 is formed in an oval shape, and the direction of the oval shape or the eccentricity of the oval shape is arranged in various ways to achieve color separation, or reduce or allow white reflected light to be visible.

In some aspects, based on the embodiment, at least one opening may be formed to have a shape similar to an oval rather than an oval, and its direction or eccentricity may be changed in various ways.

In some aspects, various modifications to the previously described second opening OPBM of the light blocking layer 220 and the corresponding opening OP of the pixel defining layer 380 may be used to form the second opening OPCF of the light blocking area of the color filter.

A planarization layer 550 covering the color filters 230R, 230G, and 230B is positioned on the color filters 230R, 230G, and 230B.

The planarization layer 550 is used to planarize the upper surface of the light emitting display panel and may be a transparent organic insulating film containing one or more materials selected from the group consisting of polyimide, polyamide, acrylic resin, benzocyclobutene, and phenol resin.

Based on the embodiment, a low refractive layer and an additional planarization layer may be further positioned on the planarization layer 550 to improve front visibility and light output efficiency of the display panel.

Light can be refracted and emitted toward the front by an additional flattening layer with a low refractive layer and a high refractive characteristic.

In this case, based on the embodiment, the planarization layer 550 may be omitted and a low refractive layer and an additional planarization layer may be located directly on the color filter.

In this embodiment, a polarizing plate is not included on top of the planarization layer 550.

In other words, the polarizer can prevent display quality from deteriorating when external light is incident and reflected by the anode or the sidewall of the opening OP of the pixel defining layer 380, which is visible to the user.

However, the polarizer has the disadvantage of consuming more power to display a certain luminance by not only reducing the reflection of external light but also reducing the light emitted from the light emitting layer EML.

In order to reduce power consumption, the light emitting display device of this embodiment may not include a polarizer.

In some aspects, in this embodiment, the side of the anode is covered with the pixel defining layer 380 to reduce the degree of reflection from the anode, and a light blocking area where at least two or more color filters are overlapped is also formed to prevent light from entering. This embodiment already includes a structure to reduce the degree of display quality and prevent deterioration of display quality due to reflection.

Therefore, according to the example embodiment of FIG. 32, the light emitting display panel DP may be implemented without separately forming the polarizer on the front of the light emitting display panel DP.

In the example of FIG. 33, the light blocking area where at least two or more color filters are overlapped is focused on an example in which three color filters are overlapped.

However, based on the embodiment, the light blocking area of the color filter may be formed by overlapping two color filters, which is illustrated in FIG. 34.

FIG. 34 is a diagram corresponding to FIGS. 6 and 33. Only the color filters 230R, 230G, and 230B are different from FIG. 33, and the lower structure of the third sensing insulating layer 511 is the same as the lower structure of FIG. 33.

Hereinafter, aspects of the upper structure of the third sensing insulating layer 511, which is different from the upper structure of FIG. 33, will be described with reference to FIG. 34.

Referring to FIG. 34, a light blocking layer that blocks visible light is not formed, and a blue color filter 230B and a red color filter 230R are sequentially overlapped to block visible light.

The order in which color filters are stacked may vary based on the embodiment.

Specifically, the light blocking area where two color filters overlap has a blue color filter 230B and a red color filter 230R, and a green color filter 230G is overlapped in some areas of the light blocking area of the color filter.

However, the green color filter 230G is an embodiment in which the light blocking area of the color filter is not formed entirely, and the light blocking area of the color filter is formed using only two color filters, unlike the embodiment of FIG. 33.

The light blocking area where two color filters overlap is located only in the area that overlaps the pixel defining layer 380 on a plane, and one side of the light blocking area of the color filter goes inward from the corresponding side of the pixel defining layer 380.

Only one color filter can be located in the area excluding the light blocking area of the color filter, and the light of the color of the color filter is transmitted to form the second opening OPCF of the light transmission area of the color filter or the light blocking area of the color filter.

The area of the second opening OPCF is formed to be larger than the opening OP of the pixel defining layer 380, and in a plan view, the opening OP of the pixel defining layer 380 may be located within the second opening OPCF in the light blocking area of the color filter.

In addition to the pixel defining layer 380, the light blocking area of the color filter also overlaps the spacer 385 and the plurality of sensing electrodes 540 and 541 on a plane.

Specifically, the light blocking area of the color filter is positioned inward by a distance gap from one side of the corresponding pixel defining layer 380, and the light blocking area of the color filter is positioned inward by a certain distance g1 from one side of the spacer 385.

In some aspects, the plurality of sensing electrodes 540 and 541 are also covered on a plane with the light blocking area of the color filter.

As a result, when viewed from the front of the display panel DP, the spacer 385 and the plurality of sensing electrodes 540 and 541 may not be visible because they are obscured by the light blocking area of the color filter.

Based on the embodiment, the color filters 230R, 230G, and 230B may be replaced with a color conversion layer or may further include a color conversion layer.

The color conversion layer may include quantum dots.

Figure 35:
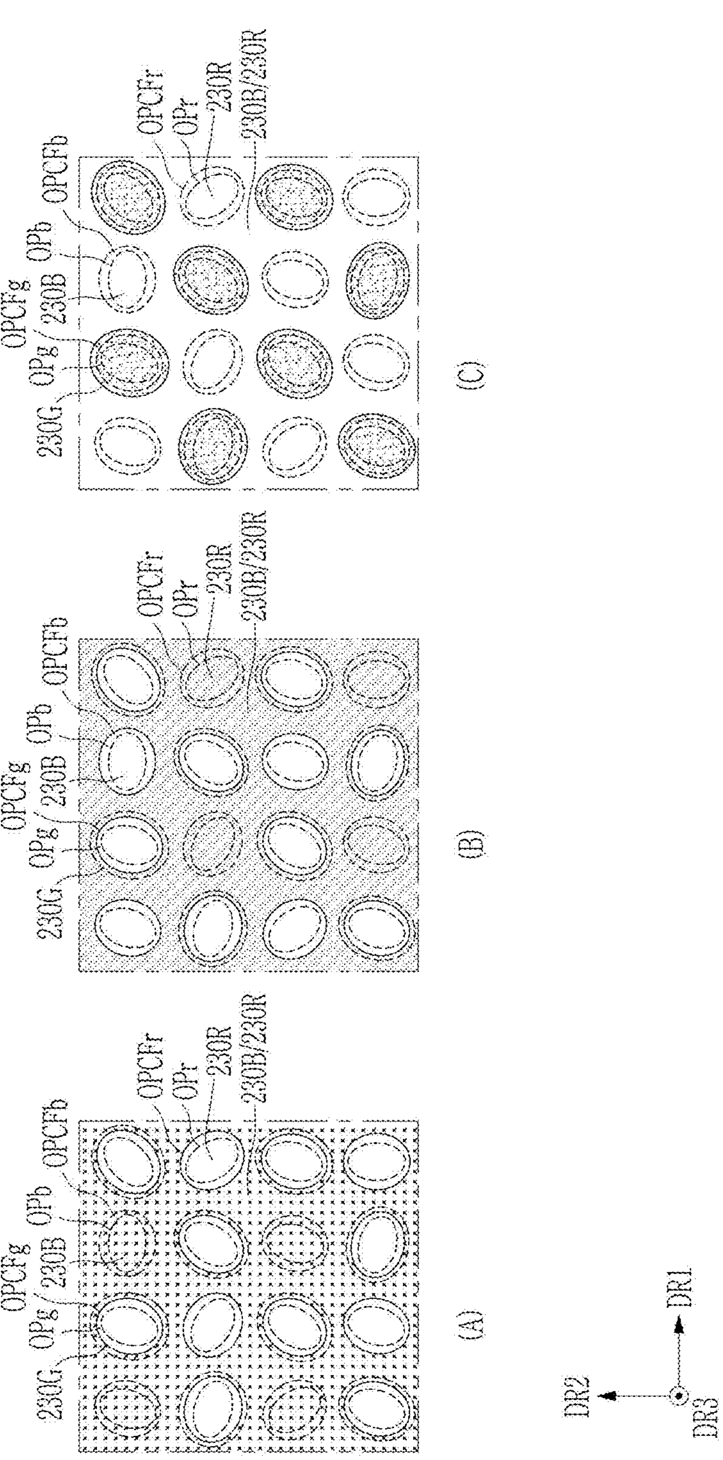
FIG. 35 is a plan view illustrating color filters in a display area according to another embodiment.
Figure 36:
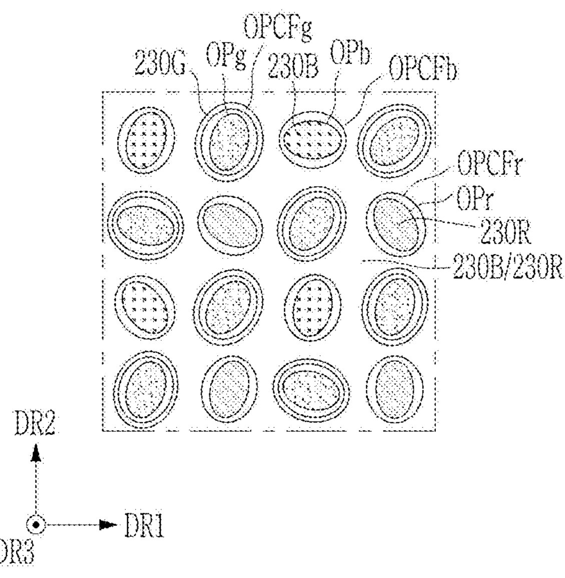
FIG. 36 is a plan view of a portion of a display panel according to another embodiment.

An embodiment having a cross-sectional structure as illustrated in FIG. 34 may have a planar structure as illustrated in FIGS. 35 and 36.

First, the planar structure of each color filters 230R, 230G, and 230B will be examined through FIG. 35.

FIG. 35 is a plan view illustrating color filters in a display area according to another embodiment.

FIG. 35(A) illustrates the layer where the blue color filter 230B is formed, and a hatch is drawn at the portion where the blue color filter 230B is located.

In some embodiments, the remaining layers in FIG. 36 are illustrated with dotted lines.

Based on FIG. 35(A), the blue color filter 230B is located in the light blocking area and the blue light transmission area through which blue light is transmitted, and is not formed in the red and green transmission areas.

In some aspects, FIG. 35(B) illustrates the layer where the red color filter 230R is formed, and a hatch is drawn at the portion where the red color filter 230R is located.

In some embodiments, the remaining layers in FIG. 36 are illustrated with dotted lines.

Based on FIG. 35(B), the red color filter 230R is located in the light blocking area and the red light transmission area through which red light is transmitted, and is not formed in the blue and green transmission areas.

In some embodiments, FIG. 35(C) illustrates the layer where the green color filter 230G is formed, and a hatch is drawn at the portion where the green color filter 230G is located.

In some embodiments, the remaining layers in FIG. 36 are illustrated with dotted lines.

Based on FIG. 35(C), the green color filter 230G is formed in an island-like structure and is located only in the green light transmission area through which green light transmits, and is not formed in the light blocking area and the red and blue transmission areas.

In some embodiments, the green color filter 230G may overlap with some of the light blocking areas of the color filter.

By overlapping FIGS. 35(A), (B), and (C), a planar structure as illustrated in FIG. 36 can be obtained.

FIG. 36 is a plan view of a portion of a display panel according to another embodiment.

FIG. 36 is a plan view corresponding to FIG. 15. Unlike the embodiment of FIG. 15, a light blocking area is formed by overlapping two or more color filters instead of a light blocking layer, and the green color filter 230G has an island-shaped structure.

Here, the boundary of the green color filter 230G is further illustrated outside the green second opening OPCFg among the second openings of the color filter, such that the green color filter 230G has an island-shaped structure, and in the green color filter 230G, it is clearly illustrated that the boundary partially overlaps with the light blocking area of the color filter.

In FIG. 36, the red color filter 230R and the blue color filter 230B are each located in a light blocking area, but hatches corresponding to the red color filter 230R and the blue color filter 230B are not illustrated in the light blocking area, and instead, "230B/230R" clearly indicates that the light blocking area is where the blue color filter 230B and the red color filter 230R are located.

Below, whether two color filters can be stacked to replace the role of a light blocking layer are described with reference to FIG. 37.

Figure 37:
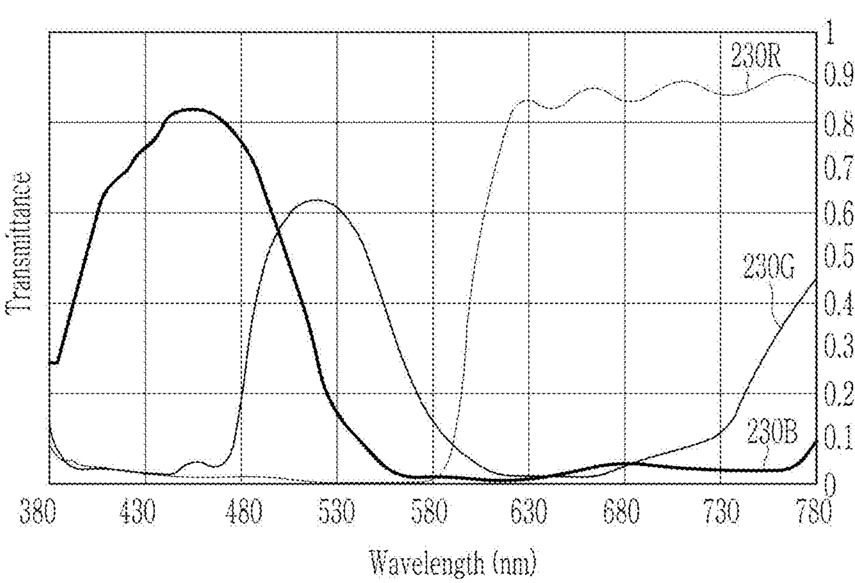
FIG. 37 is a graph illustrating the transmittance according to the wavelength of the color filter.

FIG. 37 is a graph illustrating the transmittance according to the wavelength of the color filter.

In FIG. 37, a graph shows the transmittance for the wavelengths of each color filter 230R, 230G, 230B, so light in the wavelength range having a high transmittance is transmitted.

Referring to FIG. 37, it can be confirmed that other than the wavelength bands that pass through each color filter 230R, 230G, 230B, the other parts have transmittance of less than 10%, and when three or two color filters overlap, there are almost no existing wavelength bands that pass through.

Therefore, it can be confirmed that by overlapping at least two color filters, they can replace the role of a light-blocking component, either by overlapping three color filters as in FIG. 33, or by overlapping two color filters as in FIGS. 34 to 36.

Figure 38:
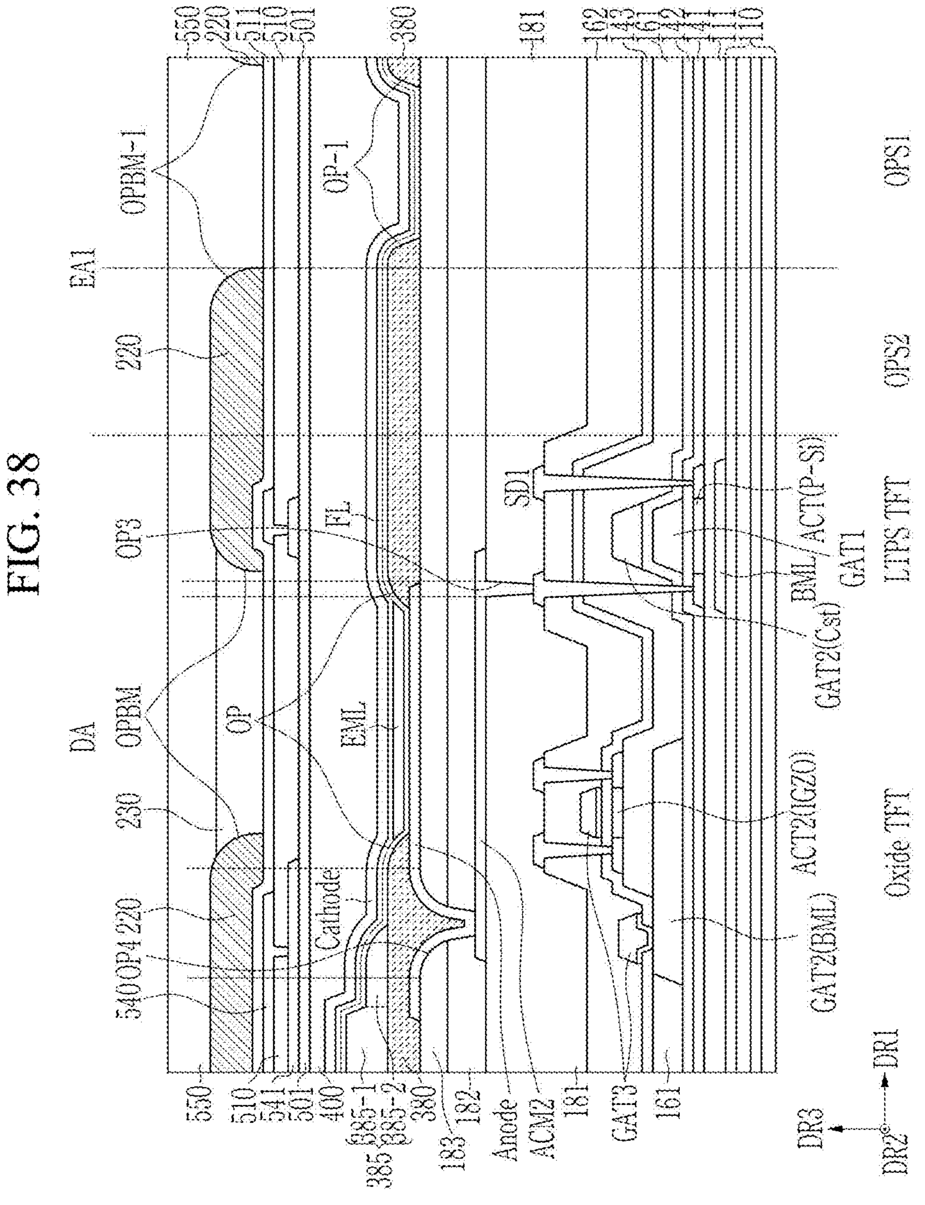
FIGS. 38 and 39 are cross-sectional views of a light emitting display device according to an embodiment.
Figure 39:
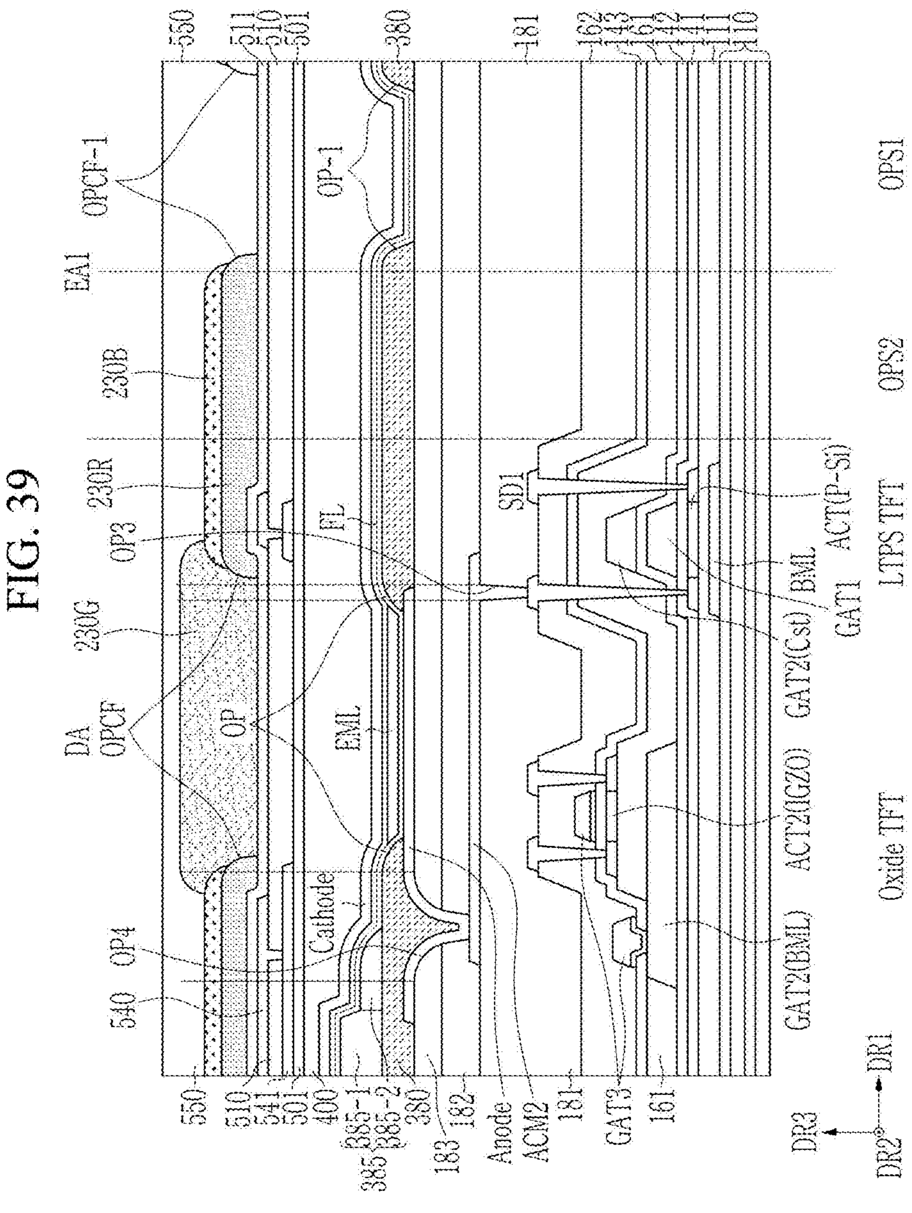

The stacked structure of the display area DA and the first component area EA1 will be examined in more detail through FIGS. 38 and 39.

FIG. 38 and FIG. 39 are cross-sectional views of a light emitting display device according to an embodiment.

FIG. 38 illustrates an embodiment including a light blocking layer 220, and FIG. 39 illustrates an embodiment in which a light blocking area of the color filter is formed by overlapping a blue color filter 230B and a red color filter 230R instead of the light blocking layer 220.

First, aspects of the embodiment of FIG. 38 are described herein in detail.

A light-emitting display device can be largely divided into a lower panel layer and an upper panel layer. The lower panel layer is where the light-emitting diodes and pixel circuitry that make up the pixel are located, and may even include an encapsulation layer 400 that covers it.

Here, the pixel circuit unit includes the second organic layer 182, the third organic layer 183, and the lower parts of the second organic layer 182, while the light emitting diode is disposed between the third organic layer 183 and the encapsulation layer 400.

The structure located on top of the encapsulation layer 400 may correspond to the upper panel layer.

Referring to FIG. 38, a metal layer BML is located on the substrate 110.

The substrate 110 may include a material that has rigid properties and does not bend, such as, for example, glass, or may include a flexible material that can bend, such as, for example, plastic or polyimide.

In the case of a flexible substrate, as illustrated in FIG. 38, the flexible substrate may have a double-layer structure of polyimide and a barrier layer formed of an inorganic insulating material thereon.

The metal layer BML may be formed in a position that overlaps the channel of the driving transistor T1 in a plane among the subsequent first semiconductor layers, and is also called a lower shielding layer.

The metal layer BML may include a metal or metal alloy such as, for example, copper (Cu), molybdenum (Mo), aluminum (Al), or titanium (Ti).

A buffer layer 111 covering the substrate 110 and the metal layer BML is located on the substrate 110.

The buffer layer 111 serves to block the penetration of impure elements into the first semiconductor layer ACT (P—Si), and may be an inorganic insulating layer including a silicon oxide (SiOx), a silicon nitride (SiNx), or a silicon oxynitride ($SiO_xN_y$).

A first semiconductor layer ACT (P—Si) formed of a silicon semiconductor (e.g., polycrystalline semiconductor P—Si) is located on the buffer layer 111.

The first semiconductor layer ACT (P—Si) includes a channel of a polycrystalline transistor LTPS TFT including the driving transistor T1, and a first region and a second region located on both sides of the channel of the polycrystalline transistor LTPS TFT.

Here, the polycrystalline transistor LTPS TFT may include not only the driving transistor T1 but also various switching transistors or compensation transistors.

In some aspects, the first semiconductor layer ACT (P—Si) has regions on both sides of the channel that have conductive layer characteristics through plasma treatment or doping, and can serve as the first and second electrodes of the transistor.

A first gate insulating layer 141 may be positioned on the first semiconductor layer ACT (P—Si).

The first gate insulating layer 141 may be an inorganic insulating layer containing a silicon oxide (SiOx), a silicon nitride (SiNx), or a silicon oxynitride ($SiO_xN_y$).

A first gate conductive layer including the gate electrode of a polycrystalline transistor LTPS TFT may be positioned on the first gate insulating layer 141.

The first gate conductive layer may be formed with a first scan line or a light emission control line in addition to the gate electrode of the polycrystalline transistor LTPS TFT.

The first gate conductive layer may include a metal or metal alloy such as, for example, copper (Cu), molybdenum (Mo), aluminum (Al), or titanium (Ti), and may be composed of a single layer or multiple layers.

After forming the first gate conductive layer, a plasma treatment or doping process may be performed to make the exposed area of the first semiconductor layer conductive.

That is, the first semiconductor layer ACT (P—Si) covered by the first gate conductive layer is not conductive, and the first semiconductor layer ACT (P—Si) not covered by the first gate conductive layer is conductive and may have the same characteristics as the conductive layer.

A second gate insulating layer 142 may be positioned on the first gate conductive layer and the first gate insulating layer 141.

The second gate insulating layer 142 may be an inorganic insulating layer containing a silicon oxide (SiOx), a silicon nitride (SiNx), or a silicon oxynitride ($SiO_xN_y$).

A second gate conductive layer including one electrode GAT2 (Cst) of the sustain capacitor Cst and the lower shielding layer GAT2 (BML) of the oxide transistor Oxide TFT will be located on the second gate insulating layer 142.

The lower shielding layer GAT2 (BML) of the oxide transistor Oxide TFT is located at the bottom of the channel of each oxide transistor Oxide TFT and serves to shield from light or electromagnetic interference provided to the channel from the bottom.

In some embodiments, one electrode GAT2 (Cst) of the sustaining capacitor Cst overlaps the gate electrode GAT1 of the driving transistor T1 to form the sustaining capacitor Cst.

Based on the embodiment, the second gate conductive layer may further include a scan line, a control line, or a voltage line.

The second gate conductive layer may include a metal or metal alloy such as, for example, copper (Cu), molybdenum (Mo), aluminum (Al), or titanium (Ti), and may be composed of a single layer or multiple layers.

A first interlayer insulating layer 161 may be positioned on the second gate conductive layer.

The first interlayer insulating layer 161 may include an inorganic insulating layer containing a silicon oxide (SiOx), a silicon nitride (SiNx), or a silicon oxynitride ($SiO_xN_y$). Based on the embodiment, the inorganic insulating material may be formed thickly.

An oxide semiconductor layer ACT2 (IGZO) including a channel, a first region, and a second region of an oxide transistor Oxide TFT may be located on the first interlayer insulating layer 161.

A third gate insulating layer 143 may be located on the oxide semiconductor layer ACT2 (IGZO).

The third gate insulating layer 143 may be located on the entire surface of the oxide semiconductor layer ACT2 (IGZO) and the first interlayer insulating layer 161.

The third gate insulating layer 143 may include an inorganic insulating layer containing a silicon oxide (SiOx), a silicon nitride (SiNx), or a silicon oxynitride ($SiO_xN_y$).

A third gate conductive layer GAT3 including the gate electrode of an oxide transistor Oxide TFT may be positioned on the third gate insulating layer 143.

The gate electrode of an oxide transistor Oxide TFT may overlap the channel.

The third gate conductive layer GAT3 may further include a scan line or a control line, and may additionally include a connection electrode connected to the lower shielding layer GAT2 (BML) of the oxide transistor Oxide TFT.

The third gate conductive layer GAT3 may contain a metal or metal alloy such as, for example, copper (Cu), molybdenum (Mo), aluminum (Al), or titanium (Ti), and may be composed of a single layer or multiple layers.

A second interlayer insulating layer 162 may be positioned on the third gate conductive layer GAT3.

The second interlayer insulating layer 162 may have a single layer or multilayer structure.

The second interlayer insulating layer 162 may include an inorganic insulating material such as, for example, a silicon nitride (SiNx), a silicon oxide (SiOx), or a silicon oxynitride ($SiO_xN_y$), and may include an organic material based on the embodiment.

A first data conductive layer SD1 is positioned on the second interlayer insulating layer 162 and includes a connection electrode that can be connected to the first and second regions of each of the polycrystalline transistor LTPS TFT and the oxide transistor Oxide TFT.

The first data conductive layer SD1 may include a metal or metal alloy such as, for example, aluminum (Al), copper (Cu), molybdenum (Mo), and titanium (Ti), and may be composed of a single layer or multiple layers.

The first organic layer 181 may be positioned on the first data conductive layer SD1.

The first organic layer 181 may be an organic insulating layer containing an organic material, and the organic material includes one or more materials selected from the group consisting of polyimide, polyamide, acrylic resin, benzocyclobutene, and phenol resin.

A second data conductive layer including an anode connection electrode ACM2 may be positioned on the first organic layer 181.

The second data conductive layer may include a data line or a driving voltage line.

The second data conductive layer SD2 may include a metal or metal alloy such as, for example, aluminum (Al), copper (Cu), molybdenum (Mo), or titanium (Ti), and may be composed of a single layer or multiple layers.

Above the second data conductive layer, the second organic layer 182 and the third organic layer 183 are located, and an anode connection opening OP4 is formed in the second organic layer 182 and the third organic layer 183.

The anode connection electrode ACM2 is electrically connected to the anode Anode through the anode connection opening OP4.

The second organic layer 182 and the third organic layer 183 may be organic insulating layers and may include one or more materials selected from the group consisting of polyimide, polyamide, acrylic resin, benzocyclobutene, and phenol resin.

Based on the embodiment, the third organic layer 183 may be omitted.

A pixel defining layer 380 may be positioned on the anode and has an opening OP exposing the anode and covers at least a portion of the anode.

The pixel defining layer 380 may be a black pixel defining layer that is formed of a black organic material to prevent externally applied light from being reflected back to the outside. Based on the embodiment, the pixel defining layer 380 may be formed of a transparent organic material.

Therefore, based on the embodiment, the pixel defining layer 380 may include a negative-type black organic material and a black pigment.

A spacer 385 is located on the pixel defining layer 380.

The spacer 385 may include a first portion 385-1 that is tall and located in a narrow area, and a second portion 385-2 that is low in height and is located in a wide area.

Unlike the pixel defining layer 380, the spacer 385 may be formed of a transparent organic insulating material.

Based on the embodiment, the spacer 385 may be formed of a positive-type transparent organic material.

A functional layer FL and a cathode are sequentially formed on the anode, spacer 385, and pixel defining layer 380, and are formed sequentially in the display area DA and the first component area EA1, while the functional layer FL and cathode can be located in all areas.

The light emitting layer EML is located between the functional layers FL, and the light emitting layer EML may be located only within the opening OP of the pixel defining layer 380.

Hereinafter, the functional layer FL and the light emitting layer EML can be combined to refer to the intermediate layer.

The functional layer FL can include at least one auxiliary layer such as, for example, an electron injection layer, an electron transport layer, a hole transport layer, and a hole injection layer, the hole injection layer and the hole transport layer may be located under the light emitting layer EML, and the electron transport layer and the electron injection layer may be located above the light emitting layer EML.

An encapsulation layer 400 is located on the cathode.

The encapsulation layer 400 includes at least one inorganic layer and at least one organic layer, and based on the embodiment, may have a triple-layer structure including a first inorganic encapsulation layer, an organic encapsulation layer, and a second inorganic encapsulation layer.

The encapsulation layer 400 may be used to protect the light emitting layer EML from moisture or oxygen that may enter from the outside.

Based on the embodiment, the encapsulation layer 400 may include a structure in which an inorganic layer and an organic layer are further sequentially stacked.

Sensing insulating layers 501, 510, 511 and a plurality of sensing electrodes 540, 541 are positioned on the encapsulation layer 400 for touch detection.

In the embodiment of FIG. 38, touch can be sensed in a capacitive manner using two sensing electrodes 540 and 541.

Specifically, a first sensing insulating layer 501 is formed on the encapsulation layer 400, and a plurality of sensing electrodes 540 and 541 are formed thereon.

The plurality of sensing electrodes 540 and 541 may be insulated with the second sensing insulating layer 510 interposed between the sensing electrodes 540 and 541, and some of the sensing electrodes 540 and 541 may be electrically connected through an opening located in the second sensing insulating layer 510.

Here, the sensing electrodes 540 and 541 are formed of a metal or metal alloy such as, for example, aluminum (Al), copper (Cu), silver (Ag), gold (Au), molybdenum (Mo), titanium (Ti), and tantalum (Ta), the sensing electrodes 540 and 541 may include a single layer or multiple layers.

A third sensing insulating layer 511 is formed on the sensing electrode 540.

A light blocking layer 220 and color filters 230R, 230G, and 230B are positioned on the third sensing insulating layer 511.

The light blocking layer 220 may be positioned to overlap the sensing electrodes 540 and 541 in a plane.

The light blocking layer 220 has an second opening OPBM, and the second opening OPBM of the light blocking layer 220 overlaps the opening OP of the pixel defining layer 380 on a plane.

In some aspects, the second opening OPBM of the light blocking layer 220 may be formed wider than the opening OP of the pixel defining layer 380.

As a result, the anode that overlaps the opening OP of the pixel defining layer 380 (i.e., exposed by the opening OP of the pixel defining layer 380) is also exposed on a plane by the light blocking layer 220.

This is to ensure that the anode and the light emitting layer EML capable of displaying an image are not obscured by the light blocking layer 220 and the sensing electrodes 540 and 541.

In some aspects, the light blocking layer 220 has a structure that overlaps the anode connection opening OP4 on a plane but does not overlap the opening OP3 of the first organic layer 181 on a plane.

Color filters 230R, 230G, and 230B are positioned on the sensing insulating layers 501, 510, and 511 and the light blocking layer 220.

Based on the embodiment, the color filters 230R, 230G, and 230B may be replaced with a color conversion layer or may further include a color conversion layer.

The color conversion layer may include quantum dots.

A planarization layer 550 may be positioned on the color filters 230R, 230G, and 230B and cover the color filters 230R, 230G, and 230B. Based on the embodiment, the planarization layer 550 may be used to improve front visibility and light output efficiency of the display device, and a low refractive layer and an additional planarization layer may further be located on top of the planarization layer 550.

Light can be refracted and emitted toward the front by an additional flattening layer with a low refractive layer and a high refractive characteristic.

In this case, based on the embodiment, the planarization layer 550 may be omitted and a low refractive layer and an additional planarization layer may be located directly on the color filter 230.

In this embodiment, a polarizing plate is not included on top of the planarization layer 550.

In other words, the polarizer can play a role in preventing display quality from deteriorating when external light is incident and reflected by an anode, etc., and is visible to the user.

However, in this embodiment, the side of the anode is covered with the pixel defining layer 380 to reduce the degree of reflection from the anode, and a light blocking layer 220 is also formed to reduce the degree of incident light, thereby reducing the amount of light incident on the anode, and this embodiment already contains a structure that prevents deterioration of display quality.

Therefore, according to the example embodiment of FIG. 38, the display panel DP may be implemented without separately forming the polarizer on the front of the display panel DP.

In some embodiments, in FIG. 38, in addition to the stacked structure of the display area DA, the cross-sectional structure of the first component area EA1, which is formed to allow light to transmit through a portion of the display area DA, is also illustrated.

In FIG. 38, the first component area EA1 is divided into a first optical sensor area (OPS1; also referred to as a transmissive optical sensor area) and a second optical sensor area (OPS2; also referred to as a non-transmissive optical sensor area).

Here, the first optical sensor area OPS1 is an area formed such that light can penetrate, where each additional opening OP-1, OPBM-1 is located so as not to overlap the pixel defining layer 380 and the light blocking layer 220 on the plane.

In contrast, the second optical sensor area OPS2 is an area formed to overlap the pixel defining layer 380 and the light blocking layer 220 on a plane such that light does not transmit therethrough.

Both the first optical sensor area OPS1 and the second optical sensor area OPS2 of the first component area EA1 may not include a layer that blocks light, such as, for example, a metal layer or a semiconductor layer.

For reference, the first optical element (ES1; refer to FIG. 2) is located on the back side of the first component area EA1, and the front side of the light-emitting display device can be detected through the first optical sensor area OPS1 located in the first component area EA1.

Specifically, the layered structure of the first component area EA1 is as follows.

A buffer layer 111, which is an inorganic insulating layer, is positioned on the substrate 110, and a first gate insulating layer 141 and a second gate insulating layer 142, which are inorganic insulating layers, are sequentially positioned thereon.

In some aspects, a first interlayer insulating layer 161, a third gate insulating layer 143, and a second interlayer insulating layer 162, which are inorganic insulating layers, are sequentially stacked on the second gate insulating layer 142.

On the second interlayer insulating layer 162, a first organic layer 181, a second organic layer 182, and a third organic layer 183, which are organic insulating layers, are sequentially stacked.

A functional layer FL may be located on the third organic layer 183, and a cathode may be located on the third organic layer 183.

An encapsulation layer 400 is positioned on the cathode, and sensing insulating layers 501, 510, and 511 are sequentially positioned on top of the cathode.

The encapsulation layer 400 may have a triple-layer structure sequentially including an inorganic encapsulation layer, an organic encapsulation layer, and an inorganic encapsulation layer.

In some aspects, the sensing insulating layers 501, 510, and 511 may all be inorganic insulating layers.

A planarization layer 550 may be positioned on the sensing insulating layers 501, 510, and 511.

The first component area EA1 as described herein includes a metal layer, a first semiconductor layer, a first gate conductive layer, a second gate conductive layer, an oxide semiconductor layer, a third gate conductive layer, a first data conductive layer, and a second data conductive layer, and the anode is not located.

In some aspects, the light emitting layer EML and the sensing electrodes 540 and 541 are not formed.

In some aspects, in the first optical sensor area OPS1 of the first component area EA1, additional openings OP-1, OPBM-1 are formed in the pixel defining layer 380 and the light blocking layer 220, respectively, to form a pixel defining layer 380, and the light blocking layer 220 may not be formed.

As a result, light may pass through the first optical sensor area OPS1.

In contrast, the second optical sensor area OPS2 of the first component area EA1 does not have additional openings OP-1, OPBM-1, so it overlaps the pixel defining layer 380 and the light blocking layer 220. The second optical sensor area OPS2 may have a structure that is not transparent.

In the above, an embodiment has been described in which a total of three organic layers are formed, and an anode connection opening is formed in the second organic layer and the third organic layer.

However, embodiments of the present disclosure are not limited thereto, and in another example, at least two organic layers may be formed, and in this example, the anode connection opening may be located in the upper organic layer located away from the substrate, and the lower organic layer opening may be located in the lower organic layer.

In some embodiments, hereinafter, with reference to FIG. 39, an embodiment is described in which the light blocking area of the color filter is formed by overlapping the blue color filter 230B and the red color filter 230R instead of the light blocking layer 220.

In FIG. 39, the third sensing insulating layer 511 and the structure below it are the same as the structure in FIG. 38, so only the upper structure of the third sensing insulating layer 511, which is different from FIG. 38, is examined in detail as follows.

Color filters 230R, 230G, and 230B are located on the third sensing insulating layer 511.

In the embodiment of FIG. 39, the light blocking layer is not included, and the role of the light blocking layer is performed by the overlapped color filters 230R and 230B, and the overlapped color filters 230R and 230B are connected to the sensing electrodes 540 and 541. They can be positioned to overlap on a plane.

The overlapped color filters 230R and 230B have a second opening OPCF, and the second opening OPCF of the overlapped color filters 230R, 230B is on a plane where the opening OP of the pixel defining layer 380 overlap.

In some aspects, the second opening OPCF of the overlapped color filters 230R and 230B may be formed wider than the opening OP of the pixel defining layer 380.

As a result, the anode that overlaps the opening OP of the pixel defining layer 380 (i.e., is exposed by the opening OP of the pixel defining layer 380) also overlaps the color filters 230R and 230B, so it is possible to have a structure that is not obscured in a plan view.

This is to ensure that the anode and the light emitting layer EML capable of displaying an image are not obscured by the overlapped color filters 230R and 230B and the sensing electrodes 540 and 541.

In some aspects, the overlapped color filters 230R and 230B have a structure that overlaps the anode connection opening OP4 on a plane.

One color filter may be located within the second opening OPCF of the overlapped color filters 230R and 230B, and in FIG. 39, a green color filter 230G is located.

Based on the embodiment, the color filters 230R, 230G, and 230B may be replaced with a color conversion layer or may further include a color conversion layer.

The color conversion layer may include quantum dots.

A planarization layer 550 covering the color filters 230R, 230G, and 230B is positioned on the color filters 230R, 230G, and 230B, and a low layer is placed on top of the planarization layer 550 to improve front visibility and light emission efficiency of the display device, and refractive layers and additional planarization layers may be further located.

Based on the embodiment, the planarization layer 550 may be omitted and a low refractive layer and an additional planarization layer may be located directly on the color filter.

In the embodiment of FIG. 39, the polarizer is not included on top of the planarization layer 550.

In other words, the polarizer can play a role in preventing display quality from deteriorating when external light is incident and reflected by an anode, etc., and is visible to the user.

However, in this embodiment, the side of the anode is covered with the pixel defining layer 380 to reduce the degree of reflection from the anode, and overlapped color filters 230R and 230B are also formed to reduce the degree of incident light. In short, this embodiment already includes a structure that prevents deterioration of display quality due to reflection.

Therefore, according to the example embodiment of FIG. 39, the display panel DP may be implemented without separately forming the polarizer on the front of the display panel DP.

In some embodiments, the cross-sectional structure of the first component area EA1 according to the embodiment of FIG. 39 may be as follows.

The first component area EA1 is divided into a first optical sensor area OPS1 and a second optical sensor area OPS2.

Here, the first optical sensor area OPS1 is an area formed such that light can penetrate, with each additional opening OP-1, OPCF-1 located so as not to overlap with the light blocking area of the color filter formed by overlapping the pixel defining layer 380 and at least two color filters on the plane.

In contrast, the second optical sensor area OPS2 is an area formed to prevent light from transmitting by overlapping the pixel defining layer 380 and the light blocking area of the color filter formed by overlapping at least two color filters on a plane.

Both the first optical sensor area OPS1 and the second optical sensor area OPS2 of the first component area EA1 may not include a layer that blocks light, such as, for example, a metal layer or a semiconductor layer.

For reference, the first optical element (ES1; refer to FIG. 2) is located on the back side of the first component area EA1, and the front side of the light emitting display device can be detected through the first optical sensor area OPS1 located in the first component area EA1.

Specifically, the layered structure of the first component area EA1 is as follows.

A buffer layer 111, which is an inorganic insulating layer, is positioned on the substrate 110, and a first gate insulating layer 141 and a second gate insulating layer 142, which are inorganic insulating layers, are sequentially positioned thereon.

In some aspects, a first interlayer insulating layer 161, a third gate insulating layer 143, and a second interlayer insulating layer 162, which are inorganic insulating layers, are sequentially stacked on the second gate insulating layer 142.

On the second interlayer insulating layer 162, a first organic layer 181, a second organic layer 182, and a third organic layer 183, which are organic insulating layers, are sequentially stacked.

A functional layer FL may be located on the third organic layer 183, and a cathode may be located on the third organic layer 183.

An encapsulation layer 400 is positioned on the cathode, and sensing insulating layers 501, 510, and 511 are sequentially positioned on top of the cathode.

The encapsulation layer 400 may have a triple-layer structure sequentially including an inorganic encapsulation layer, an organic encapsulation layer, and an inorganic encapsulation layer.

In some aspects, the sensing insulating layers 501, 510, and 511 may all be inorganic insulating layers.

A planarization layer 550 may be positioned on the sensing insulating layers 501, 510, and 511.

The first component area EA1 as described herein includes a metal layer, a first semiconductor layer, a first gate conductive layer, a second gate conductive layer, an oxide semiconductor layer, a third gate conductive layer, a first data conductive layer, and a second data conductive layer, and the anode is not located.

In some aspects, the light emitting layer EML and the sensing electrodes 540 and 541 are not formed.

In some aspects, in the first optical sensor area OPS1 of the first component area EA1, additional openings OP-1, OPCF-1 are formed in the pixel defining layer 380 and the light blocking area of the color filter, respectively, to form a pixel defining layer 380, and a color filter may not be formed.

As a result, light may pass through the first optical sensor area OPS1.

In some embodiments, the second optical sensor area OPS2 of the first component area EA1 does not have additional openings OP-1, OPCF-1, so the second optical sensor area OPS2 overlaps with the light blocking area of the pixel defining layer 380 and the color filter, and the second optical sensor area OPS2 may have a structure that is not transparent.

In the above, an embodiment has been described in which a total of three organic layers are formed, and an anode connection opening is formed in the second organic layer and the third organic layer.

However, embodiments of the present disclosure are not limited thereto, and in another example, at least two organic layers may be formed, and in this example, the anode connection opening may be located in the upper organic layer located away from the substrate, and the lower organic layer opening may be located in the lower organic layer.

In some embodiments, additionally, if the opening OP of the pixel defining layer 380 described herein, the second opening OPBM of the light blocking layer 220, and the second opening OPCF of the light blocking area where at least two or more color filters overlap have an ellipse or an ellipse-like structure, modifications as illustrated in Table 2 below may be possible.

TABLE 2

| Item | Transformable contents |
|---|---|
| ellipse angles for first and second opening | The major axis angle includes four or more directions.<br>The angle formed by the major axis direction of each elliptical shape can be 45 degrees or less.<br>The angle formed by the major axis of each ellipse can have different angles for each ellipse. |
| eccentricity | The first opening of pixel defining layer may have an eccentricity ranging from 0.2 to 0.85.<br>The second opening may have an eccentricity greater than 0 and less than or equal to 0.84. |
| elliptical shape of the first opening and the second opening | It is possible to create a planar shape by cutting in the first direction and then combining.<br>The eccentricity of the two ellipses used for the merge can also vary, so the size of the merged ellipse can also vary.<br>In some aspects, according to the embodiment, two ellipses having different eccentricities can be combined for each color, and even if the colors are the same, two ellipses having different eccentricities can be combined to form various ellipses.<br>It is also possible to have a shape that combines two or more ellipses having different eccentricities. |
| elliptical arrangement region | The red, green, and blue openings for pixel definition can each be formed as an ellipse with at least two different eccentricities.<br>In some aspects, the red second opening, green second opening, and blue second opening of the light-blocking layer or color filter's shading region can each be formed as an ellipse with at least two different eccentricities. |

TABLE 2-continued

| Item | Transformable contents |
| --- | --- |
| relationship between the first opening and the second opening | The first opening and the second opening that overlaps with it on the plane may have different distances in the major axis direction and the minor axis direction on the plane, and the distance in the major axis direction on the plane can be formed to be 0.1 μm to 2.6 μm smaller than the distance in the minor axis direction.<br>The second opening, which overlaps with the first opening on a flat surface, can have a horizontal distance of more than 0 μm and less than or equal to 20 μm.<br>The first opening and the second opening, which overlap with it on a plane, can have the same major axis direction of each ellipse shape or an angle of 20 degrees or less.<br>It can be formed in an elliptical shape having different eccentricities for the same color as well.<br>Among the five tricolor openings, in addition to red, one more color can have a shape where the horizontal distance is not uniform. |

Although the embodiments have been described in detail above, the scope of the example embodiments is not limited thereto, and various modifications and improvements can be made by those skilled in the art using the basic concepts supported by aspects of the present disclosure defined in the following claims.

<Description of symbols>

220: light blocking layer 380: pixel defining layer
OP, OPr, OPg, OPb: opening of the pixel defining layer
OPBM, OPBMr, OPBMg, OPBMb: second opening of the light blocking layer
230R, 230G, 230B: color filter
OPCF, OPCFr, OPCFg, OPCFb: second opening of the color filter
Anode: anode Cathode: cathode
EML, EMLr, EMLg: light emitting layer FL: functional layer
1000: display device DP: display panel
110: substrate 180, 181, 182, 183: organic layer
141, 142, 143: gate insulating layer
161,162: interlayer insulating layer
385, 385-1, 385-2: spacer 400, 401, 402, 403: encapsulation layer
501, 510, 511: sensing insulating layer
540, 541: sensing electrode
550: planarization layer DA, DA1-1, DA1-2: display area
EA, EA1, EA2: component area
gap, gap': gap
gap1, gap1': major axis direction gap
gap2, gap2': minor axis direction gap
OP-1, OPBM-1, OPCF-1: additional opening

What is claimed is:

1. A light emitting display device, comprising:
a substrate;
a plurality of anodes disposed on the substrate;
a pixel defining layer comprising a plurality of first openings overlapping each of the plurality of anodes;
a plurality of light emitting layers respectively disposed within the plurality of first openings of the pixel defining layer;
a cathode formed on the plurality of light emitting layers and the pixel defining layer;
an encapsulation layer disposed on the cathode; and
a light blocking layer disposed on the encapsulation layer and comprising a plurality of second openings respectively overlapping the plurality of first openings,
wherein:
the plurality of first openings of the pixel defining layer are each an elliptical or oval shape,
among the plurality of first openings and the plurality of second openings, a first opening and a second opening corresponding to the first opening differ according to a major axis direction gap and a minor axis direction gap, which are horizontal gaps respective to a major axis direction and a minor axis direction of the first opening on a plane, and
the major axis direction gap is smaller than the minor axis direction gap by a value ranging from 0.1 μm to 2.6 μm.

2. The light emitting display device of claim 1, wherein:
the first opening and the second opening corresponding to the first opening have a horizontal gap in a diagonal direction different from the major axis direction and the minor axis direction, and
the horizontal gap in the diagonal direction is different from the major axis direction gap and the minor axis direction gap.

3. The light emitting display device of claim 1, wherein:
the first opening and the second opening that overlaps the first opening in a plane have a horizontal gap ranging from 0 μm to 20 μm.

4. The light emitting display device of claim 1, wherein:
the shape of the first opening has an eccentricity ranging from 0.2 to 0.85.

5. The light emitting display device of claim 4, wherein:
the second opening has an eccentricity ranging from 0 to 0.84.

6. The light emitting display device of claim 1, wherein:
the second opening has a polygonal shape comprising a circle shape or a square shape.

7. The light emitting display device of claim 1, wherein:
the shape of the first opening comprises four or more major axis angles, and
each of the major axis angles of the shape of the first opening is 45 degrees or less.

8. The light emitting display device of claim 1, wherein:
the shape of the first opening is a planar shape formed by merging at least two elliptical shapes having different eccentricities.

9. The light emitting display device of claim 8, wherein:
the shape of the first opening is a planar shape formed by cutting a first ellipse having a first eccentricity in a first direction, cutting a second ellipse having a second eccentricity in the first direction, and combining a cut portion of the first ellipse and a cut portion of the second ellipse.

10. The light emitting display device of claim 1, wherein:
at least one of the plurality of first openings of the pixel defining layer is a circular shape or has an eccentricity ranging from 0 to 0.2.

11. A light emitting display device, comprising:
a substrate;
a plurality of anodes disposed on the substrate;
a pixel defining layer comprising a plurality of first openings overlapping each of the plurality of anodes;
a plurality of light emitting layers respectively disposed within the plurality of first openings of the pixel defining layer;
a cathode formed on the plurality of light emitting layers and the pixel defining layer;
an encapsulation layer disposed on the cathode; and
a plurality of color filters corresponding to different colors and disposed on the encapsulation layer,
wherein:
the plurality of color filters comprise:
at least two color filters overlapping a light blocking area, and
one color filter overlapping a light transmission area,
the plurality of first openings of the pixel defining layer are each an elliptical or oval shape,
among the plurality of first openings and a plurality of second openings, a first opening and a second opening corresponding to the first opening differ according to a major axis direction gap and a minor axis direction gap, which are horizontal gaps respective to a major axis direction and a minor axis direction of the first opening on a plane, and
the major axis direction gap is smaller than the minor axis direction gap by a value ranging from 0.1 μm to 2.6 μm.

12. The light emitting display device of claim 11, wherein:
the first opening and the second opening corresponding to the first opening have a horizontal gap in a diagonal direction different from the major axis direction and the minor axis direction, and
the horizontal gap in the diagonal direction is different from the major axis direction gap and the minor axis direction gap.

13. The light emitting display device of claim 11, wherein:
the first opening and the second opening that overlaps the first opening on a plane have a horizontal gap ranging from 0 μm to 20 μm.

14. The light emitting display device of claim 11, wherein:
the shape of the first opening has an eccentricity ranging from 0.2 to 0.85.

15. The light emitting display device of claim 14, wherein:
the second opening has an eccentricity ranging from 0 to 0.84.

16. The light emitting display device of claim 11, wherein:
the second opening has a polygonal shape comprising a circle shape or a square shape.

17. The light emitting display device of claim 11, wherein
the shape of the first opening comprises four or more major axis angles, and
each of the major axis angles of the shape of the first opening is 45 degrees or less.

18. The light emitting display device of claim 11, wherein
the shape of the first opening is a planar shape formed by merging at least two elliptical shapes having different eccentricities.

19. The light emitting display device of claim 18, wherein
the shape of the first opening is a planar shape formed by cutting a first ellipse having a first eccentricity in a first direction, cutting a second ellipse having a second eccentricity in the first direction, and combining a cut portion of the first ellipse and a cut portion of the second ellipse.

20. The light emitting display device of claim 11, wherein
at least one of the plurality of first openings of the pixel defining layer is a circular shape or has an eccentricity ranging from 0 to 0.2.

* * * * *